(12) United States Patent
Smith et al.

(10) Patent No.: US 11,264,274 B2
(45) Date of Patent: Mar. 1, 2022

(54) REVERSE CONTACT AND SILICIDE PROCESS FOR THREE-DIMENSIONAL LOGIC DEVICES

(71) Applicant: Tokyo Electron Limited, Tokyo (JP)

(72) Inventors: Jeffrey Smith, Clifton Park, NY (US); Hiroaki Niimi, Cohoes, NY (US); Jodi Grzeskowiak, Schenectady, NY (US); Daniel Chanemougame, Niskayuna, NY (US); Lars Liebmann, Mechanicsville, NY (US); Kandabara Tapily, Mechanicsville, NY (US); Subhadeep Kal, Albany, NY (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/010,491

(22) Filed: Sep. 2, 2020

(65) Prior Publication Data

US 2021/0098306 A1 Apr. 1, 2021

Related U.S. Application Data

(60) Provisional application No. 62/907,107, filed on Sep. 27, 2019.

(51) Int. Cl.
*H01L 21/768* (2006.01)
*H01L 21/28* (2006.01)
(Continued)

(52) U.S. Cl.
CPC .. *H01L 21/76889* (2013.01); *H01L 21/28097* (2013.01); *H01L 21/32053* (2013.01);
(Continued)

(58) Field of Classification Search
CPC ....... H01L 21/28; H01L 21/74; H01L 21/768; H01L 21/822; H01L 21/8234;
(Continued)

(56) References Cited

U.S. PATENT DOCUMENTS 9,165,838 B2 10/2015 Nieh et al.
9,219,077 B2 12/2015 Yokoyama
(Continued)

FOREIGN PATENT DOCUMENTS

JP 2012-216776 A 11/2012

OTHER PUBLICATIONS

International Search Report and Written Opinion dated Dec. 21, 2020 in PCT/US2020/049497, 8 pages.

*Primary Examiner* — Chuong A Luu
(74) *Attorney, Agent, or Firm* — Oblon, McClelland, Maier & Neustadt, L.L.P.

(57) ABSTRACT

A first source/drain (S/D) structure of a first transistor is formed on a substrate and positioned at a first end of a first channel structure of the first transistor. A first substitute silicide layer is deposited on a surface of the first S/D structure and made of a first dielectric. A second dielectric is formed to cover the first substitute silicide layer and the first S/D structure. A first interconnect opening is formed subsequently in the second dielectric to uncover the first substitute silicide layer. The first interconnect opening is filled with a first substitute interconnect layer, where the first substitute interconnect layer is made of a third dielectric. Further, a thermal processing of the substrate is executed. The first substitute interconnect layer and the first substitute silicide layer are removed. A first silicide layer is formed on the surfaces of the first S/D structure.

20 Claims, 24 Drawing Sheets

(51) Int. Cl.
*H01L 21/3205* (2006.01)
*H01L 21/8234* (2006.01)
*H01L 29/66* (2006.01)
*H01L 21/8238* (2006.01)
*H01L 27/092* (2006.01)

(52) U.S. Cl.
CPC .. *H01L 21/76802* (2013.01); *H01L 21/76877* (2013.01); *H01L 21/823418* (2013.01); *H01L 21/823431* (2013.01); *H01L 21/823443* (2013.01); *H01L 21/823821* (2013.01); *H01L 27/092* (2013.01); *H01L 29/66795* (2013.01)

(58) Field of Classification Search
CPC ............. H01L 21/8238; H01L 21/3205; H01L 21/76877; H01L 21/76802; H01L 21/76889; H01L 21/76895; H01L 21/76897; H01L 21/823443; H01L 21/823821; H01L 21/28097; H01L 21/32053; H01L 21/823418; H01L 21/823431; H01L 21/743; H01L 21/8221; H01L 21/823814; H01L 21/823475; H01L 21/8249; H01L 21/823871; H01L 21/823425; H01L 21/823835; H01L 29/66; H01L 29/665; H01L 29/806; H01L 29/66636; H01L 29/41725; H01L 29/41791; H01L 29/786; H01L 29/7839; H01L 29/66507; H01L 29/7845; H01L 29/42392; H01L 29/66795; H01L 29/78696; H01L 29/4933; H01L 29/4975
USPC ......................................................... 438/199
See application file for complete search history.

(56) References Cited

U.S. PATENT DOCUMENTS

| | | | |
|---|---|---|---|
| 9,520,327 | B2 | 12/2016 | Nieh et al. |
| 9,837,534 | B2 | 12/2017 | Yokoyama |
| 10,192,887 | B2 | 1/2019 | Frougier et al. |
| 10,236,292 | B1 | 3/2019 | Frougier et al. |
| 10,388,519 | B2 | 8/2019 | Smith et al. |
| 10,734,224 | B2 | 8/2020 | Smith et al. |
| 2005/0056881 | A1 | 3/2005 | Yeo et al. |
| 2008/0265330 | A1* | 10/2008 | Gerhardt ......... H01L 21/823807 257/369 |
| 2012/0248544 | A1 | 10/2012 | Yokoyama |
| 2013/0295732 | A1* | 11/2013 | Wu .................. H01L 21/26513 438/163 |
| 2014/0057399 | A1* | 2/2014 | Newbury .......... H01L 21/28518 438/158 |
| 2015/0243565 | A1 | 8/2015 | Nieh et al. |
| 2016/0035629 | A1 | 2/2016 | Nieh et al. |
| 2016/0056291 | A1 | 2/2016 | Yokoyama |
| 2019/0057867 | A1 | 2/2019 | Smith et al. |
| 2019/0058036 | A1 | 2/2019 | Smith et al. |

* cited by examiner

REVERSE CONTACT AND SILICIDE PROCESS FOR THREE-DIMENSIONAL LOGIC DEVICES

PRIORITY CLAIM AND CROSS-REFERENCE

This present disclosure claims the benefit of U.S. Provisional Application No. 62/907,107 filed on Sep. 27, 2019, which is incorporated herein by reference in its entirety.

FIELD OF THE INVENTION

This disclosure relates to integrated circuits and the fabrication of microelectronic devices.

BACKGROUND

In the manufacture of a semiconductor device (especially on the microscopic scale), various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. Fabrication of 3D semiconductor devices poses many new and unique challenges associated with scaling, post-fabrication processing, as well as other aspects of the 3D fabrication process.

SUMMARY 3D integration is seen as a viable option to continue semiconductor scaling in spite of inevitable saturation in critical dimension scaling. As the contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e., the vertical stacking of multiple devices, aims to overcome these scaling limitations by increasing transistor density in a volume rather than an area. This idea has been successfully demonstrated and implemented by the flash memory industry with the adoption of 3D NAND. Mainstream CMOS VLSI scaling, as used for example in CPU or GPU products, is exploring adoption of 3D integration as a primary means of moving the semiconductor roadmap forward, and thus desires enabling technologies.

Replacement metal gate (RMG) module integration has been successfully used for semiconductor manufacturing. In the RMG process, an intended metal gate is first formed using either polysilicon or amorphous silicon. Use of these temporary materials enables performing high temperature thermal processing on the source and drain side of the device. Such thermal processing can typically damage desired metal gate material if the metal gate was already formed using desired or final work function metals (WFM). The damage can include causing a significant threshold voltage shift on the device. Accordingly, the RMG process keeps a "dummy" gate with a sacrificial or temporary material such as a polysilicon or an amorphous silicon structure. With a dummy gate in place, several high-temperature thermal processes can be executed. For example, source and drain epitaxy pre-clean and reactor heat-up is typically performed at 750-780° C. ranges. Source and drain epitaxy growth is typically executed between 500° C. and 800° C. (depending on Ge content and in-situ nature of doping species). Source and drain dopant activation can be executed using laser spike anneal (LSA) at temperatures ranging from 800° C. up to 1250° C. with durations ranging from sub-millisecond to full second durations.

In the RMG process integration, source and drain structures are generally comprised of boron-doped SiGe for PMOS and phosphorous and/or arsenic doped silicon for NMOS. These source and drain structures are then "capped" with a given dielectric etch-stop layer (CESL) to protect the silicon epitaxy surface from oxidation as well as to provide an etch-stopping layer to prevent damage to the source and drain region, when the via-to-drain contact is formed through the pre-metallization dielectric that the source and drain structure is contained within. In such a integration flow, processes critically sensitive to thermal processing can be performed last.

There are several components or steps of such FEOL (front-end-of-line) integrations. Dummy gates are formed, typically by using polysilicon or amorphous silicon. NMOS and/or PMOS source-drain is grown via epitaxy with in-situ dopant addition that is typically performed at temperatures ranging from 500° C. to 800° C. The silicon FIN or nanosheet pre-clean can be done to remove native oxide from the silicon surface within a range of 750° C. to 780° C. Optionally, additional doping species can be implanted through a complementary blocking and implant process. The contact structure is encased and the source and drain are wrapped with a protective etch-stop dielectric layer such as SiN or SiCN. The contact area is filled with a pre-metallization dielectric material such as silicon oxide. The dummy gate structures are then opened or uncovered then the polysilicon or amorphous silicon is removed along with a protective thermal or chemical oxide liner protecting the channel material. For nanosheet devices, this can include removal of the silicon germanium layers separating the intended silicon channels. An interface layer, such as a thermal oxide or chemical oxide, can be deposited or formed over the intended channel material(s). A high-k dielectric film such as HfO or varieties of HfO coupled with dipole forming layers such as LaO and AlO are formed over the interface layer material to cover the channel material(s). The high-k dielectric can be capped with a conductive barrier material such as TiN. A high-k reliability or drive anneal is executed to reduce the formation of charge traps. Such reliability anneals are typically executed within a range of 700° C. to 750° C. A laser spike anneal (LSA) treatment activates dopants within the source and drain area. Such activation anneals are done within a range of 800° C. to 1250° C. with durations ranging from sub-millisecond to full second. The replacement metal gate (RMG) process can be continued in which NMOS and PMOS work function metals are deposited, etched-tuned to set various threshold voltages, and then filled with a high-conductance metal. Via-to-drain contacts can then be opened from M0 (or metal zero level) down to the respective source and drain epitaxy structures through a pre-metallization dielectric. The CESL etch-stop and protective dielectric layer can be removed, and then selective self-aligned salicidiation of the source and drain can be followed by metallization of the via-to-drain structure.

With this RMG method, the silicide is formed after all of the individual process steps with high thermal requirements and is thus kept under the temperature in which phase change or agglomeration of the silicide can occur. Such phase change or agglomeration drastically alters the contact resistivity and negatively impacts power and performance of the device. It is known that such phase change of common silicide materials can occur at temperatures as low as 700° C.

With a push toward higher performance and lower power devices, more focus is placed on improving contact resistance. One possible path for improvement is to migrate toward what is referred to a wrap-around contact (WAC) in which the silicide is wrapped completely around the surface of the source and drain epitaxy, or at least as much around as possible.

The WAC (wrap-around contact) integration process can be done through several optional methods. In one method, a guided source and drain epitaxy growth is executed that mirrors a FIN shape as closely as possible. As such, an opening and forming of a silicide around the FIN-shaped epitaxy can exist with current integration methods excluding the means by which to form a source and drain structure containing a FIN-shape. Such processes can be realized by recessing the FIN structure within a sidewall spacer and then subsequently using the sidewall spacer to guide the epitaxy growth to continue within the FIN shape. The silicide process would still be performed following the RMG and all high thermal FEOL steps.

In another WAC method, a conventional source and drain contact are formed using a spacer-assisted method after forming the via-to-drain contact in which a thin etch-selective spacer is deposited within the confines of the via-to-drain structure. Next an opening is anisotropically "punched" through at the bottom of the via-to-drain structure. Then the pre-metallization dielectric material surrounding the source and drain contact can be isotropically etched to form a spherical opening which surrounds the entire or most of the surface of the source and drain epitaxy structure from which a silicide can be grown. This silicide process is still executed following the RMG and all high thermal FEOL steps.

In another WAC method, a conventional source and drain contact is formed and then the self-aligned silicide is immediately formed around the contact. In this manner, a conventional via-to-drain structure can be used to make contact to the silicide without any further processing to ensure that the bottom of the via-to-drain structure is adequately wrapping around the entire contact structure. This process is done prior to any RMG processing where the higher thermal processing is done, so this requires all processes in the RMG module, dopant activation, and reliability drive anneals to be executed at temperatures or conditions which do not result in a phase change of the silicide. One challenge with this WAC method, however, is that reducing the thermal processing temperatures of the reliability drive anneals, source and drain dopant activation anneals, and source and drain epitaxy growth results in some cumulative degradation in both power and performance of the device. For example, transitioning to lower epitaxy deposition temperatures for in-situ doped films may result in a much lower solubility of phosphorous within epitaxy silicon and this lower concentration of dopants would result in higher contact resistance. For conditions where the in-situ dopant concentration can be complemented by additional implantation of dopant species, this poses no problem. Nevertheless, as devices scale to smaller dimensions in size, this becomes much more unfeasible.

For 3D devices such as complementary FET devices (CFET) in which complementary devices are positioned vertically overtop one another, it is viewed as implausible to incorporate any type of implantation process for stacked complementary devices given that NMOS and PMOS would occupy the same space in the vertical orientation from which the implant would be done. Similarly, reducing the reliability anneal temperature by going to higher pressure reliability anneals have been shown to be less effective compared to the higher temperature anneals. Therefore the concern with doing any type of silicide processing ahead of the RMG module is that there would be some trade-off with respect to gaining area benefit with a complementary FET design but at the expense of potentially reduced performance and/or increased power. A comparison of a standard contact, a wrap-around contact using a silicide formation ahead of the RMG module, and a wrap-around contact based on CFET designs can be shown in FIGS. 1A-1C.

FIG. 1A is a cross-sectional view of the standard contact that can be applied in a FINFET structure. As shown in FIG. 1A, a silicon fin 104 can protrude from a dielectric layer 102. A source/drain (S/D) structure 106 can be disposed on the silicon fin 104. In some embodiments, the S/D structure 106 can be made of silicon doped with phosphorous. A silicide layer 108 can be positioned on a top surface of the S/D structure 106. In some embodiments, the silicide layer 108 can be made of TiSi. In addition, a dielectric cap layer 110 can be positioned over the silicide layer 108. In some embodiments, the dielectric cap layer 110 can be made of SiCN.

FIG. 1B is a cross-sectional view of wrap-around contact using a silicide formation ahead of the RMG module. As shown in FIG. 1B, a silicon fin (or fin structure) 114 can protrude from a dielectric layer 112. An S/D structure 116 can be positioned on the fin structure 114. In some embodiments, the S/D structure 116 can be made of silicon doped with phosphorous. A silicide layer 118 can be positioned over the S/D structure 116 and surround top surfaces and side surfaces of the S/D structure 116. In some embodiments, the silicide layer 118 can be made of TiSi. A dielectric cap layer 120 can be positioned on the silicide layer 118 to cover the silicide layer 118. In some embodiments, the dielectric cap layer 120 can be made of SiCN.

In FIG. 1C, a cross-sectional view of wrap-around contact based on CFET designs can be illustrated. The wrap-around contact can be formed based on a manufacturing process in which the silicide, barrier metal, and via-to-drain high conductance metal can be formed prior to the RMG module. As shown in FIG. 1C, a power rail structure 122 can be positioned in a dielectric layer 134. A channel region 124 can be positioned over the power rail structure 122. The channel region 124 can be made of silicon. An S/D structure 126 can be formed to surround the channel region 124. The S/D structure 126 can be made of silicon doped with phosphorous. A silicide layer 128 can be disposed to wrap the S/D structure 126. The silicide layer 128 can be made of TiSi. A local interconnect structure 132 can be formed over the silicide layer 128. In addition, a barrier layer 130 can be formed between the silicide layer 128 and the local interconnect structure 132, and further surround the local interconnect structure 132. In some embodiments, the local interconnect structure 132 can be made of ruthenium (Ru), and the barrier layer 130 can be made of TiN.

For complementary FET devices in which NMOS and PMOS devices are vertically stacked overtop one another, the integration approach for forming such devices generally consists of a process in which the contact and local interconnect structures are patterned and metalized before the RMG module. Thus, all thermal processing, such as dopant activation and reliability anneal, is done after the source and drain has been grown, the silicide has been formed and metalized with both barrier and high conductance metal fill prior to the RMG module/flow. An example of the CFET integration process can include: (a) silicon pre-clean for upper source and drain epitaxy growth, (b) in-situ doped source and drain epitaxy growth, (c) post high-k deposition reliability drive anneal, and (d) LSA dopant activation anneal.

In 3D monolithic stacked devices such as complementary FET as well as vertically stacked transistors, the lower devices are formed and metallized before the upper devices, and the replacement metal gate module is executed along with the higher thermal process. It is also necessary to prevent any diffusion of the source and drain dopant species from the actual source and drain epitaxy through the silicide and into the actual interconnect metal, which would have a significant increase in the contact resistance. In these cases, barrier metals can be used to prevent this diffusion into the interconnect metal. Such barrier metals, however, have significantly lower conductivity compared to the interconnect metal itself. Therefore large thicknesses of the barrier metal can likewise have a net increase in total resistance of the contact and interconnect structure, since the volume of the barrier metal can occupy some portion of the volume that would normally be taken up by the highly conductive fill metal.

Accordingly, it is discovered herein that to rectify many of the thermal processing issues with 3D devices as well as for conventional wrap-around contact, that many of the techniques for lowering the temperature of the thermal anneals will have some expected negative impact to the performance or power of the device.

One embodiment includes using a replacement silicide and replacement metal interconnect process in which replacement materials are substituted into the integration flow and manufacture process and then subsequently removed and replaced with a final silicide and interconnect metal after the FEOL (front-end of the line) anneals have been completed.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a method for forming a semiconductor device is provided. In the disclosed method, a first source/drain (S/D) structure of a first field-effect transistor is formed on a substrate. The first S/D structure can be positioned at a first end of a first channel structure of the first field-effect transistor. The first channel structure can be positioned over the substrate and extend along a top surface of the substrate. A first substitute silicide layer can be deposited on a surface of the first S/D structure, where the first substitute silicide layer can be made of a first dielectric. A second dielectric can be formed to cover the first substitute silicide layer and the first S/D structure of the first field-effect transistor. A first interconnect opening can be formed subsequently in the second dielectric to uncover the first substitute silicide layer. The first interconnect opening can be filled with a first substitute interconnect layer, where the first substitute interconnect layer can be made of a third dielectric. Further, a thermal processing of the substrate can be executed. The first substitute interconnect layer in the first interconnect opening and the first substitute silicide layer can be removed. A first silicide layer can then be formed on the surfaces of the first S/D structure of the first field-effect transistor.

In some embodiments, before the thermal processing of the substrate is executed, the first substitute interconnect layer can be recessed in the first interconnect opening. A first dielectric cap can subsequently be formed on the first substitute interconnect layer. The first interconnect opening is then filled with the second dielectric. The second dielectric is further recessed so as to uncover a second channel structure of a second field-effect transistor. The second channel structure can be positioned over the first channel structure and separated from the first channel structure. A second S/D structure of the second field-effect transistor can be formed. The second S/D structure is positioned over the first S/D structure and separated from the first S/D structure. The second S/D structure can be positioned at a first end of the second channel structure. A second substitute silicide layer can be deposited on a surface of the second S/D structure, where the second substitute silicide layer can be made of the first dielectric. The second dielectric can be deposited to cover the second substitute silicide layer and the second S/D structure. A second interconnect opening can be formed in the second dielectric to uncover the second substitute silicide layer. A second substitute interconnect layer can be formed in the second interconnect opening, where the second substitute interconnect layer can be made of the third dielectric.

In some embodiments, after the second substitute interconnect layer is formed in the second interconnect opening, a portion of the second substitute interconnect layer can be removed so that a space is formed over the second substitute interconnect layer. The space is further positioned in the second dielectric. A second dielectric cap can be formed on the second substitute interconnect layer. The second dielectric can then be filled in the space.

In some embodiments, after the thermal processing of the substrate is executed, the second substitute interconnect layer in the second interconnect opening and the second substitute silicide layer can be removed. A second silicide layer can be deposited on the surface of the second S/D structure.

In some embodiments, in order to remove the second substitute interconnect layer and the second substitute silicide layer, an interlayer dielectric (ILD) can be formed over the second dielectric. A patterned mask can then be formed over the ILD. An etching process can be operated to form a first Via opening and a second Via opening based on the patterned mask. The first Via opening and the second Via opening extend into the second dielectric and the ILD to uncover the first substitute interconnect layer and the second substitute interconnect layer respectively. An etching process can be performed to remove the first substitute interconnect layer in the first interconnect opening, the first substitute silicide layer, the second substitute interconnect layer in the second interconnect opening and the second substitute silicide layer further.

In some embodiments, after the first silicide layer and the second silicide layer are deposited, a first trench opening and a second trench opening can be formed in the ILD based on the patterned mask, where the first trench opening is connected to the first Via opening and the second trench opening is connected to the second Via opening. A conductive material can be deposited in the first trench opening, the second trench opening, the first Via opening, the second Via opening, the first interconnect opening and the second interconnect opening to form a first metal line in the first trench opening, a second metal line in a second trench opening, a first Via in the first Via opening, a second Via in the second Via opening, a first interconnect structure in the first interconnect opening and a second interconnect structure in the second interconnect opening. Accordingly, the first metal line, the first Via and the first interconnect structure are connected together. The second metal line, the second Via and the second interconnect structure are connected together.

In the disclosed method, a portion of the first metal line and a portion of the first Via can be removed so that a first gap is formed over the first Via to separate the first interconnect structure from the first metal line. The first gap is disposed in the ILD and further extends in the second dielectric. A portion of the second metal line and a portion of the second Via can be removed so that a second gap is formed over the second Via to separate the second interconnect structure from the second metal line. The second gap can be disposed in the ILD and further extend in the second dielectric. A first insulating layer can be deposited in the first gap and a second insulating layer can be deposited in the second gap. A portion of the first insulating layer and a portion of the second insulating layer in the ILD can further be removed so that a first recessed space is formed over the first insulating layer and positioned in the ILD, and a second recessed space is formed over the second insulating layer and positioned in the ILD. The conductive material can then be deposited in the first recessed space and the second recessed space to re-fill the first metal line and the second metal line respectively. Thus, the first insulating layer is positioned between the first metal line and the first interconnect structure, and the second insulating layer is positioned between the second metal line and the second interconnect structure.

In some embodiments, before the thermal processing of the substrate is executed, a first gate structure is formed to surround top surfaces of the first channel structure, and a second gate structure is formed to surround top surfaces of the second channel structure. The first gate structure includes a first interface layer surrounding the top surfaces of the first channel structure, a first high-k dielectric film surrounding the first interface layer, and a first conductive barrier layer surrounding the first high-k dielectric film. The second gate structure includes a second interface layer surrounding the top surfaces of the second channel structure, a second high-k dielectric film surrounding the second interface layer, and a second conductive barrier layer surrounding the second high-k dielectric film.

In some embodiments, after the thermal processing of the substrate is executed, a first work function metal can be formed over the first conductive barrier layer, and a second work function metal can be formed over the second conductive barrier layer.

In some embodiments, the thermal processing of the substrate can include heat the substrate above 500 degrees Celsius. The thermal process can be an annealing treatment configured to anneal at least one of the first S/D structure, the second S/D structure, the first gate structure, or the second gate structure.

In some embodiments, the first dielectric, the second dielectric, and the third dielectric can have different etch resistivity relative to each other in that an etching process removes one of the first dielectric, the second dielectric, and the third dielectric without removing other two dielectrics of the first dielectric, the second dielectric, and the third dielectric.

In some embodiments, the first channel structure can include one or more first nanosheets/first nanowires that are stacked over the substrate and extend along the top surface of the substrate. The first nanosheets/first nanowires are further spaced apart from each other. The second channel structure can include one or more second nanosheets/second nanowires that are stacked over the substrate and extend along the top surface of the substrate. The second nanosheets/second nanowires are further spaced apart from one another.

In another aspect of the disclosure, a method of forming a semiconductor device is provided. In the disclosed method, a pair of channel structures can be formed over a substrate. The pair of channel structures can include a first channel structure of a first field-effect transistor over the substrate and a second channel structure of a second field-effect transistor stacked over the first channel structure. The first channel structure and the second channel structure can further extend along a top surface of the substrate. A first source/drain (S/D) structure can be formed at a first end of the first channel structure, and a first substitute silicide layer can be formed on a surface of the first S/D structure and a first substitute interconnect structure can be formed over the first substitute silicide layer. In addition, a second S/D structure can be formed at a first end of the second channel structure, a second substitute silicide layer can be formed on a surface of the second S/D structure and a second substitute interconnect structure can be formed over the second substitute silicide layer. Further, a thermal processing of the substrate can be executed. The first substitute silicide layer, the first substitute interconnect structure, the second substitute silicide layer, and the second substitute interconnect structure can be removed subsequently. A first silicide layer can be formed on the first S/D structure and a second silicide layer can be formed on the second S/D structure.

In order to form the first substitute silicide layer on the surface of the first S/D structure and the first substitute interconnect structure over the first substitute silicide layer, a first dielectric can be deposited on the surface of the first S/D structure to form the first substitute silicide layer. A second dielectric can be deposited to cover the first substitute silicide and the first S/D structure. A first interconnect opening can then be formed in the second dielectric, where the first interconnect opening uncovers the first substitute silicide layer. The first interconnect opening can be filled with the first substitute interconnect structure, where the first substitute interconnect structure can be made of a third dielectric.

In some embodiments, before the second S/D structure is formed at the first end of the second channel structure, the first substitute interconnect structure can be recessed in the first interconnect opening. A first dielectric cap can be then formed on the first substitute interconnect structure. The first interconnect opening can be filled with the second dielectric. The second dielectric can be recessed to uncover the second channel structure of the second field-effect transistor so that the second S/D structure can be formed at the first end of the second channel structure.

In order to form the second substitute silicide layer on the surface of the second S/D structure and the second substitute interconnect structure over the second substitute silicide layer, the first dielectric can be deposited on the surface of the second S/D structure to form the second substitute silicide layer. The second dielectric can be deposited to cover the second substitute silicide layer and the second S/D structure of the second field-effect transistor. A second interconnect opening can then be formed in the second dielectric, where the second interconnect opening uncovers the second substitute silicide layer. The second interconnect opening can then be filled with the second substitute interconnect structure, where the second substitute interconnect structure can be made of the third dielectric.

In some embodiments, after the second substitute interconnect structure is formed over the second substitute silicide layer, a portion of the second substitute interconnect structure can be removed so that a space is formed over the second substitute interconnect structure, and the space is further positioned in the second dielectric. A second dielectric cap can be formed on the second substitute interconnect structure, and the second dielectric can be re-filled in the space.

In some embodiments, in order to remove the first substitute silicide layer, the first substitute interconnect structure, the second substitute silicide layer, and the second substitute interconnect structure, an interlayer dielectric (ILD) can be formed over the second dielectric. A patterned mask can be formed over the ILD. An etching process can be performed to form a first Via opening and a second Via opening based on the patterned mask. The first Via opening and the second Via opening extend into the second dielectric and ILD to uncover the first substitute interconnect structure and the second substitute interconnect structure respectively. An etching process can then be performed to remove the first substitute interconnect structure in the first interconnect opening, the first substitute silicide layer, the second substitute interconnect structure in the second interconnect opening and the second substitute silicide layer.

In some embodiments, after the first silicide layer is formed on the first S/D structure and the second silicide layer is formed on the second S/D structure, a first trench opening and a second trench opening can be formed in the ILD based on the patterned mask. The first trench opening can be connected to the first Via opening and the second trench opening can be connected to the second Via opening. A conductive material can be deposited in the first trench opening, the second trench opening, the first Via opening, the second Via opening, the first interconnect opening and the second interconnect opening to form a first metal line in in the first trench opening, a second metal line in a second metal opening, a first Via in the first Via opening, a second Via in the second Via opening, a first interconnect structure in the first interconnect opening and a second interconnect structure in the second interconnect opening respectively. Thus, the first metal line, the first Via and the first interconnect structure are connected together. The second metal line, the second Via and the second interconnect structure are connected together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
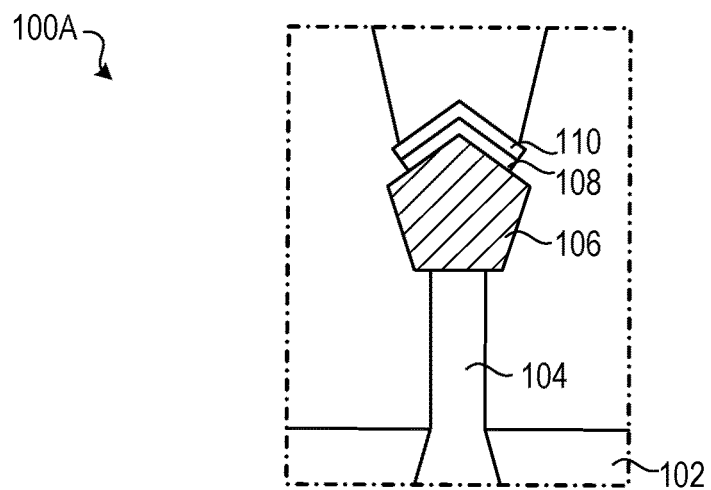
FIG. 1A is a cross-sectional view of a standard contact, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein include integration methods of forming devices with silicide contacts. In the disclosed techniques, high thermal processes can be maintained to keep desired power and performance of the device, while a 3D logic architecture such as CFET, or even conventional FINFET or GAA devices can be enabled by using wrap-around contacts. One embodiment includes using a reverse or replacement silicide and a reverse metal interconnect process, where the replacement silicide and the replacement interconnect metal are substituted into the integration flow and then subsequently removed and replaced with a final silicide and interconnect metal after the FEOL (front-end of the line) anneals have been completed.

Figure 2:
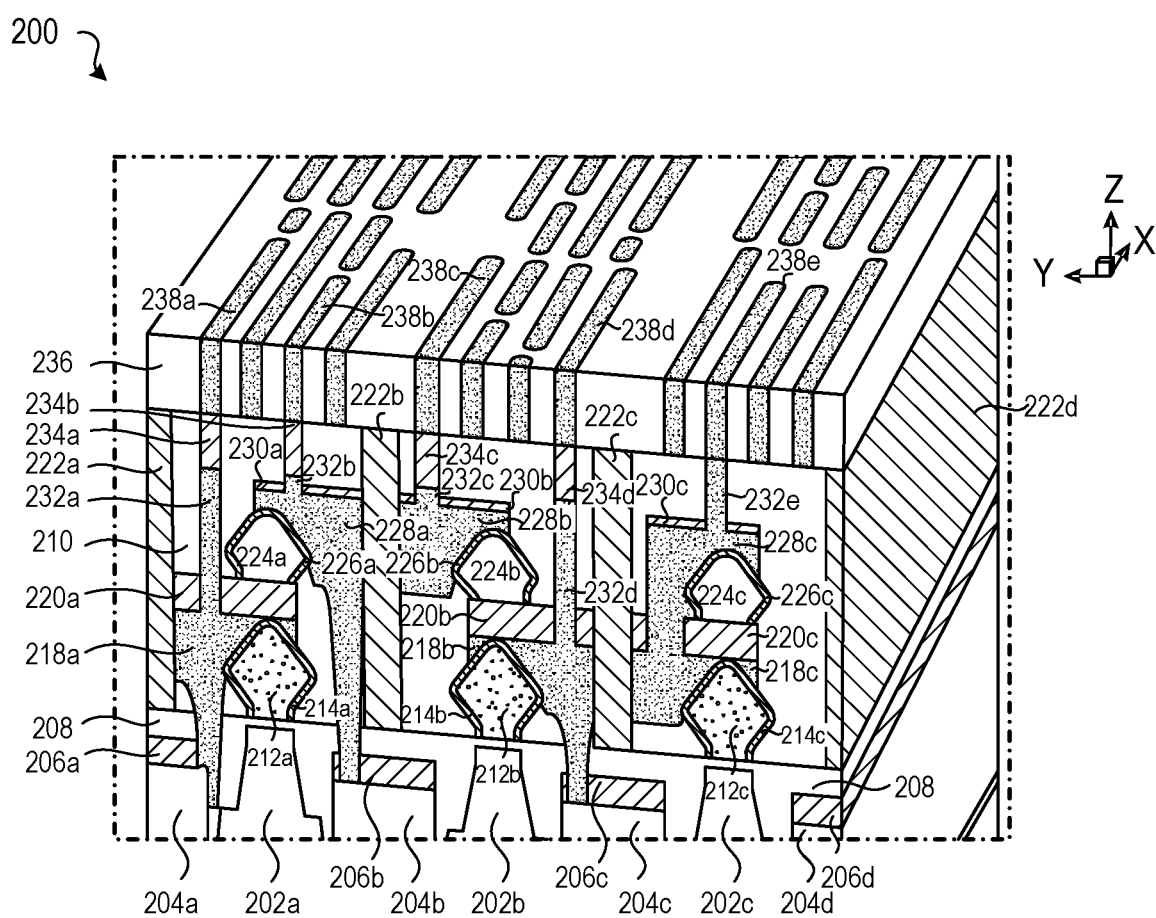
FIG. 2 is a perspective view of an exemplary complementary field-effect transistor (CFET), in accordance with some embodiments.

Replacement silicide processes herein can be used with many different fabrication flows. For the application to complementary FET devices, FIG. 2 shows a cross-sectional substrate segment along an axis of the source and drain and interconnect structures up to M0 metal tracks. As can be appreciated, similar application is applicable to other devices such as FINFET and gate-all-around (GAA) devices. Examples herein can primarily focus on the more complex case of application to 3D logic. Application to other devices should be readily appreciated. Moreover, 2D devices have fewer obstacles to the implementation of high thermal processes which are needed for current devices in order to achieve necessary power and performance requirements.

Figure 1B:
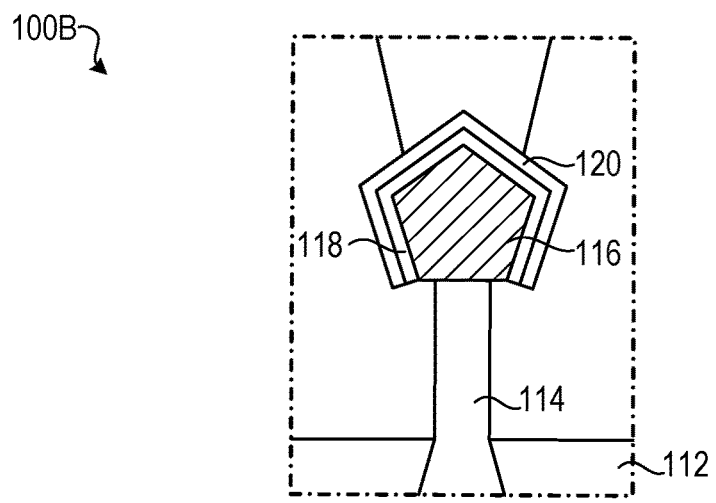
FIG. 1B is a cross-sectional view of a first wrap-around contact, in accordance with some embodiments.
Figure 1C:
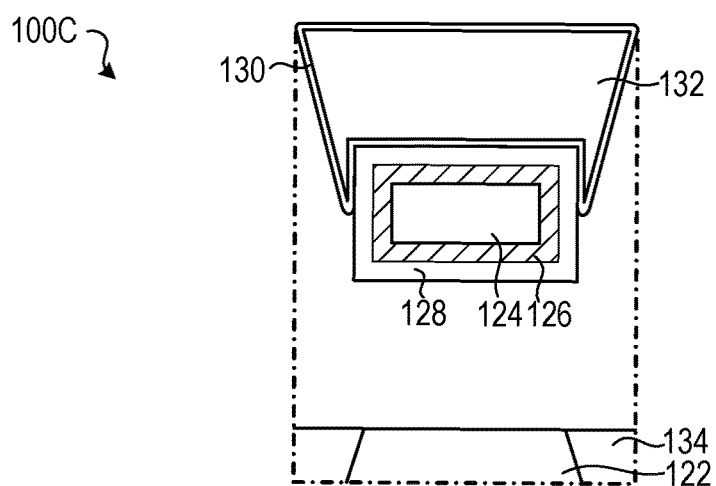
FIG. 1C is a cross-sectional view of a second wrap-around contact, in accordance with some embodiments.

FIG. 2 is a perspective view of an exemplary complementary FET (CFET) device 200 that is formed based on the replacement silicide and replacement interconnect method, in accordance with some embodiments of the disclosure. As shown in FIG. 2, the CFET device 200 can have a plurality of silicon fins protrude from a substrate (not shown). For example, three fins 202a-202c are included in FIG. 1. A plurality of power rails 204a-204c can be arrange over the substrate and positioned between the fins 202. In some embodiments, the power rails 204 can further extend along an X-direction of the substrate. The power rails 204 are buried at a bottom portion of the CFET device 200 and configured to provide operation voltages (e.g., Vdd or GND) to the CFET device 200. A plurality of first dielectric caps 206a-206d are positioned on the power rails 204 and function as isolation layers. In addition, an insulating layer 208 can be positioned between the power rails 204 and the fins 202.

Still referring to FIG. 2, a plurality of first source/drain (S/D) structures 212a-212c are positioned over the fins 202. Each of the first S/D structures 212 can be positioned over a respective fin 202. For example, the first S/D structure 212a is positioned over the fin 202a. The first S/D structures 212 are arranged at first ends of first channel structures (not shown). The first channel structures are positioned over the fins 202 and aligned with the fins 202 along a Z-direction. Each of the first channel structures can include one or more first nanosheets or first nanowires that extend along the X-direction. The first nanosheets or first nanowires are stacked over the fins 202 and spaced apart from one another. In addition, a plurality of first silicide layers 214a-214c are positioned over top surfaces of the first S/D structures 212. The first silicide layers 214 further surround the first S/D structures 212 to improve the conductivity of the first S/D structures 212. A plurality of first local interconnect structures (also referred to first interconnect structures) 218a-218c are positioned over the first silicide layers 214 so as to be electrically coupled to the first S/D structures 212 through the first silicide layers 214. For example, the first local interconnect structure 118a is coupled to the first S/D structure 212a through the first silicide layer 214a. In addition, one or more of the first local interconnect structures 218 can further be connected to the power rails 204. For example, the first local interconnect structure 218a can extend through the first dielectric cap 206 and further be connected to the power rail 204a.

The CFET device 200 can have a plurality of second dielectric caps 220a-220c that are positioned on the first local interconnect structures 218 and function as insulating layers. Over the second dielectric caps 220, a plurality of second S/D structures 224a-224c are positioned. The second S/D structures 224 are aligned with the first S/D structures 212 along the Z-direction. For example, the first S/D structure 212a is aligned with the second S/D structure 224a along the Z-direction. The second S/D structures 224 are arranged at first ends of second channel structures (not shown). The second channel structures are positioned over the fins 202 and the first channel structures. The fins 202, the first channel structures and the second channel structures are aligned along the Z-direction. In addition, each of the second channel structures can include one or more second nanosheets or second nanowires that extend along the X-direction. A plurality of second silicide layers 226a-226c are positioned over top surfaces of the second S/D structures 224. The second silicide layers 226 further surround the second S/D structures 224 to improve the conductivity of the second S/D structures 224.

Still referring to FIG. 2, the CFET device 200 can have a plurality of second local interconnect structures (also referred to second interconnect structures) 228a-228c that are positioned over the second silicide layers 226 so that the second local interconnect structures 228 are coupled to the second S/D structures 224 through the second silicide layers 226. In some embodiments, one or more of the second local interconnect structures 228 can be further connected to the power rails 204. For example, the second local interconnect structure 228a can extend through the first dielectric cap 206b and connect to the power rail 204b. A plurality of third dielectric caps 230a-230c can be positioned on the second local interconnect structures 228 and function as insulating layers. The CFET device 200 can also have a plurality of Vias 232a-232e that extend into a first interlayer dielectric (ILD) 210, where the first S/D structures 212, the second S/D structures 224, the first local interconnect structures 218, and the second local interconnect structures 228 are positioned in the first ILD 210. The Vias 232 can further extend through the second dielectric caps 220 and the third dielectric caps 230 to connect to the first local interconnect structures 218 and the second local interconnect structures 228. For example, the Via 232a can extend into the first ILD 210, extend through the second dielectric cap 220a and connect to the first local interconnect structure 218a. The Via 232e can extend through the third dielectric cap 230c to connect to the second local interconnect structure 228c.

In the CFET device 200, a plurality of isolation structures (also referred to as dielectric separations or insulating layers) 234a-234d can be formed over the Vias 232. For example, the isolation structure 234a is positioned on the Via 232a. The isolation structure 234b is positioned on the Via 232b. Further, a plurality of metal lines 238 can be positioned over the isolation structures 234 or the Vias 232. The metal lines 238 can be formed in a second ILD 236, where the second ILD 236 can be positioned over the first ILD 210. In an embodiment, one or more of the metal lines 238 can be coupled to the first local interconnect structures 218 or the second local interconnect structures 228. For example, the metal line 238e is coupled to the second local interconnect structure 228c through the Via 232e. In another embodiment, the isolation structures 234 can be disposed between the metal lines 238 and the first local interconnect structures 218 or between the metal lines 238 and the second local interconnect structures 228. Accordingly, the metal lines 238 are disconnected to the first local interconnect structures 218 or the second local interconnect structures 228. For example, the isolation structure 234a is positioned between the metal line 238a and the Via 232a, and thus the first local interconnect structure 218a is disconnected to the metal line 238a.

Still referring to FIG. 2, a plurality of separation structures 222a-222d can be disposed in the first ILD 210. The separation structures 222 can be positioned on the insulating layer 208 and extend along the X-direction. The separation structures 222 can be configured to separate the first S/D structures 212 and the second S/D structures 224 into a plurality of pairs. For example, the first S/D structure 212a and the second S/D structure 224a can be positioned between the separation structures 222a and 222b. The first S/D structure 212b and the second S/D structure 224b can be positioned between the separation structures 222b and 222c.

In an embodiment, the first S/D structures can be S/D structures of N-type transistors, and the second S/D structures can be S/D structures of P-type transistors. Accordingly, the first S/D structures can be made of silicon doped with phosphorous, and the second S/D structures can be made of silicon doped with boron. In another embodiment, the first S/D structures can be S/D structures of P-type transistors, and the second S/D structures can be S/D structures of N-type transistors. Accordingly, the first S/D structures can be made of silicon doped with boron, and the second S/D structures can be made of silicon doped with phosphorus. In an exemplary embodiment of FIG. 2, the first S/D structures 212 are S/D structures of P-type transistors and the second S/D structures 224 are S/D structures of N-type transistors.

In some embodiments, the power rails 204, the first local interconnect structures 218, the second local interconnect structures 228, the Via 232, the metal lines 238 can include W, Co, Ru, Al, Cu, or other conductive materials. The first dielectric caps 206, the second dielectric caps 220, the third dielectric caps 230, the isolation structures 234 and the separation structures 222a-222d can include SiN, SiCN, AlO, or other suitable dielectric materials. The first ILD 210 and the second ILD 236 can include SiO, TEOS, BPSG, PSG, USG, low-k dielectric or other suitable dielectric materials. The first silicide layer 214 and the second silicide layers 226 can include ruthenium silicide, titanium silicide, or other suitable silicide. In some embodiments, barrier layers or liners can be formed between the first local interconnect structures 218 and the first silicide layers 214. The barrier layers or the liners can also formed between the second local interconnect structures 228 and the second silicide layers 226. The barrier layer or the liners can include TiN, TaN, Ti, Ta, or other suitable barriers.

In an exemplary embodiment of FIG. 2, the power rails 204, the first local interconnect structures 218, the second local interconnect structures 228, the Via 232, the metal lines 238 are made of Ru. The first dielectric caps 206, the second dielectric caps 220, the third dielectric caps 230, the isolation structures 234 are made of AlO. The insulating layer 208 and the first ILD 210 are made of SiO. The separation structures 222 are made of SiN and the second ILD 236 are made of low-k dielectric. The first silicide layer 214 is made of ruthenium silicide and the second silicide layer 226 is made of titanium silicide. The barrier layers or liners are made of TiN.

In the CFET device 200, a replacement silicide process has been applied to form the first silicide layers 214 and the second silicide layers 226. In the replacement silicide process, first substitute silicide layers and second substitute silicide layers can be formed at first. Then the RMG module can be applied to form the metal gates. A thermal process can be applied to anneal the substrate. The first substitute silicide layers and the second substitute silicide layers can subsequently be replaced with the first silicide layers 214 and the second silicide layers 226. An exemplary manufacturing process can be illustrated in FIGS. 3-45.

Embodiments of the present disclosure include a combinational reverse metal contact and silicide process. In the process, a temporary or sacrificial or replacement or substitute silicide material is selectively or non-selectively deposited overtop the source and drain device structures. The replacement material (substitute silicide material) can be a dielectric with etch selectivity relative to the pre-metallization dielectric (e.g., the first ILD 210) in which the source and drain structures (e.g., the first S/D structure 212 or the second S/D structure 224) are contained within. The replacement material can function as an etch stop layer to protect the source and drain contacts (e.g., the first S/D structures 212 or the second S/D structures 224) when the pre-metallization dielectric is opened in a typical via-to-drain process. The replacement material functions as an efficient and effective diffusion block to silicon, silicon germanium, phosphorous, boron, or other doping species during thermal processing, such as reliability anneals, source and drain device formation within upper devices, dopant activation anneals, and silicon pre-clean anneals. The replacement material is selected to have no interaction with the silicon and/or silicon germanium source and drain contacts during the front end of the line (FEOL) thermal annealing processes mentioned above. The replacement material is selected to be easily removed after the high thermal processing is completed. Therefore a clean tunnel or space can exist around the surface area of the source and drain contacts, and a metal silicide can be subsequently grown thereon. The replacement material can be formed at a thickness sufficient to enable an isotropic etch process to remove (easily remove) all of the replacement silicide material from the surfaces of the source and drain contacts and have selectivity to the pre-metallization dielectric so that a uniform channel is created after the removal of the replacement silicide material. Example substitute silicide materials include, but are not limited to, silicon nitride, SiCN, SiC, and others.

Embodiments include forming a bottom local interconnect structure (e.g., the first local interconnect structure 218) by following the formation of the replacement silicide. The bottom local interconnect can be considered a reverse/dummy interconnect or reverse/dummy contact that is comprised of a replacement material. The replacement material (or the replacement interconnect material) can withstand the high thermal processing anneals that is performed later in the RMG process flow. The bottom local interconnect structure itself maintains its structural characteristics with the exception of the material composition in the final device. Such a process and nomenclature is similar to the replacement metal gate in which polysilicon or amorphous silicon is used to define the metal gate structure, and after the high temperature FEOL anneals is completed, the polysilicon or amorphous silicon material is removed and subsequently replaced with work function metals. In such a process, the physical gate structure is likewise maintained.

Replacement interconnect material is selected as a material with chemical and/or physical properties sufficient to withstand the high thermal anneals that is operated in the RMG module as well as during the formation of devices above. Replacement interconnect material benefits from having excellent etch selectivity to both the replacement silicide material used in the integration as well as the pre-metallization dielectric material in which the replacement interconnect or replacement contact structure can be contained. Replacement interconnect material is relatively easily removed through an isotropic vapor-phase etch, a chemical wet-etch, or an isotropic direct plasma or remote plasma etch process.

The replacement interconnect material is such that a selectively deposited or grown dielectric film or cap can be formed over the upper surface of the intended replacement interconnect structure to act as a dielectric separation between upper (or second) and lower (or first) interconnect structures. The replacement interconnect material also has etch selectivity to the deposited or grown dielectric cap material overtop the local interconnect structure, such that the replacement interconnect material can be removed completely without causing any damage or deformation to the dielectric separation between the upper and lower interconnect structures. Replacement interconnect material is selected so that it can also have no interaction during the thermal annealing processes with either the replacement silicide material, the pre-metallization dielectric, or the dielectric cap (e.g., second dielectric caps 220) used to isolated the upper and lower devices.

Replacement interconnect material can be cyclically etched or recessed after deposition into the interconnect patterning trench within the pre-metallization dielectric, such that a uniform top surface of the interconnect structure can be formed. In such an approach it is also beneficial for the replacement interconnect material to have chemical mechanical polishing (CMP) characteristics such that a planar film can be produced prior to recess within the interconnect trench. Alternatively, a substitution to the CMP characteristics can be a super-conformal deposition process in which a very flat upper surface or over-burden of the replacement interconnect material can be deposited with the subsequent planarization that can be operated either through a CMP or a recess etch. The replacement interconnect can be selectively deposited around the reverse silicide material or bottom-filled within the interconnect trench. Example materials for replacement interconnect include polysilicon and amorphous silicon among others.

Embodiments include a method to create an etch-selective dielectric barrier (e.g., the second dielectric cap 220) at a top of the bottom replacement local interconnect structure. Preferable, this dielectric separation is performed through selective deposition of a dielectric directly on the surface of the replacement interconnect material. If the replacement dielectric material is composed of polysilicon or amorphous silicon, then an alternative way is to grow the dielectric at the top of the replacement local interconnect structure. The dielectric material can be formed with benefits of good etch selectivity to the pre-metallization dielectric material that encases the contacts and local interconnect structures. It is also beneficial that the dielectric (e.g., the second dielectric cap 220) formed over the replacement bottom local interconnect has a sufficiently low dielectric constant that maintains reasonable capacitance and prevents capacitive coupling between the upper and lower (or bottom) devices. For the case of selective deposition over a polysilicon or amorphous silicon replacement local interconnect, the dielectric material can be a metal oxide such as aluminum oxide.

Processes to create the replacement interconnect and the etch-selective dielectric barrier can be repeated sequentially for every stacked device, such as during fabrication of a vertical stack of gate-all-around channel devices or other 3D logic vertical stacks.

Embodiments include isotropically removing (pulling) the replacement local interconnect material and the replacement silicide material after the RMG module and high thermal processes are completed. For example, all upper and lower replacement local interconnect structures can be opened during the formation of M0 trenches prior to metallization. Because M0 runs perpendicularly to the local interconnect structures, it is provided that all local interconnect structures can be accessed through the M0 tracks. During M0 pattern memorization in a hard-mask, such as TiN above the planar surface of the contact region, via-to-drain structures can be patterned which connect to replacement local interconnect structures, regardless if the local interconnect resides at an upper or lower device for a complementary FET device.

The via-to-drain structure can uncover the replacement materials in the local interconnect structures. An isotropic etch process such as vapor phase CERTAS etch by Tokyo Electron, a chemical wet-etch, or a direct or remote plasma isotropic etch can be used to remove the replacement material in the local interconnect structures. The replacement materials (e.g., polysilicon) in the local interconnect structures can be removed while the pre-metallization dielectric (e.g., silicon oxide) and the replacement silicide material (e.g., SiCN) can be impacted very less during the removal process. Selectivity is significantly important because any etching of the replacement silicide at this point can cause un-wanted etching of the source and drain epitaxy.

Because the M0 tracks run perpendicular to the local interconnect structures, the via-to-drain structures can be self-aligned. For example, the Y-orientation of the via-to-drain structure is formed/controlled by the size of the M0 trench and the X-direction of the via-to-drain structure is formed/controlled by the size of the local interconnect structure. This self-alignment provides a means for which an overly-sized via-to-drain structure can be formed to enable complete clear-out of the replacement interconnect and replacement silicide materials.

Some embodiments can include using a buried power rail (BRP) (e.g., power rails 204 formed below channel material in the bulk silicon) in the device design. In some cases, the buried power rail can already be formed and metallized with a high refractive metal (such as ruthenium) prior to any formation of the reverse or replacement local interconnect or silicide structures. Such a fabrication flow imposes a further etch selectivity restriction for selecting the replacement local interconnect during the formation of the local interconnect structures because the local interconnect structures can be coupled to the power rails through Vias. In such a case, the interface between the local interconnect structures and the power rail is preferably ruthenium or other type of metal in the BRP structure, with polysilicon as the replacement interconnect material. Note that sufficiently high etch selectivity should also exist such that any etching of the replacement interconnect material (e.g., polysilicon) does not etch the formed buried power rail (e.g., ruthenium). This is typically challenging because polysilicon and metals would be etched using similar etch chemistries. A vapor-phase etch, however, such as with Tokyo Electron CERTAS etch, can be used to have extremely high etch selectivity between silicon and metals. Alternatively other etch equipment using chemical wet etches and either direct or remote plasma can meet this high selectivity based on what chemistry is used to etch the replacement interconnect material.

Embodiments can include using the same access point established by the formation of the via-to-drain structures to connect all local interconnect structures. Following removal of the replacement local interconnect material by an etch process, the etch process is switched to remove the replacement silicide material on the surface of the source and drain contacts. A height or thickness of the replacement silicide is created that enables easy access to completely remove the replacement silicide material (e.g., SiCN) from the surface of the contacts, that is, a sufficient thickness to remove without causing any damage or deformation to the contacts themselves. Etch selectivity is such that no etching (or insignificant etching) of the pre-metallization dielectric is realized. Removal of the replacement silicide material causes no damage to the source and drain contact. The initial height or thickness of the reverse silicide material is adequate to allow complete clear-out of the material during an isotropic etch process.

Embodiments include a method to form a self-aligned silicide in the space left behind by the replacement silicide. The self-aligned silicide can be executed by selective deposition, atomic layer deposition (ALD) or chemical vapor deposition (CVD), followed by a wet removal or plasma etching of the unreacted metal from the silicide material. The deposition can fill the relatively small channels created by the removal of the replacement silicide. An in-situ oxide clean process such as COR (chemical oxide removal) manufactured by Tokyo Electron can be incorporated to pre-clean the epitaxy surface prior to the silicide formation process. The masking step can be done at one time for a complementary FET device if a common silicide is to be used. Otherwise, multiple masking steps can be used to yield different silicide materials over NMOS and PMOS source and drains.

Embodiments include filling the local interconnect structures with a final high conductance metal and any liners or adhesion layers required. Deposition of metal and adhesion layers must be conformal such that the body of the local interconnect structure can be filled without constricting the via-to-drain structure first. Note that the final higher conductance metal fill can not only fill the local interconnect structures, but also fill the via-to-drain structures as well as the M0 tracks simultaneously. A benefit of the filling process is that the local interconnect high conductance metal fill can be done at a single time for complementary and other 3D logic devices. Conventionally in CFET process the filling process is executed across multiple steps in the integration. It is understood that metals desired for leading edge logic are typically expensive and keeping the deposition to a single unit process step can have significant cost benefits as well. Thus, the filling process can be used as a cost saving measure in addition to rectifying the thermal budget associated with the manufacturing process.

Another process step can include isolating the metallized interconnects that are used to connection to any M0 track such as interconnects that are tapping the buried power rails or interconnects which have no upward connection to the back-end of the line (BEOL). The replacement silicide and interconnect process requires an access point at a M0 track where there is no desire to actually connect the interconnect structure to the M0 track. For these situations a dielectric separation can be formed between the interconnect structure and M0 track. In this manner an additional masking step is then used to form a "contact" or "open" pattern after the final interconnect/via-to-drain/M0 metallization.

Some metals such as ruthenium have the benefit of being able to be etched well within an anisotropic etch process while having high conductance. The benefit of these properties allows ruthenium to be recessed only for the via-to-drain structures that are selected to be electrically isolated based on the cell layout. When the isotropic etch is used, there is a risk that the isotropic etch can extend over to adjacent via-to-drain structures in which connection between the local interconnect and the M0 track is still required. After the metal has been recessed well within the desired via-to-drain structures, a dielectric can be selectively deposited, grown, or patterned by using a deposition followed by an etch-back process to create a desired dielectric separation. The material choice in the present disclosure can be a material having an adequately low dielectric constant. For example, aluminum oxide (AlO) can be selected to form the dielectric film because the AlO can be selectively deposited to the recessed ruthenium. Any dielectric deposited on a top of the bulk filled metal above the M0 tracks (referred to as the over-burden of the deposition) can be removed by chemical mechanical polishing or other methods. After the deposition of the dielectric separation, it is desired to refill the area of the M0 tracks from which the high conductance metal had been removed. This can be accomplished through a second deposition of the metal and subsequent CMP or etch-back process to reform the M0 tracks.

In some embodiments, the reverse interconnect and reverse silicide process herein can be incorporated in FINFET, gate-all-around (GAA), and stacked 3D logic devices such as complementary FET. For convenience in describing embodiments herein, example descriptions focus on CFET as the most complex implementation. This is not limiting and embodiments herein can be carried over to conventional wrap-around contact processes used for either FINFET or GAA devices.

An example flow of a complementary FET device comprised of vertically stacked nano-channels (nanowires or nanosheets) can be described with reference to FIGS. 3-45.

Figure 3:
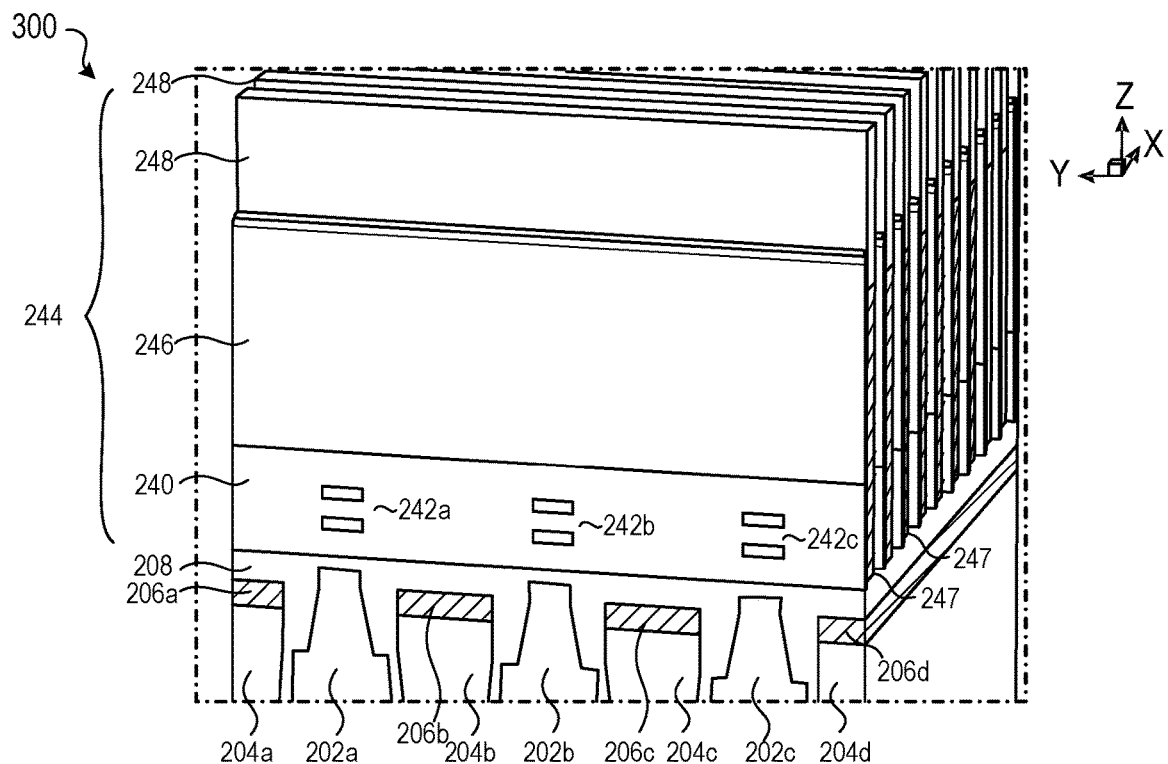
FIGS. 3-45 are perspective views of various exemplary intermediate steps of manufacturing an exemplary CFET, in accordance with some embodiments.

In FIG. 3, a semiconductor structure 300 can be provided. As shown in FIG. 3, the semiconductor structure 300 can have a plurality of silicon fins protrude from a substrate (not shown). For example, three fins 202a-202c are included in FIG. 3. A plurality of power rails 204a-204c can be arrange over the substrate and positioned between the fins 202. In some embodiments, the power rails 204 can further extend along an X-direction of the substrate. The power rails 204 are buried at a bottom portion of the semiconductor structure 300 and configured to provide operation voltages (e.g., Vdd or GND). A plurality of first dielectric caps 206a-206d are positioned on the power rails 204 and functions as isolation layers. In addition, an insulating layer 208 can be positioned between the power rails 204 and the fins 202. Still referring to FIG. 3, a plurality of first channel structures 242a-242c can be positioned over the fins 202. Each of the first channel structures 242 can be disposed over a respective fin 202. For example, the first channel structure 242a is positioned over the fin 202a. The first channel structures 242 are further aligned with the fins 202 along a Z-direction. Each of the first channel structures 242 can include one or more first nanosheets or first nanowires that extend along the X-direction. The first nanosheets or nanowires can stacked over the fins 202 and spaced apart from one another. In an embodiment of FIG. 3, the first channel structures 242 include two first nanosheets. The first channel structures 242 can be buried in a hard mask stack 244 that includes an underlying layer 247 and a cap layer 248. In some embodiments, the underlying layer 247 can be made of carbon and the cap layer 248 can be made of SiN.

A sidewall spacer approach can be used to form a cover spacer 246 to block upper (or second) device nanosheets (or second channel structures) that are not shown in FIG. 3 and open the lower (or the first or the bottom) device nanosheets (or the first channel structures) 242. As shown in FIG. 3, the first channel structure 242 can be exposed in a low-k gate spacer 240 and positioned within a plane (e.g., the Y-Z plane in FIG. 3) parallel/aligned with the intended contact and interconnect region. The exposed silicon nanosheets (or first channel structures) 242 of the bottom device (e.g., P-type transistor) can be pre-cleaned either through an in-situ high thermal anneal or through an in-situ chemical oxide removal (COR) vapor-phase etch process performed immediately prior to the source and drain epitaxy growth. The exposed nanosheets (or first channel structures) 242 can be isotropically recessed within the low-k gate spacer 240 in order to reduce the gate extension of the channel structure.

Figure 4:
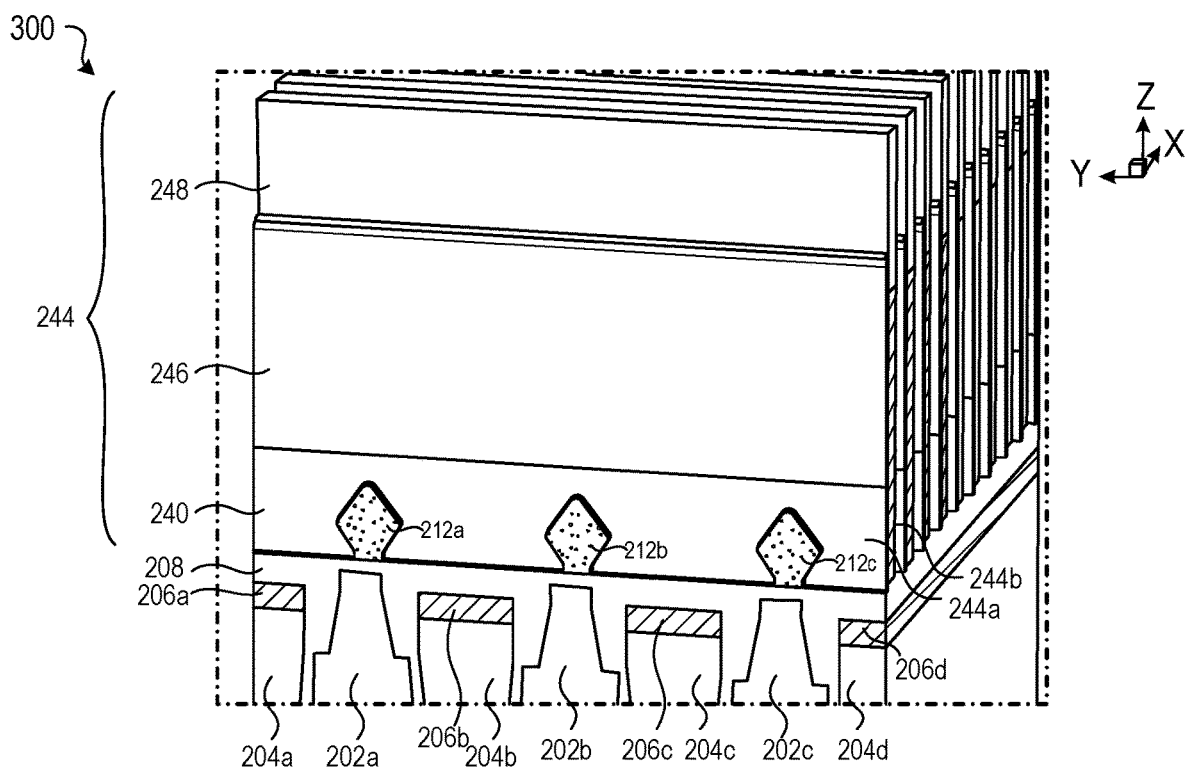

FIG. 4 shows formation of the lower source and drain contacts (or first source/drain structures) 212a-212c through an in-situ doped epitaxy growth process. The first source/drain (S/D) structures 212 are of bottom devices that are positioned at the bottom of the semiconductor structure 300. In an exemplary embodiment of FIG. 4, the bottom devices can be PMOS devices. Thus the first S/D structures 212 are comprised of silicon germanium with in-situ doped boron. The source and drain contact (or first source/drain structures) 212 after formation can be etched in order to fit any desired minimum specification on size to fit within the cell height of the proposed standard cell design. It should be noted that the bottom devices that include the first S/D structures 212 can be either NMOS devices or PMOS devices depends on the circuit designs and factors such as number of connections between PMOS and NMOS to upper metal tracks, thermal considerations for in-situ doping, et cetera.

Still referring to FIG. 4, the first S/D structures 212 of the bottom devices can be positioned at first ends of the first channel structures 242 that are positioned at a first side 244a of the hard mask stack 244. In addition, second S/D structures (not shown) of the bottom devices can be positioned at second ends of the first channel structures 242 that are positioned at a second side 244b of the hard mask stack 244. The first channel structures of the bottom devices accordingly are arranged between the first S/D structures 212 and the second S/D structures, and further be embedded in the hard mask stack 244.

Figure 5:
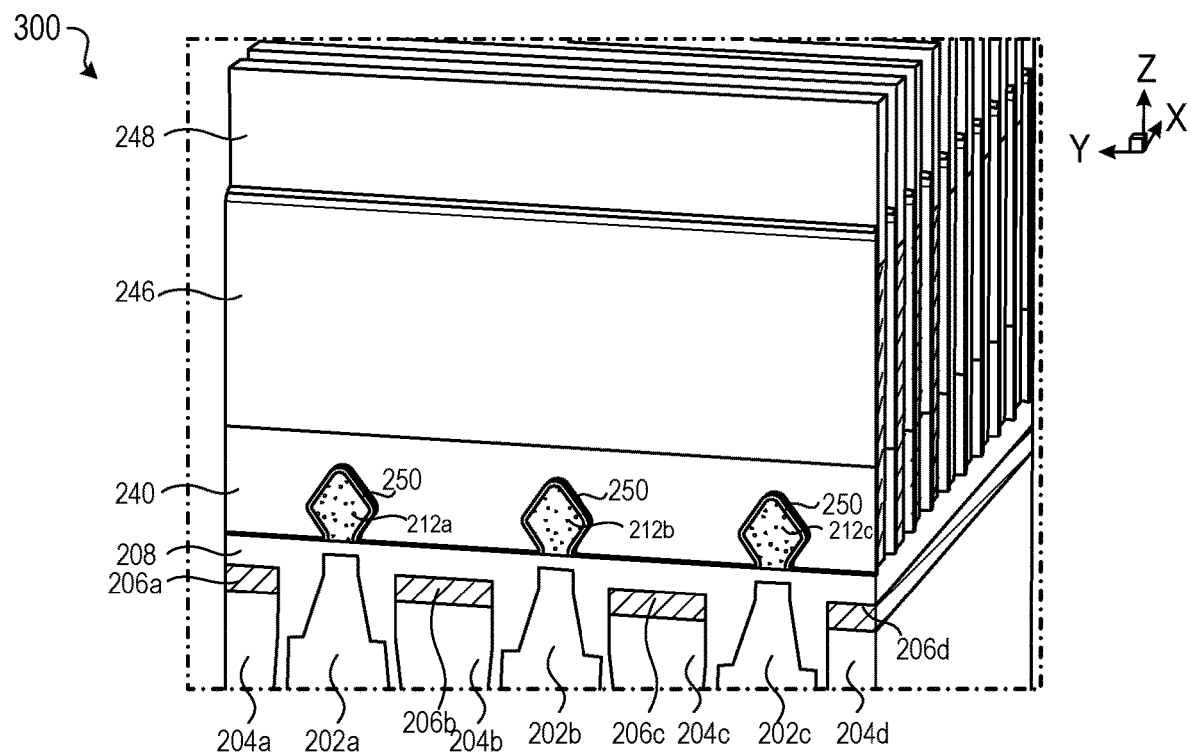

FIG. 5 shows a replacement silicide material is either selectively deposited or isotropically deposited around surfaces of the source and drain contact structures (or first S/D structures) 212 for form a plurality of first substitute silicide layers 250. The first substitute silicide layers 250 can be arranged on surfaces of the first S/D structures 212. The preferred approach herein is to enable a selective deposition of the replacement silicide directly over the surfaces of only the source and drain contacts.

Figure 6:
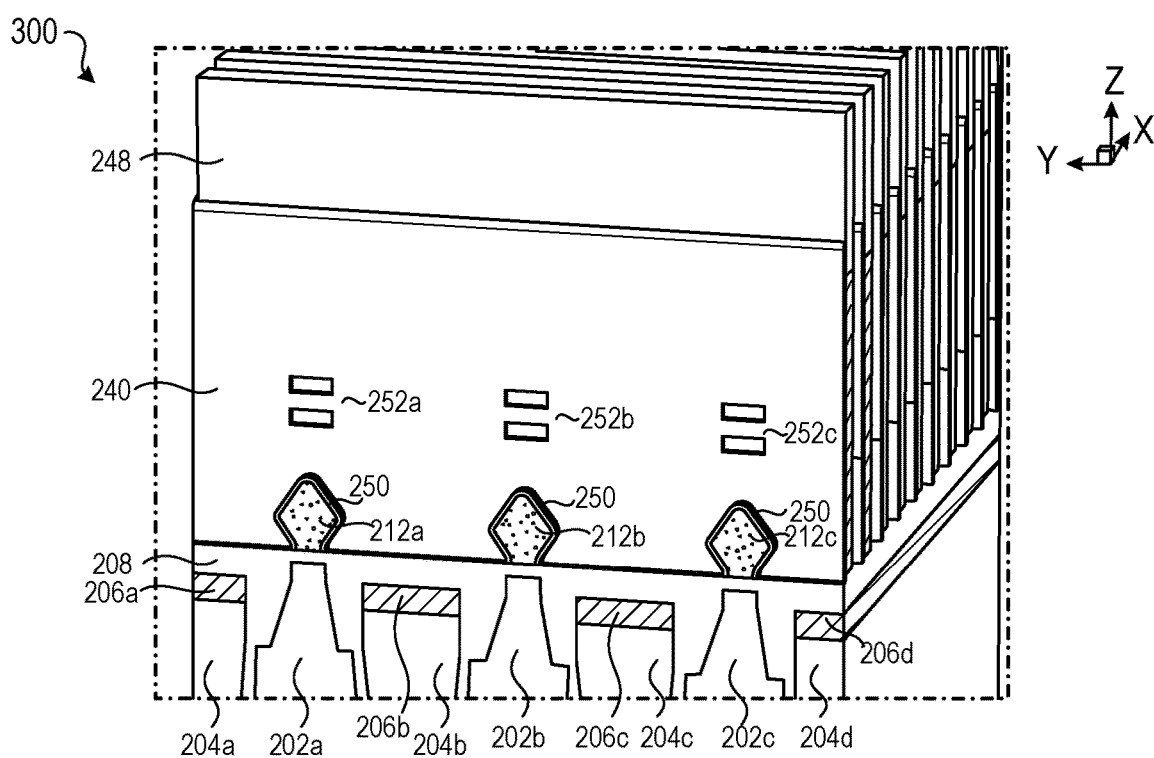

In FIG. 6, the cover spacer 246 is removed from the upper devices (or second devices) to expose silicon nanosheets (or second channel structures) 252a-252c of the upper complementary devices. As shown in FIG. 6, the second channel structures 252 are positioned over the fins 202 and the first S/D structures 212. In addition, the second channel structures 252, the fins 202 and the first S/D structures 212 are aligned with each other along the Z-direction. For example, the second channel structure 252a, the first S/D structure 212a and the fin 202a are aligned along the Z-direction. Each of the second channel structures 252 can include one or more nano The exposed silicon nanosheets (or second channel structures) 252 at the upper device can be pre-cleaned either through an in-situ high thermal anneal or through an in-situ chemical oxide removal (COR) vapor-phase etch process. The pre-clean process can be done immediately prior to the source and drain epitaxy growth. The exposed nanosheets (or second channel structures) can be isotropically recessed within the low-k gate spacer 240 to reduce the gate extension of the channel.

Figure 7:
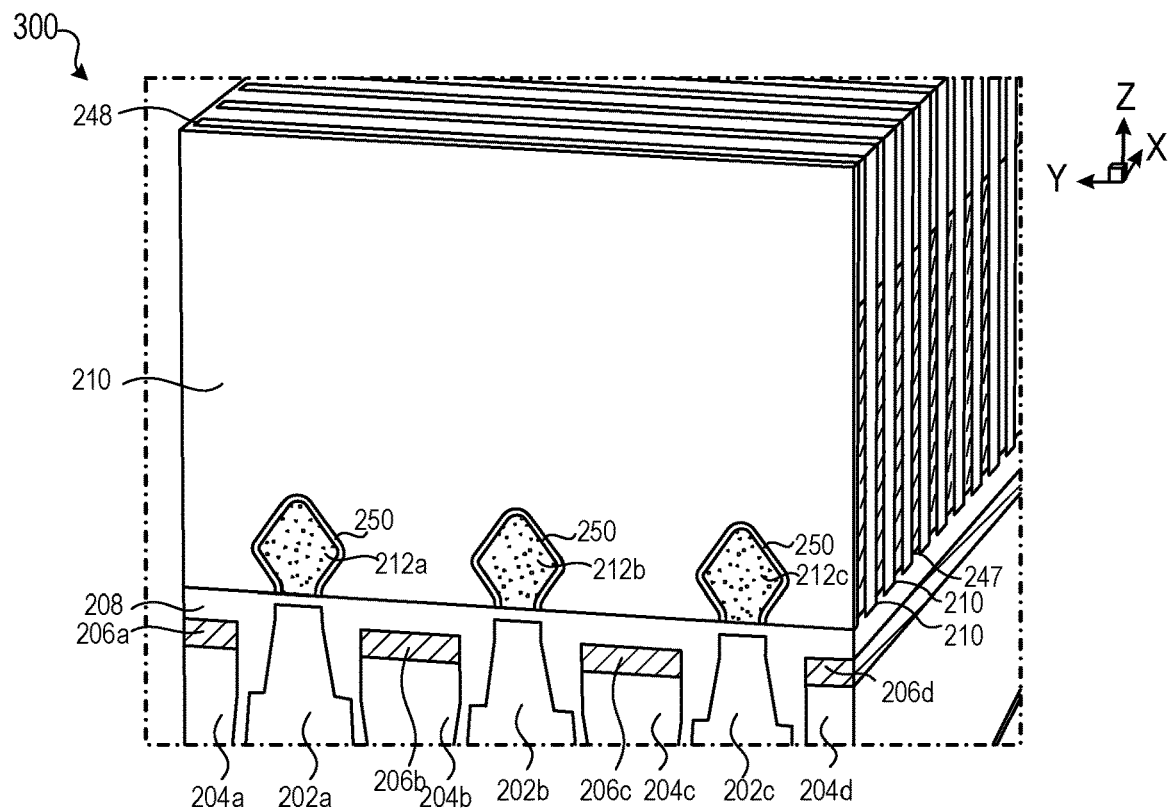

In FIG. 7, a pre-metallization dielectric 210 such as silicon oxide is deposited within the source and drain plane (e.g., the spaces between the hard mask stacks 244). The pre-metallization dielectric 210 can function as a first ILD 210 in which the interconnect trench structures for the bottom devices can be initially formed in subsequent manufacturing steps.

Figure 8:
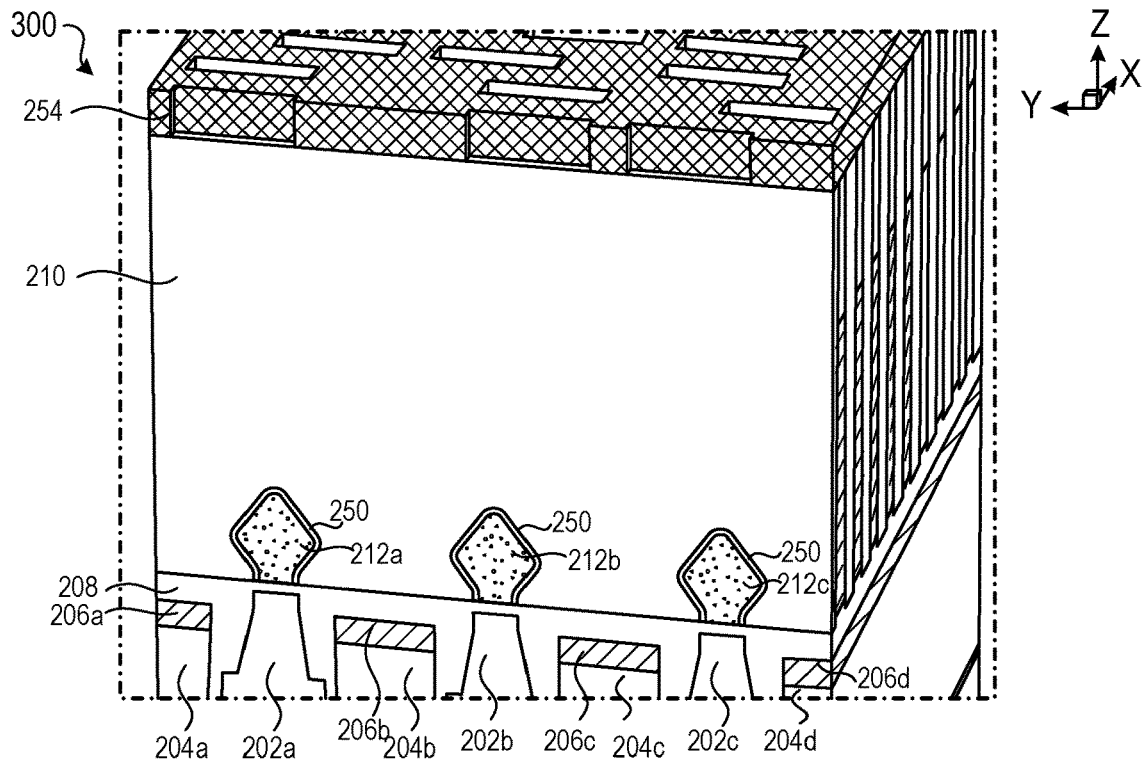

In FIG. 8, a hardmask 254 can be deposited over the pre-metallization dielectric 210 and patterned with the lower local interconnect structure template. The lower local interconnect structure template can eventually be transferred down through the pre-metallization dielectric 210.

Figure 9:
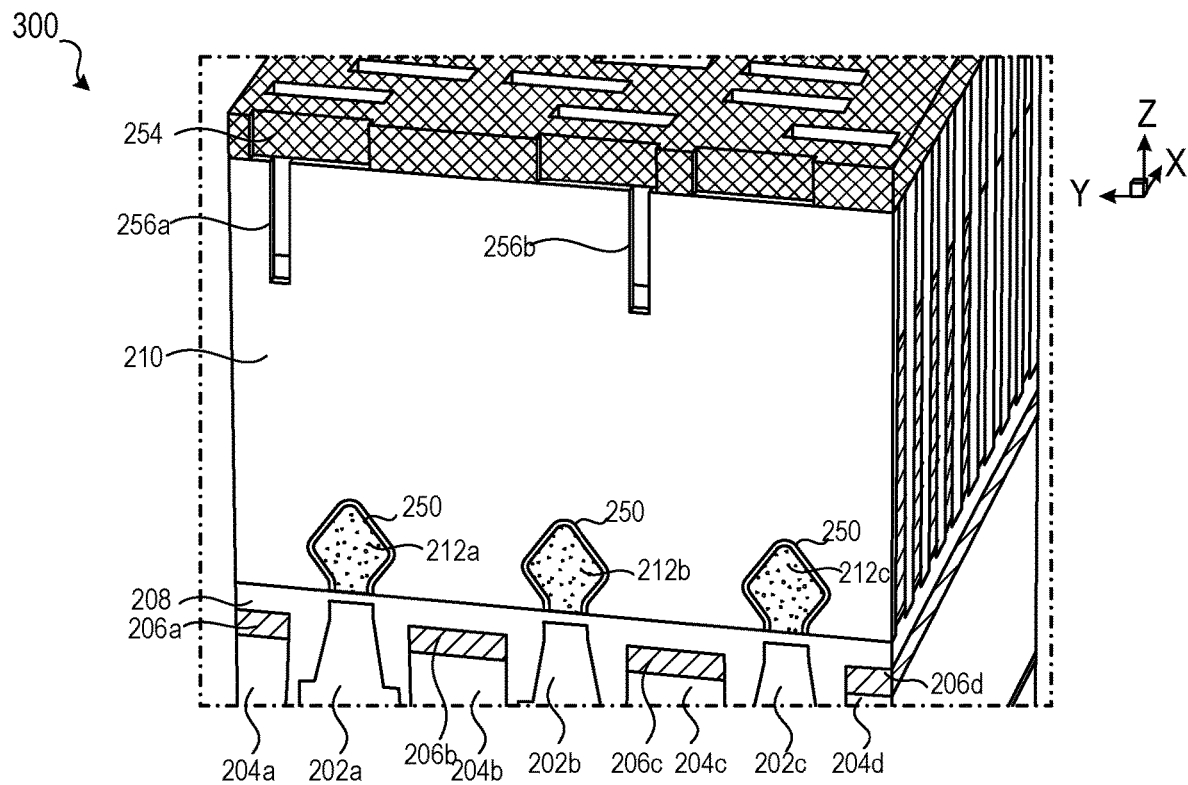

In FIG. 9, via-to-rail openings 256 can be patterned and partially transferred down in to the pre-metallization dielectric 210 through an etching process. The via-to-rail openings can form via-to-rail structures in the subsequent manufacturing steps. The via-to-rail structures can connect the bottom interconnects (or first local interconnect structures) to the buried power rails 204. In an exemplary embodiment of FIG. 9, the via-to-rail openings and interconnect patterning to form the bottom interconnects (or first interconnect structures) can be formed through a dual damascene process. The dual damascene process is similar to a dual damascene process during a BEOL metallization.

Figure 10:
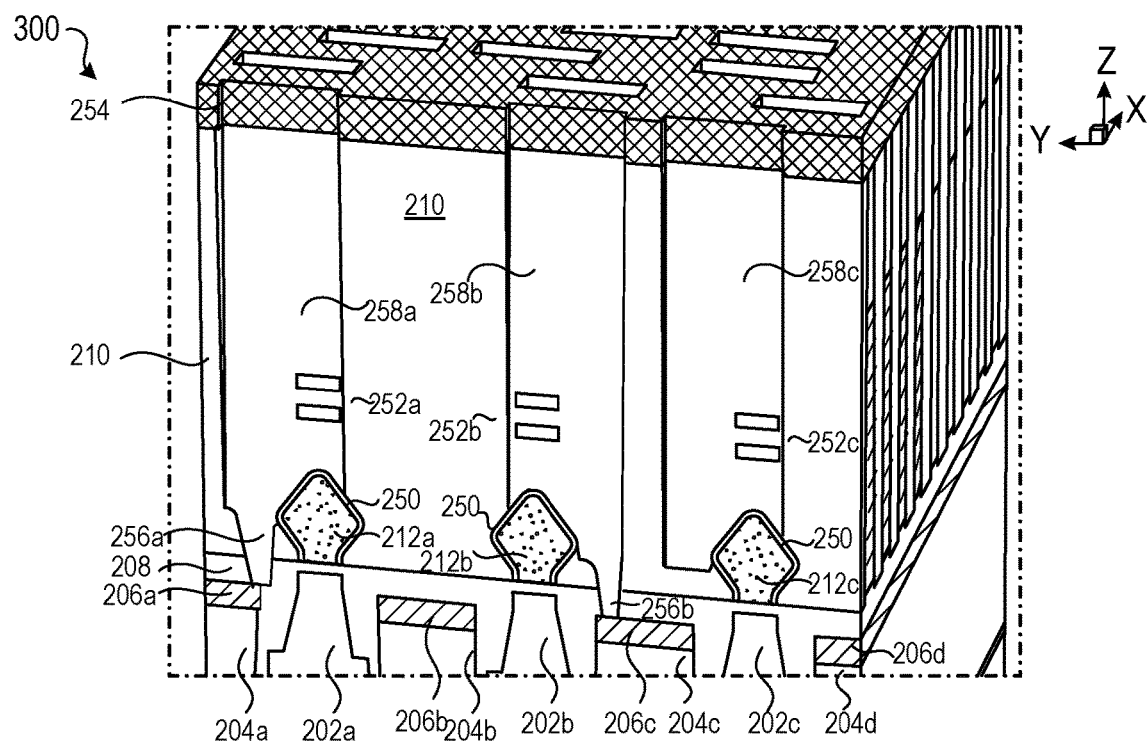

In FIG. 10, a lower device interconnect pattern is transferred down through the pre-metallization dielectric 210 where the first interconnect trenches 258a-258c can be formed within the pre-metallization dielectric 210 to uncover the first S/D structures 212 and the replacement silicide (or the first substitute silicide layers) 250 while the bottom of the via-to-rail openings 256 can stop at the first dielectric caps 206 of the buried power rails 204. For example, the first interconnect trench 258a can uncover the first S/D structure 212a and the first substitute silicide layer 250, and the bottom of the via-to-rail opening 256a can stop at the first dielectric cap 206a of the buried power rail 204a.

Figure 11:
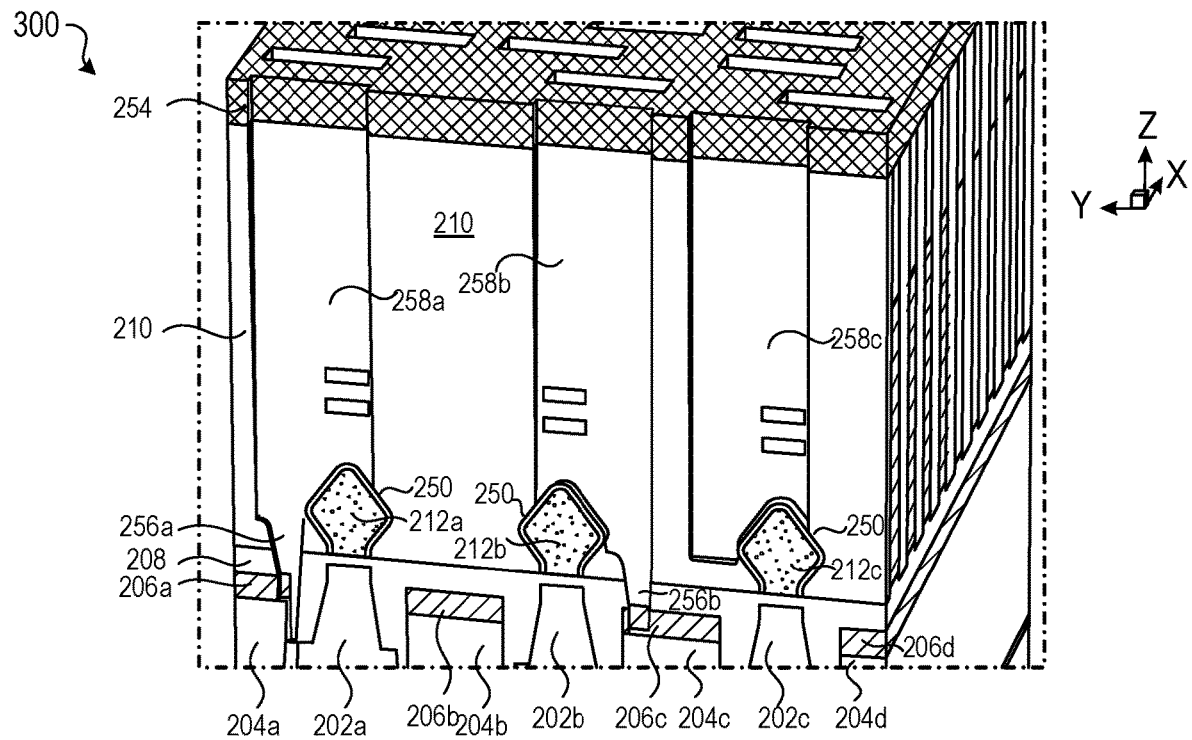

In FIG. 11, the first dielectric caps 206 overtop the buried power rails 204 can be opened by an etching process. The replacement silicide (or the first substitute silicide layers) 250 can be used to protect the source and drain epitaxy (or first S/D structures) 212 from any damage during the etching process considering that etch chemistries used for anisotropic etching of the first dielectric caps 206 made of metal oxides are similar to what is commonly used for etching silicon.

Figure 12:
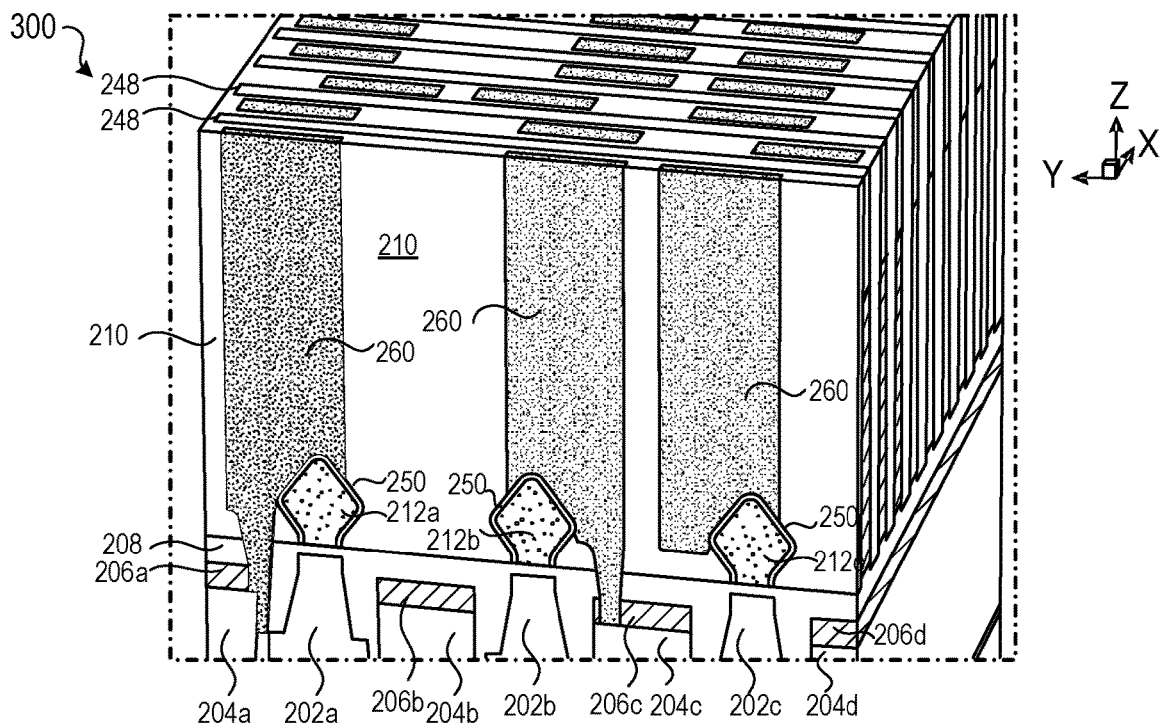

In FIG. 12, the first interconnect trenches 258 and via-to-rail openings 256 are then filled with a replacement interconnect material 260, which can be polysilicon or amorphous silicon in an embodiment of FIG. 12. The replacement interconnect material 260 can either be conformally filled and CMP planarized by utilizing the nitride caps (e.g., the cap layers) 248 over the dummy gates as an effective and convenient etch-stop layer (ESL). Alternatively, the replacement interconnect material 260 can be conformally "super-filled" in which the overburden of the film is of adequate uniformity to allow an isotropic etch-back recess to be done, or the material can be bottom-filled with unique capabilities available from Tokyo Electron tools.

Figure 13:
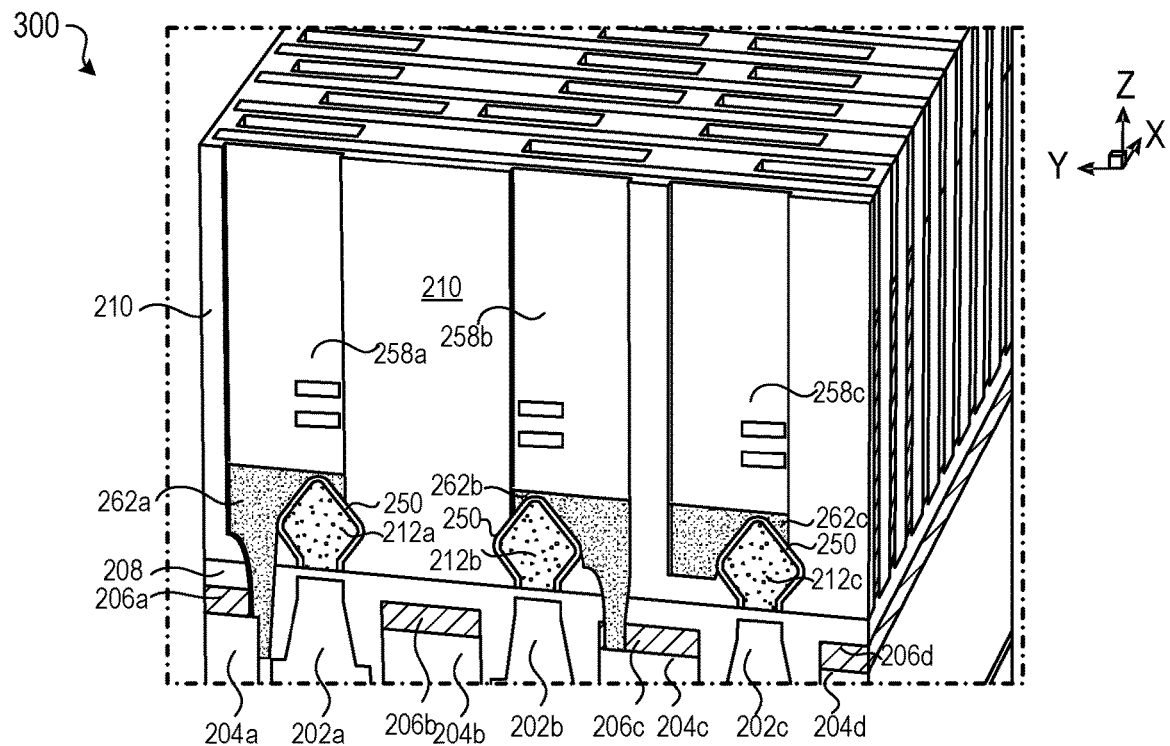

In FIG. 13, the replacement interconnect material 260 can then be isotropically etch-recessed back to form a plurality of first substitute interconnect structures 262a-262c with a desired height. Accordingly, the first interconnect trenches 258a-258c can be uncovered. As shown in FIG. 13, the first substitute interconnect structure 262a is positioned over the first substitute silicide layer 250 and the first S/D structure 212a and further connected to the power rail 204a. The first substitute interconnect structure 262b is positioned over the first substitute silicide layer 250 and the first S/D structure 212b and further connected to the power rail 204b. The first substitute interconnect structure 262c is positioned over the first substitute silicide layer 250 and the first S/D structure 212c. For the example case of polysilicon or amorphous silicon, multiple etch hardware and chemistries can be used for this process with excellent selectivity to the pre-metallization dielectric, the low-k gate spacer, and the intended replacement silicide material.

Figure 14:
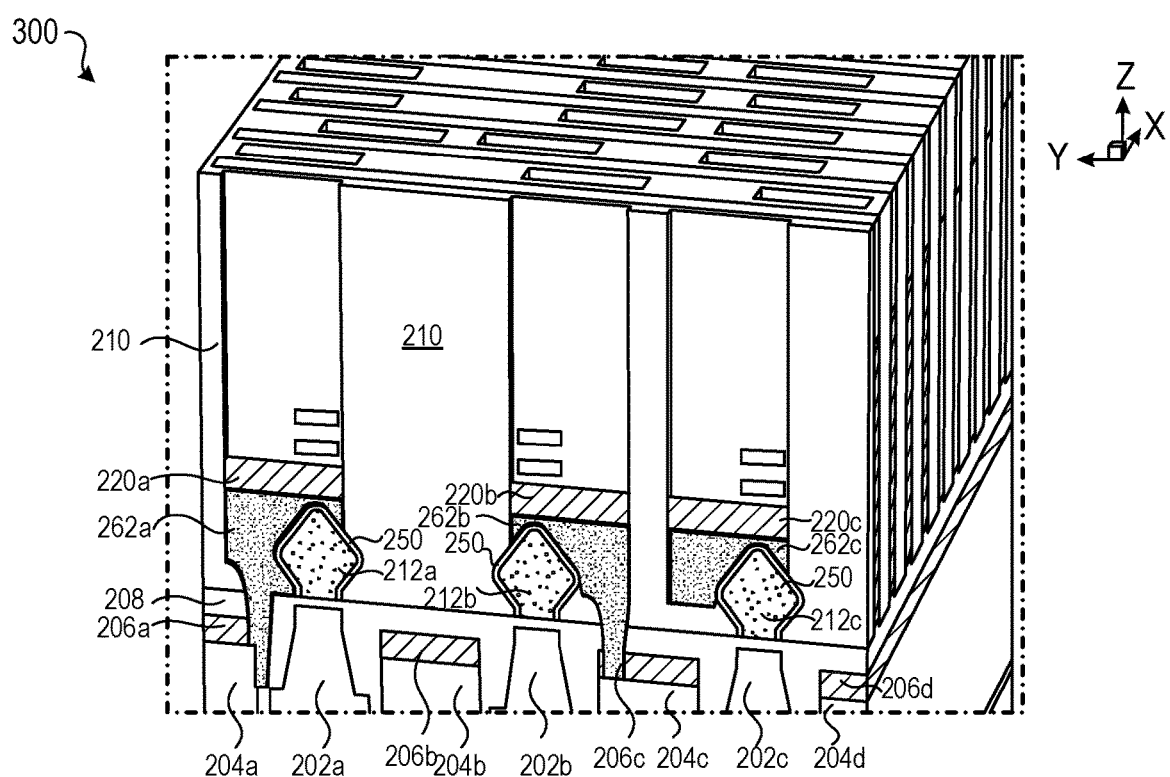

In FIG. 14, a plurality of second dielectric caps 220a-220c are formed over the top surfaces of the replacement interconnect structures (or first substitute interconnect structures) 262a-262c. For example, the second dielectric cap 220a is positioned over the top surface of the first substitute interconnect structure 262a. The second dielectric cap 220b is positioned over the top surface of the first substitute interconnect structure 262b. The second dielectric cap 220c is positioned over the top surface of the first substitute interconnect structure 262c. The second dielectric caps 220a-220c can be used for a multiple of applications, including preserving a fixed minimum dielectric separation between upper and lower devices through any self-aligned formation processes of the interconnect structures, to provide a "ceiling" for the replacement interconnect structures when the replacement material is removed and replaced with a high conductive metal.

Figure 15:
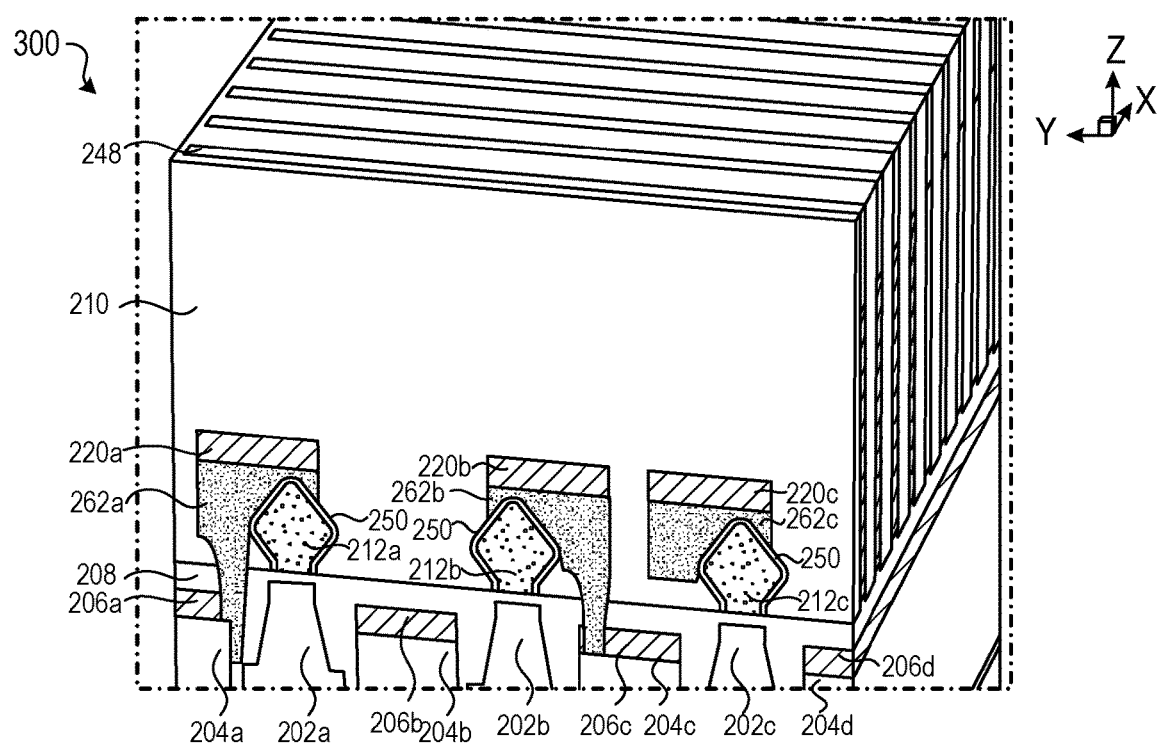

In FIG. 15, the pre-metallization dielectric 210 can then be used to fill in the first interconnect trenches 258a-258c and then CMP planarized to provide a planar surface by using the silicon nitrides (e.g., the cap layers) 248 over the dummy gate as a CMP-stop layer.

Figure 16:
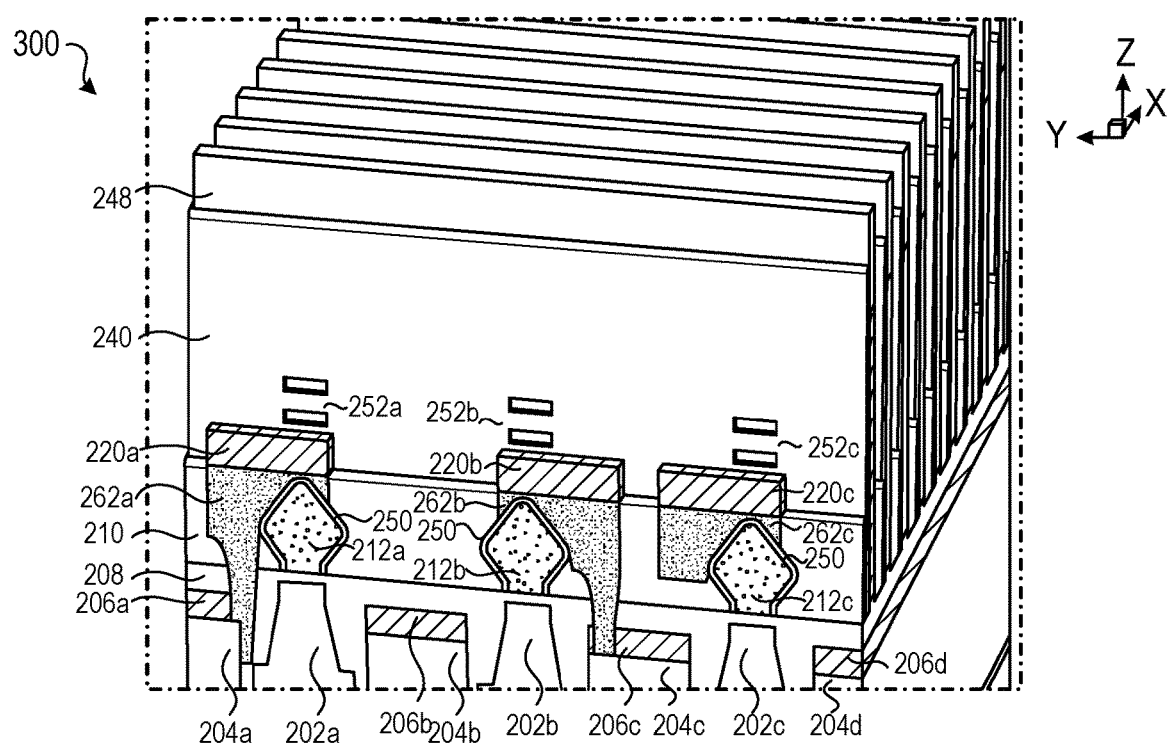

In FIG. 16, the pre-metallization dielectric 210 is then isotropically etch-recessed down until uncovering the second channel structures 252 of the upper device. It should be noted that the low-k gate spacer 240 is also uncovered when the pre-metallization dielectric 210 is recessed. The second dielectric caps 220 over the top surfaces of the bottom replacement interconnect structures (or the first substitute interconnect structures) 262 can be used as an etch-point for the recess of the silicon oxide film (e.g., the pre-metallization dielectric) 210.

Figure 17:
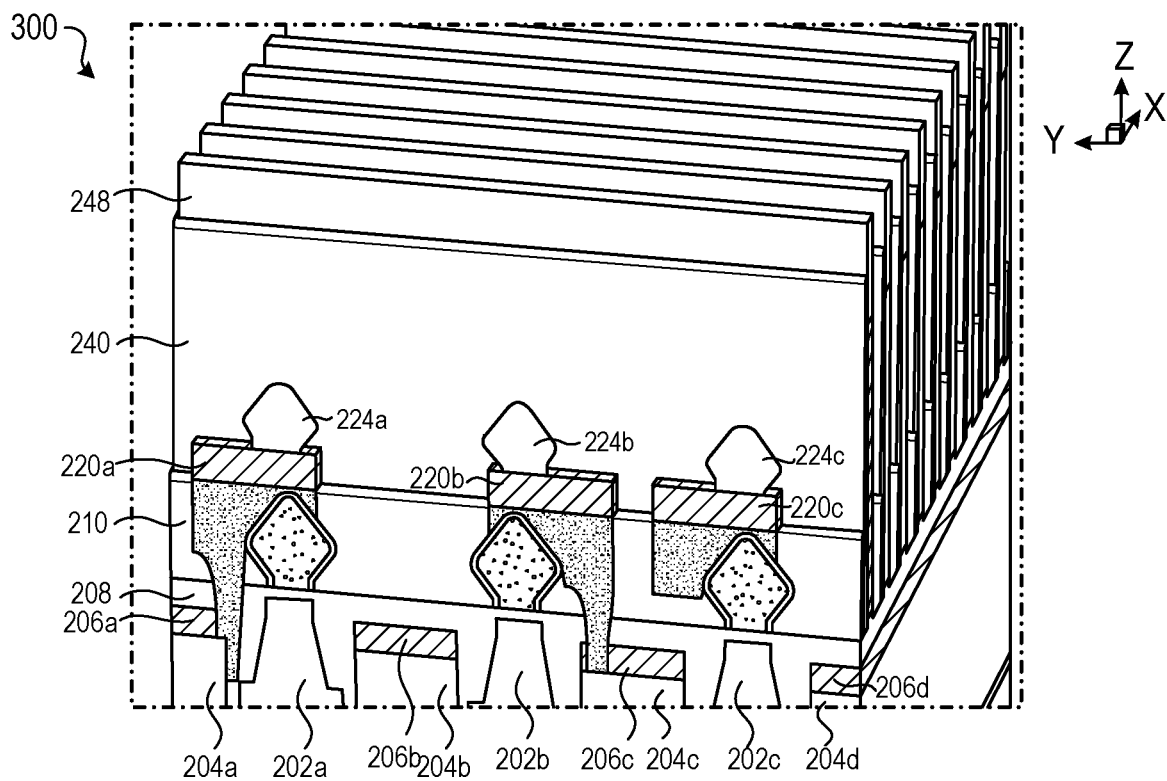

FIG. 17 shows formation of the upper source and drain contacts (or second S/D structures) 224a-224c through an in-situ doped epitaxy growth process. In an exemplary embodiment of FIG. 17, the upper (or second) device is an NMOS device and the second S/D structures are comprised of silicon with in-situ doped phosphorous. The source and drain contacts (or second S/D structures) 224a-224c after formation can be etched in order to fit any desired minimum specification on size to fit within the cell height of the proposed standard cell design. The bottom device can be either NMOS or PMOS and selection of what is used as the bottom device depends on the designer and factors such as number of connections between PMOS and NMOS to upper metal tracks, thermal considerations for in-situ doping, et cetera.

Figure 18:
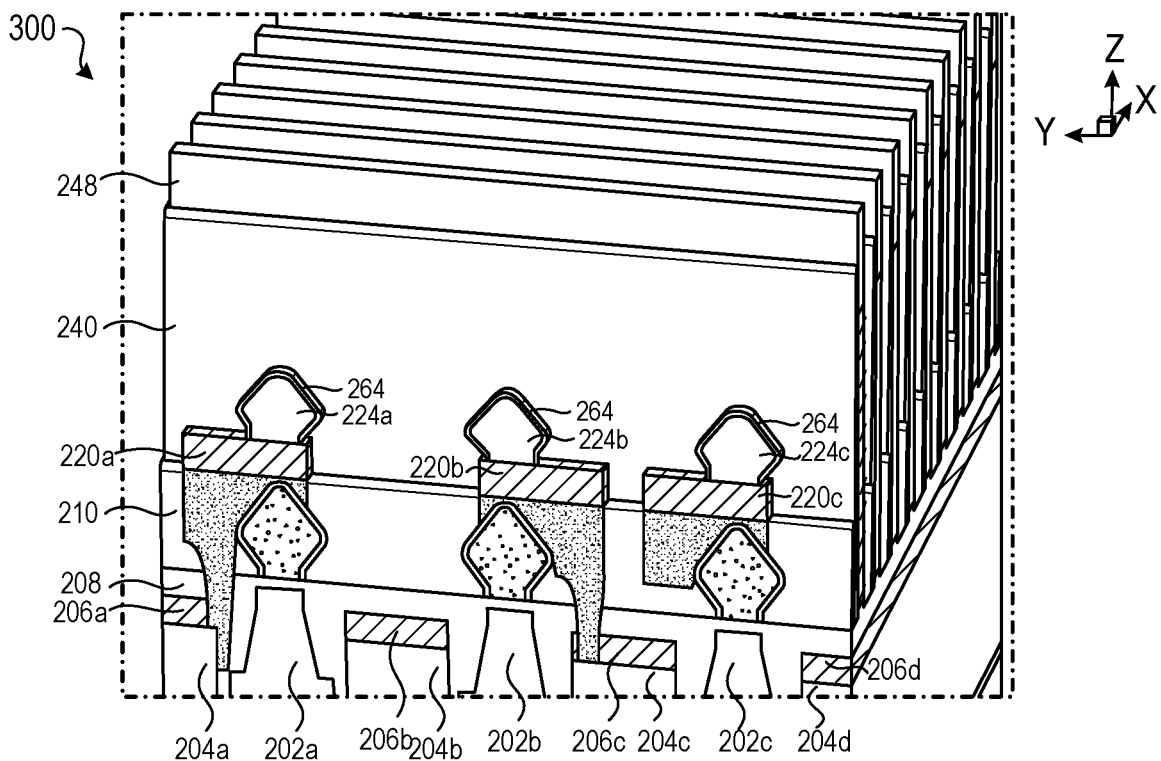

In FIG. 18, a replacement silicide material is either selectively deposited or isotropically deposited around the surfaces of the second S/D structures 224 for form a plurality of second substitute silicide layers 264. Preferably deposition of the replacement silicide material is selectively deposition process to form the second substitute silicide layers 264 on the surfaces of the second S/D structures 224.

Figure 19:
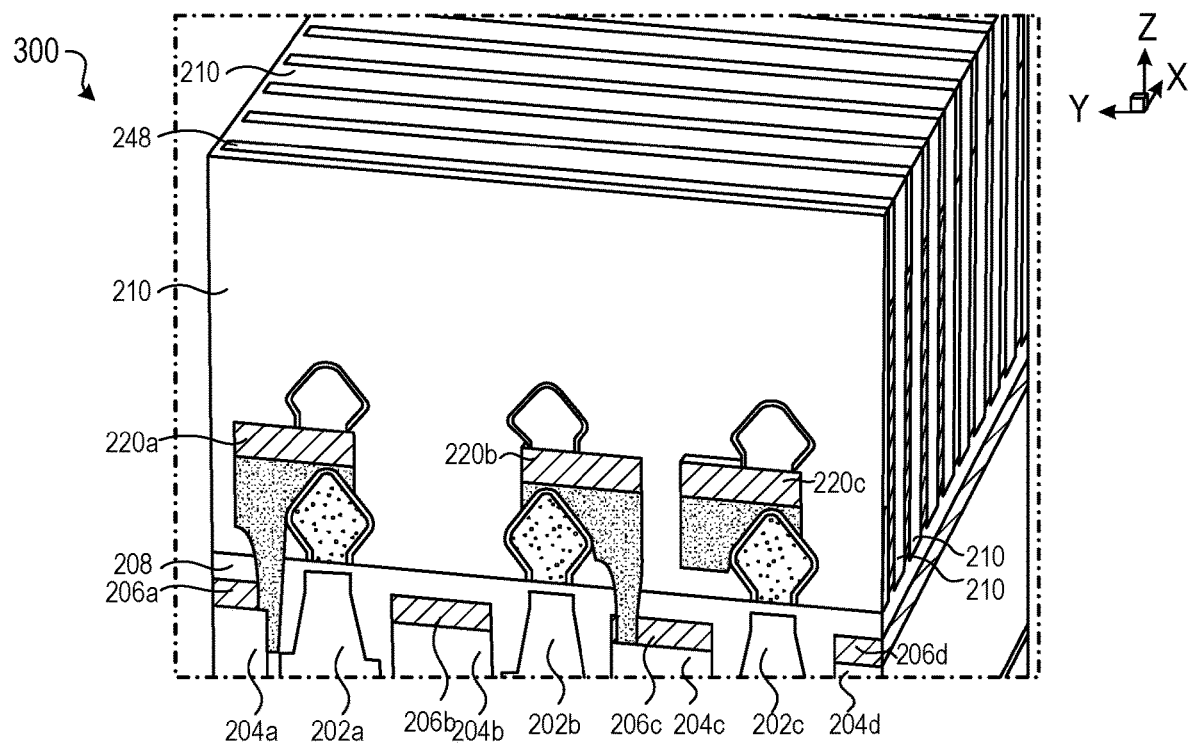

In FIG. 19, a pre-metallization dielectric 210 such as silicon oxide is deposited again within the source and drain plane (e.g., the spaces between the hard mask stacks). The pre-metallization dielectric can function as the first ILD 210 in which the interconnect trench structures for the bottom and upper devices can be initially formed in subsequent manufacturing steps.

Figure 20:
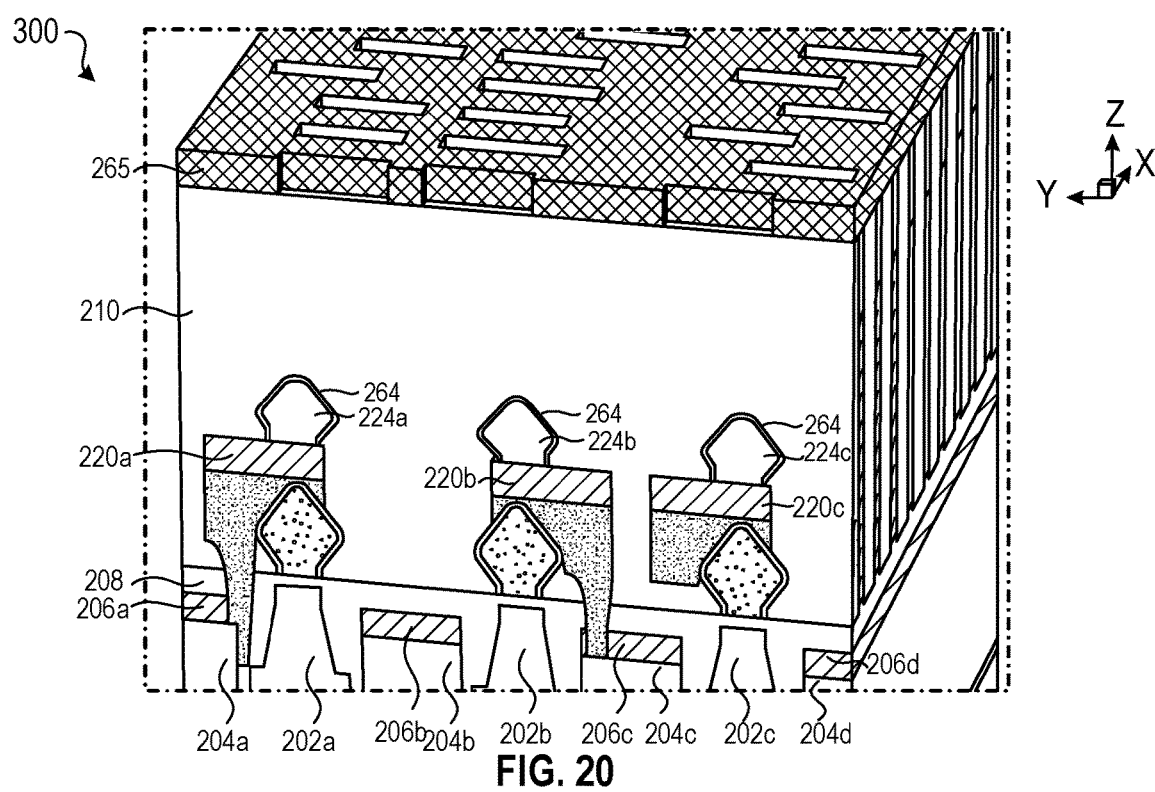

In FIG. 20, a hardmask 265 can be deposited over the pre-metallization dielectric 210 and patterned with the upper local interconnect structure template that can eventually be transferred down through the pre-metallization dielectric 210.

Figure 21:
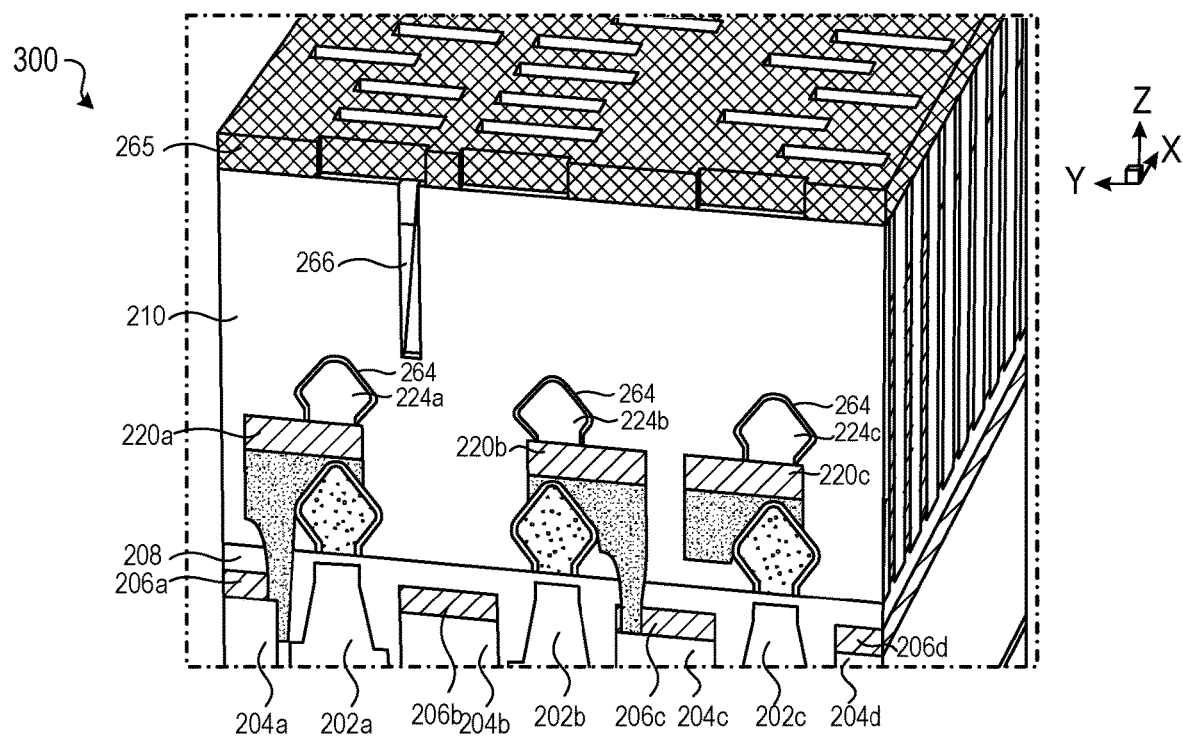

In FIG. 21, a via-to-rail opening 266 can be patterned and partially transferred down in to the pre-metallization dielectric 210 through an etching process. The via-to-rail opening 266 can form a via-to-rail structure in the subsequent manufacturing steps. The via-to-rail structure can connect the upper interconnects (or second local interconnect structures) to the buried power rails 204. In an exemplary embodiment of FIG. 21, the via-to-rail opening and interconnect patterning to form the upper interconnects can be formed through a dual damascene process. The dual damascene process is similar to a dual damascene process during a BEOL metallization.

Figure 22:
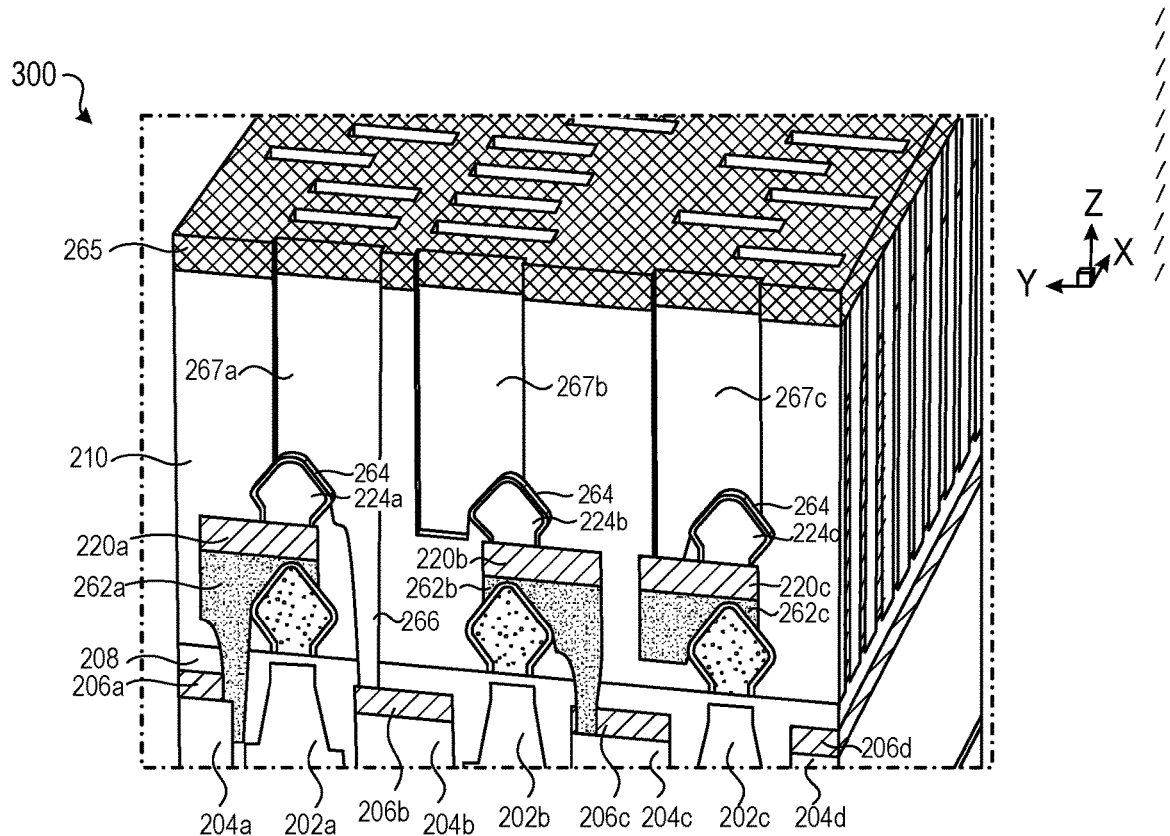

In FIG. 22, an upper device interconnect pattern is transferred down through the pre-metallization dielectric 210 where the second interconnect trenches 267a-267c can be formed within the pre-metallization dielectric 210 to uncover the second S/D structures 224 and the replacement silicide (or the second substitute silicide layers) 264 while the bottom of the via-to-rail opening 266 can stop at the first dielectric cap 206 of the buried power rails 204. For example, the second interconnect trench 267a can uncover the second S/D structure 224a and the second substitute silicide layer 264, and the bottom of the via-to-rail opening 266 can stop at the first dielectric cap 206b of the buried power rail 204b. In an embodiment, an upper (or second) interconnect structure can be merged with a lower (or first) interconnect structure to function as an output terminal of an inverter. Accordingly, an interconnect trench to form the upper interconnect structure of the upper device can terminate at a top surface of a second dielectric cap covering a corresponding lower replacement interconnect structure (or first substitute interconnect structure) of the lower interconnect structure. For example, the second interconnect trench 267c can stop at a top surface of the second dielectric cap 220c that covers the first substitute interconnect structure 262c.

Figure 23:
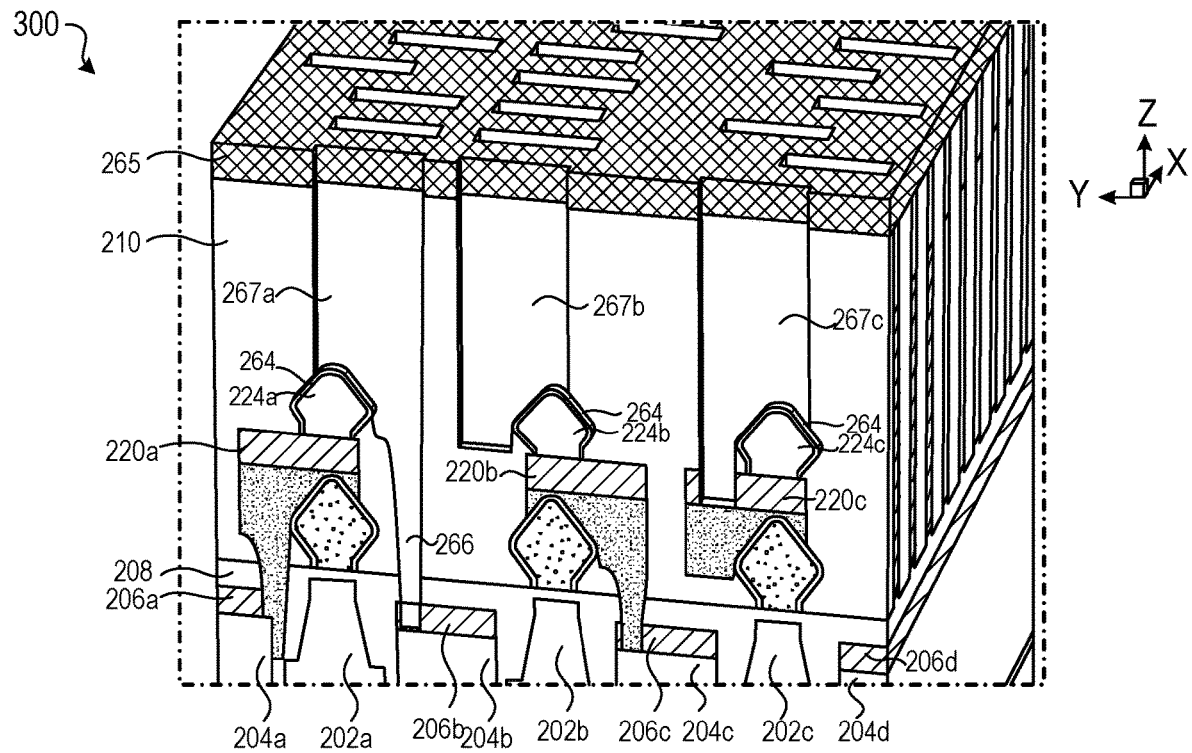

In FIG. 23, the dielectric caps (e.g., the first dielectric caps) 206 overtop the buried power rails 204 can be opened. In addition, the second dielectric cap 220c, covering the lower replacement interconnect (e.g., the first substitute interconnect structure) 262c can also be opened. The second dielectric cap 220c is opened in order to form a merged NMOS/PMOS interconnect structure. The replacement silicide (e.g., the second substitute silicide layers) 264 can be used to protect the source and drain epitaxy (e.g., the second S/D structures) 224 from any damage during the etch considering that etch chemistries used for anisotropic etching of the first dielectric caps and the second dielectric caps are common to what is commonly used for etching silicon.

Figure 24:
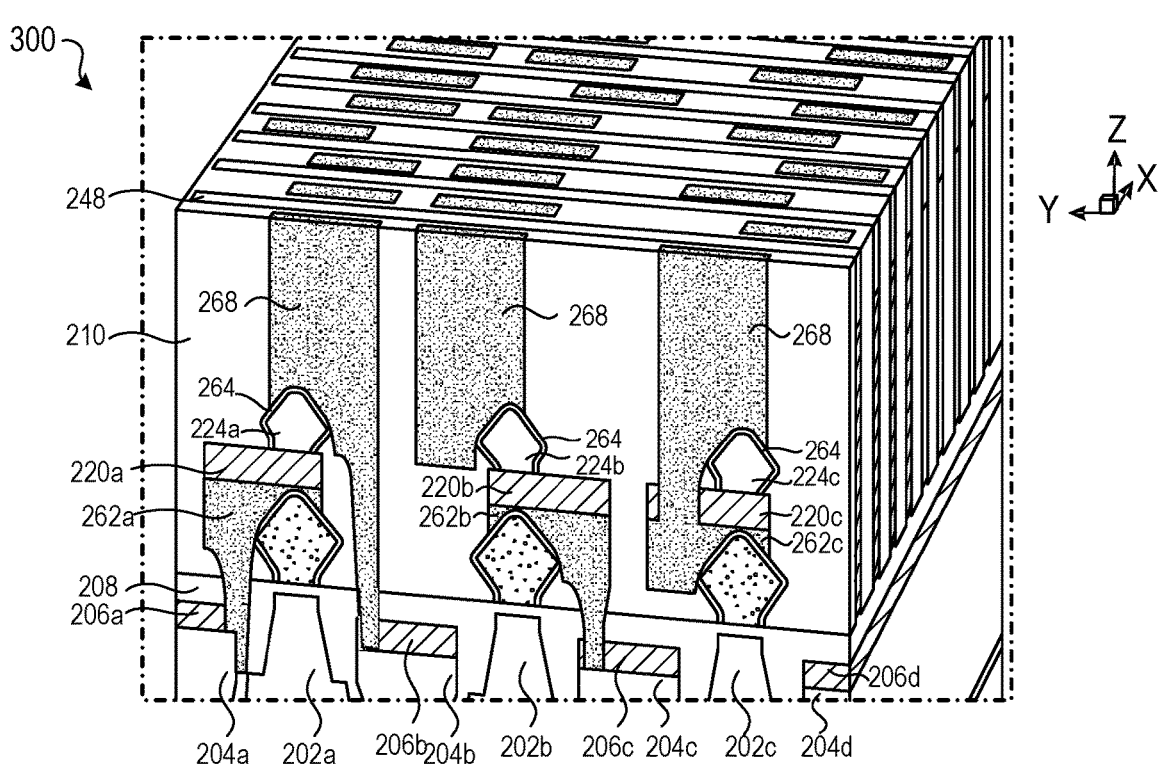

In FIG. 24, the second interconnect trenches 267 and via-to-rail opening 266 are then filled with the replacement interconnect material 268, which can be polysilicon or amorphous silicon in an embodiment of FIG. 24. The replacement interconnect material 268 can either be conformally filled and CMP planarized by utilizing the nitride cap (e.g., cap layer 248) over the dummy gate as an effective etch-stop layer (ESL), or the material can be conformally "super-filled" in which the overburden of the film is of adequate uniformity to allow an isotropic etch-back recess to be done, or the material can be bottom-filled with CVD tools from Tokyo Electron.

Figure 25:
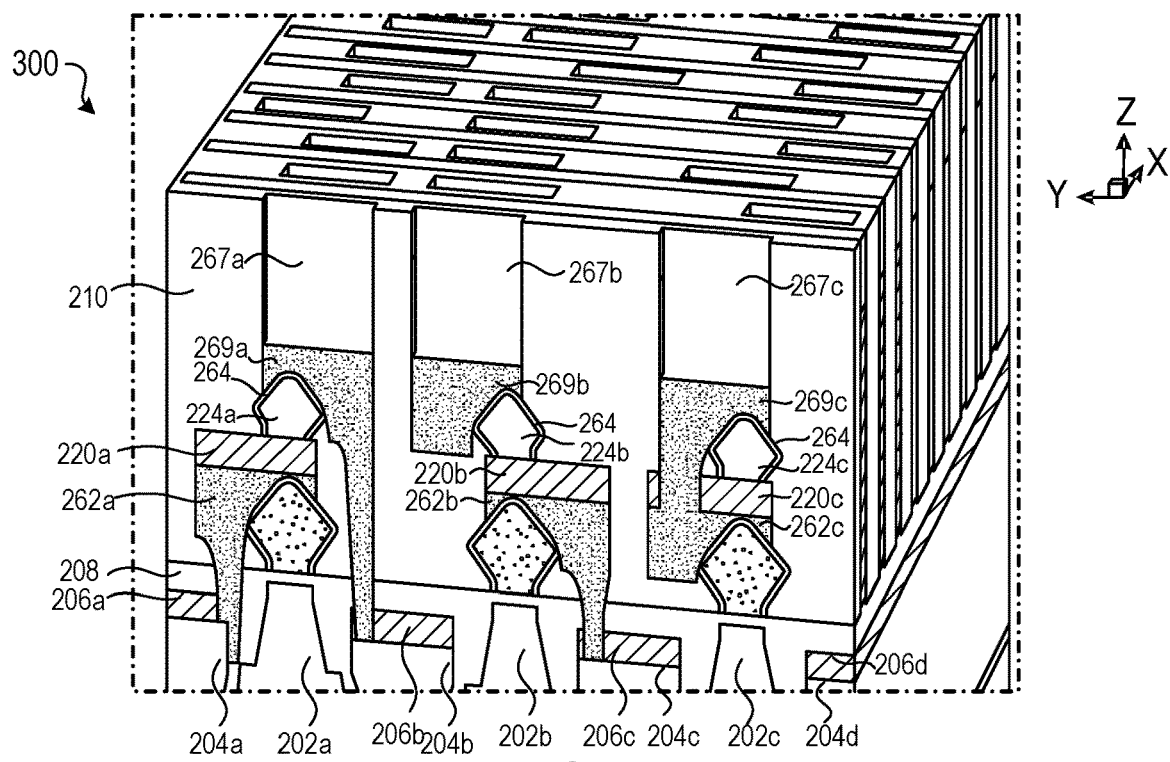

In FIG. 25, the replacement interconnect material 268 is then isotropically etch-recessed back to form a plurality of second substitute interconnect structures 269a-269c with a desired height. When the replacement interconnect material 268 is recessed, the second interconnect trenches 267a-267c are uncovered accordingly. When the replacement interconnect material 268 are polysilicon or amorphous silicon, multiple etch hardware and chemistries can be used for this process with excellent selectivity to the pre-metallization dielectric 210, the low-k gate spacer 240, and the intended replacement silicide material (e.g., 250 or 264).

Figure 26:
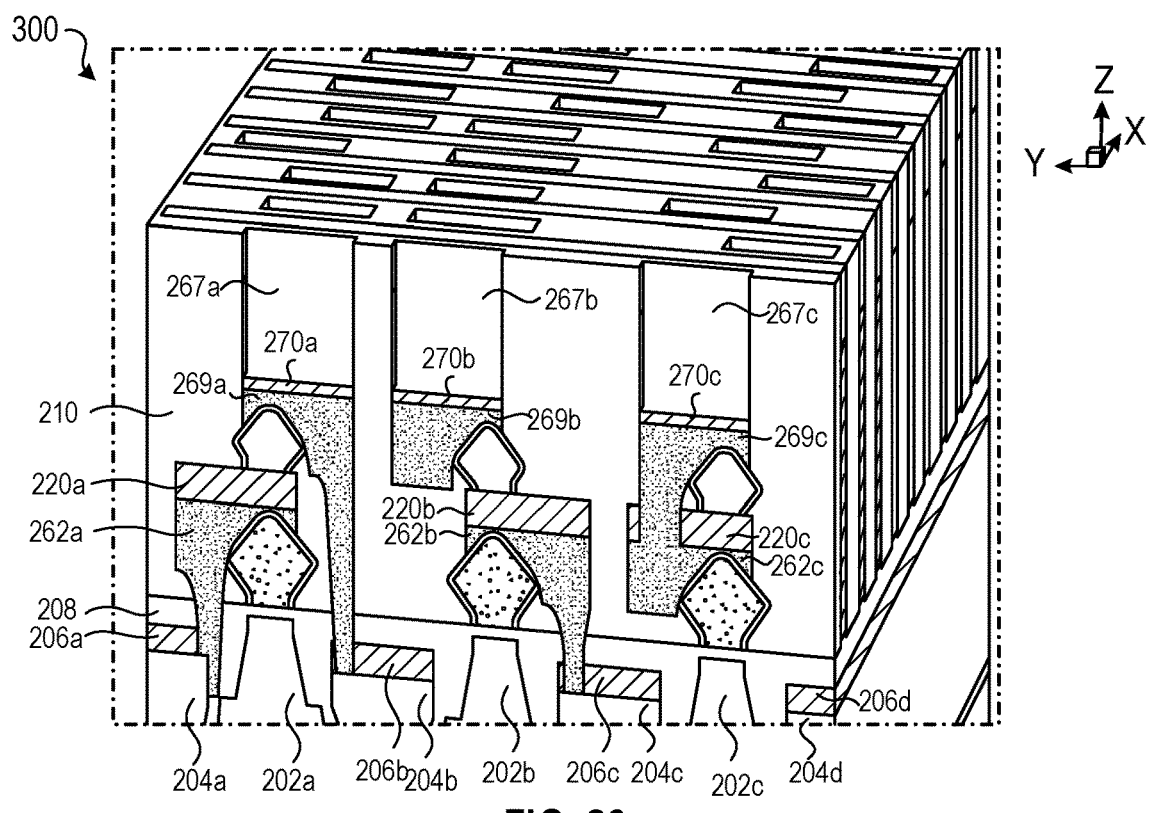

In FIG. 26, a plurality of third dielectric caps 270a-270c are formed over the top surfaces of the replacement interconnect structures (or second substitute interconnect structures) 269a-269c. It should be noted that the second substitute interconnect structure 269c is merged with the first substitute interconnect structure 262c to function as an output terminal of an inverter.

Figure 27:
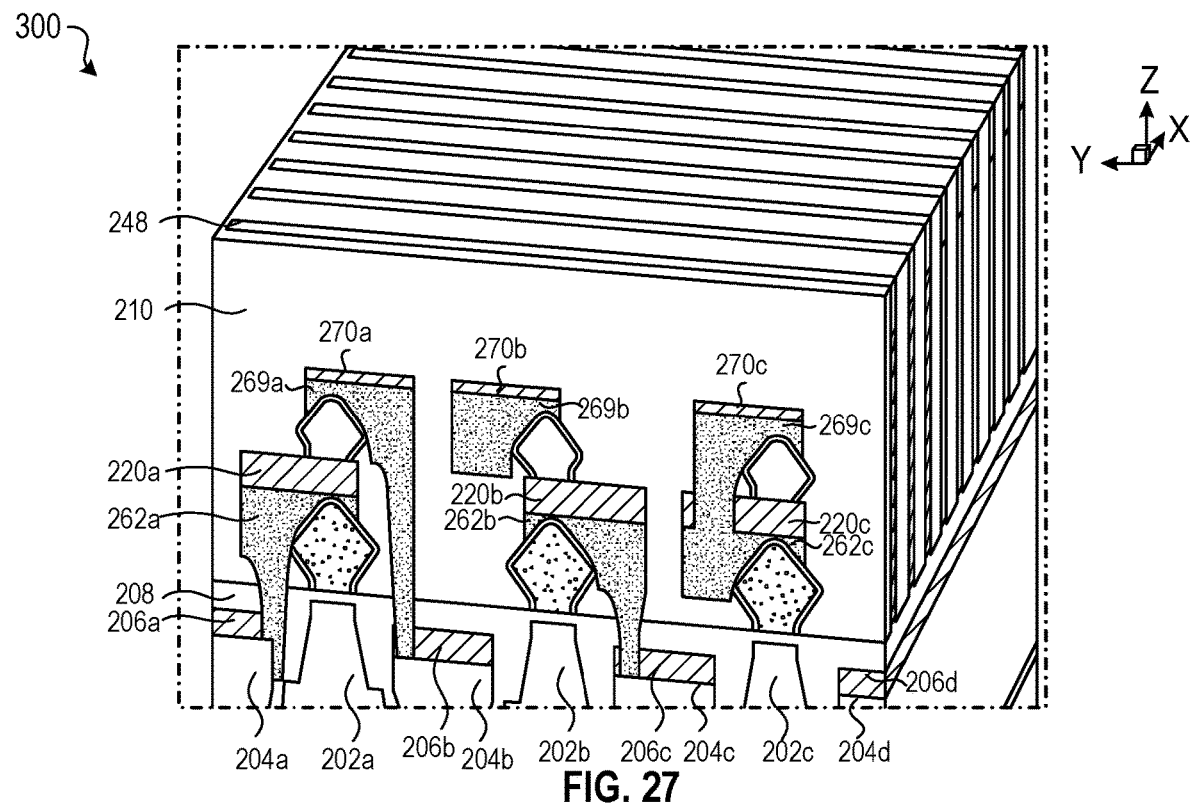

In FIG. 27, the pre-metallization dielectric 210, such as silicon oxide, is deposited within the source and drain plane (e.g. Y-Z plane) to fill in the second interconnect trenches 267. Final interconnect structures for the bottom and upper devices can be eventually formed within the pre-metallization dielectric 210 in subsequent manufacturing steps.

Figure 28:
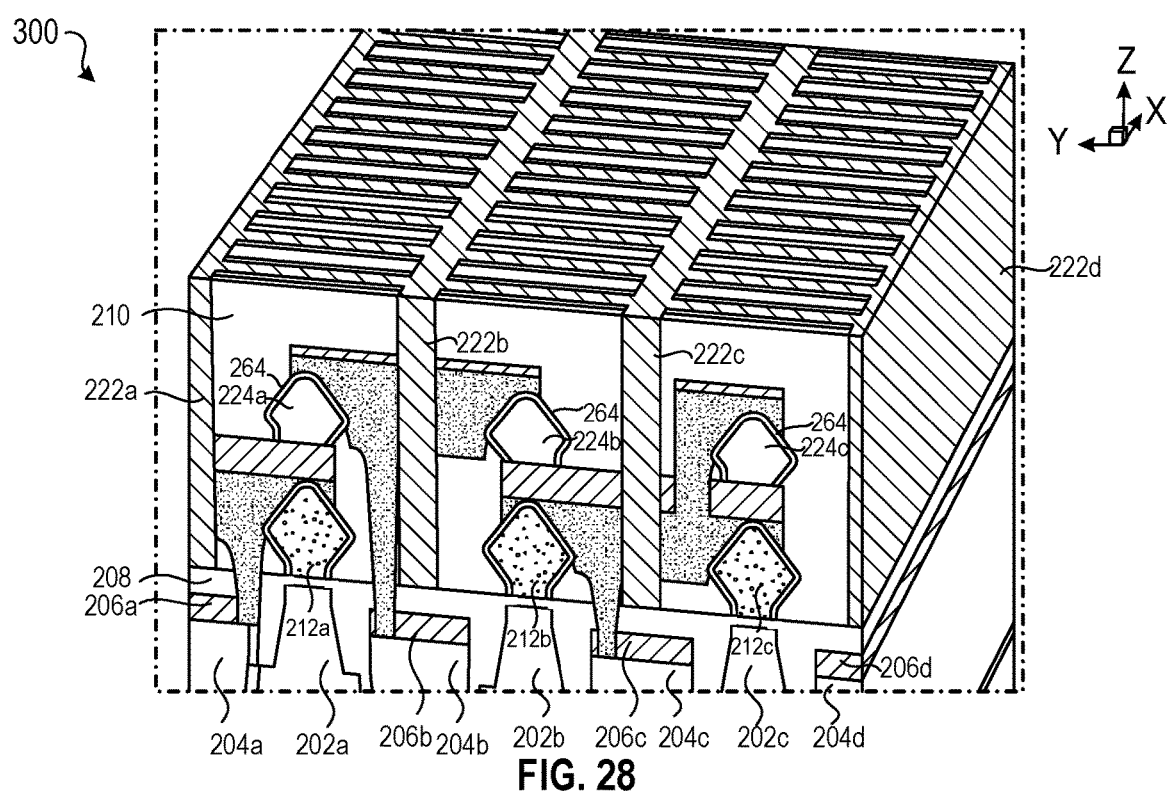

In FIG. 28, the dummy gates can be replaced with metal gates (not shown in the cross-sectional plane of FIG. 28) and a plurality of separation structures 222a-222d can be disposed in the first ILD 210. The separation structures 222 can be positioned on the insulating layer 208 and extend along the X-direction. The separation structures 222 can be configured to separate the first S/D structures 212 and the second S/D structures 224 into a plurality of pairs. For example, the first S/D structure 212a and the second S/D structure 224a can be positioned between the separation structures 222a and 222b. The first S/D structure 212b and the second S/D structure 224b can be positioned between the separation structures 222b and 222c.

The formation of the metal gate can include one or more high temperature thermal processes applied to the semiconductor structure 300. The formation of the metal gate can include opening the dummy gate structure, pulling the polysilicon or amorphous silicon, removing the protective thermal or chemical oxide liner protecting the channel material, deposition or formation of an interface layer such as a thermal oxide or chemical oxide over the intended channel material(s), deposition of a high-k dielectric film such as HfO or varieties of HfO coupled with dipole forming layers such as LaO and AlO over the interface layer material that covers the channel material(s), capping the high-k dielectric with a conductive barrier material such as TiN, performing a high-k reliability or drive anneal to reduce the formation of charge traps (such reliability anneals are typically done within a range of 700° C. to 750° C.), performing laser spike anneal (LSA) in order to activate the dopants within the source and drain area (such anneals are done within a range of 800° C. to 1250° C. with durations ranging from sub-millisecond to full second), continuation of the replacement metal gate (RMG) process in which NMOS and PMOS work function metals are deposited, etched-tuned to set various threshold voltages, and then filled with a high conductance metal.

Figure 29:
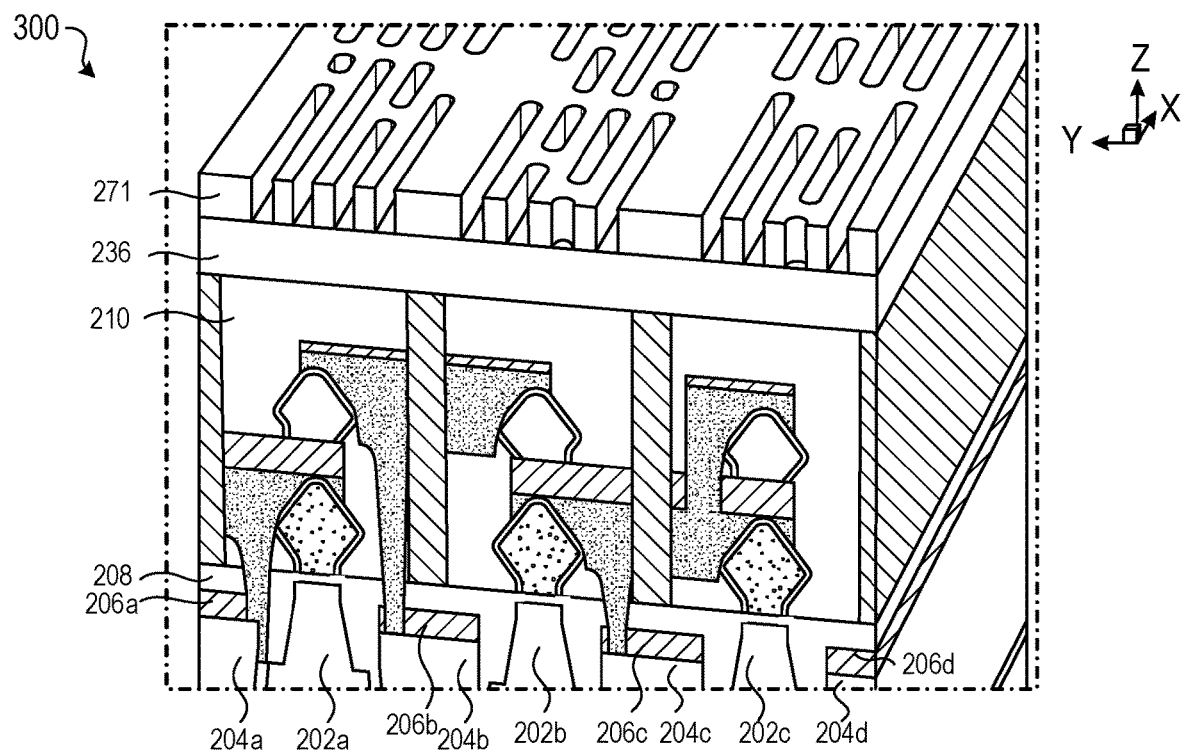

In FIG. 29, a second ILD 236 can be formed over the first ILD 210, and a hardmask 271 can be formed over the second ILD 236. The hardmask 271 can be patterned with the combined patterns of the intended M0 track structures (e.g., metal line trenches) as well as M0 extensions (e.g., via openings) which can provide access to all of the individual replacement interconnect structures (e.g., the first and second substitute interconnect structures) and replacement silicide structures (e.g., the first and second substitute silicide layers). The combined patterns also include the intended via-to-drain structures (or via-to-drain openings) electrically connecting interconnects to M0 tracks (or M0 metal line trenches) in addition to the via structures (or via openings) that provide access to the interconnects which have no electrical connection to the M0 tracks.

Figure 30:
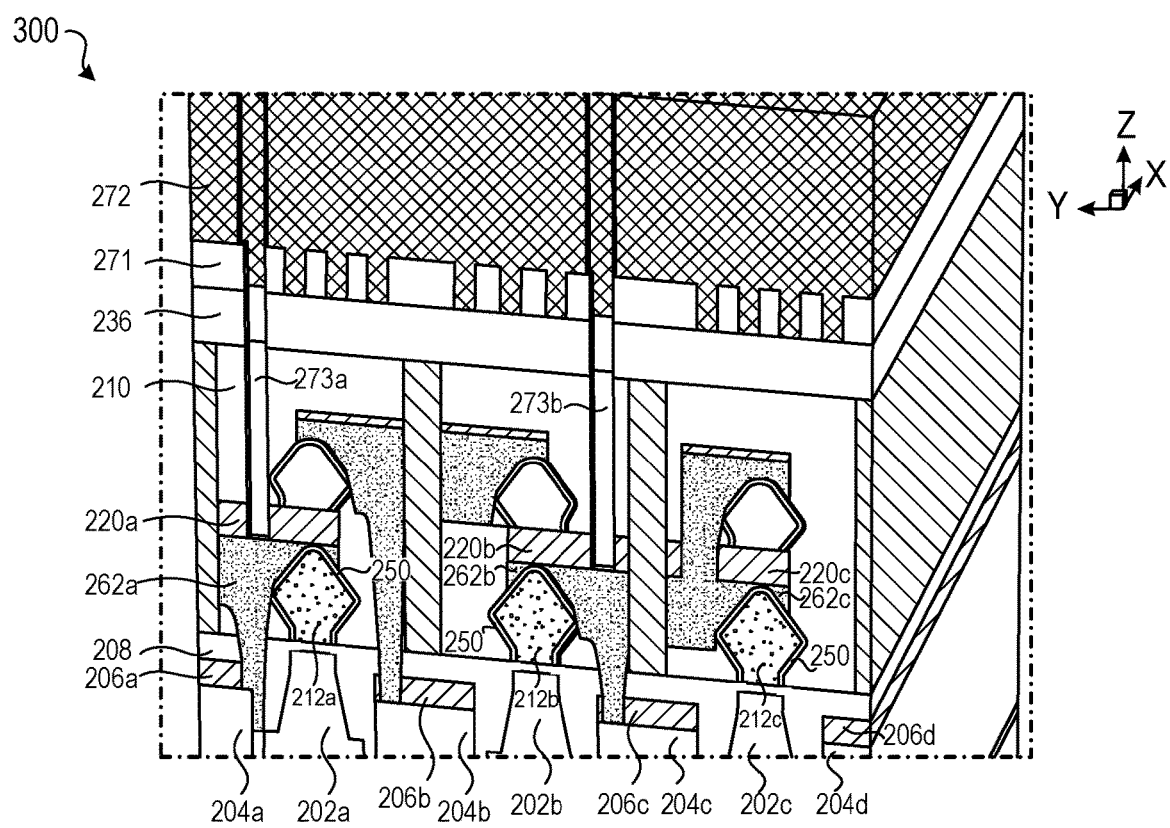

In FIG. 30, first via-to-drain structures (or via-to-drain openings) 273a-273b can be patterned through a self-aligned method in which a pattern to form the first via-to-drain structures 273a-273b can be captured within a film 272. The film 272 can be positioned over the patterned memorization film (or hardmask) 271 that contains the M0 track structures and M0 extensions. The first via-to-drain structures 273a-273b can be etched through the pre-metallization dielectric 210, and the metal oxide caps (e.g., the second dielectric caps) 220 overtop of the replacement interconnects (e.g., the first substitute interconnect structures) 262 are anisotropically opened to provide access to the replacement interconnect (e.g., the first substitute interconnect structures) 262 and replacement silicide materials (e.g., the first substitute silicide layers) 250.

Figure 31:
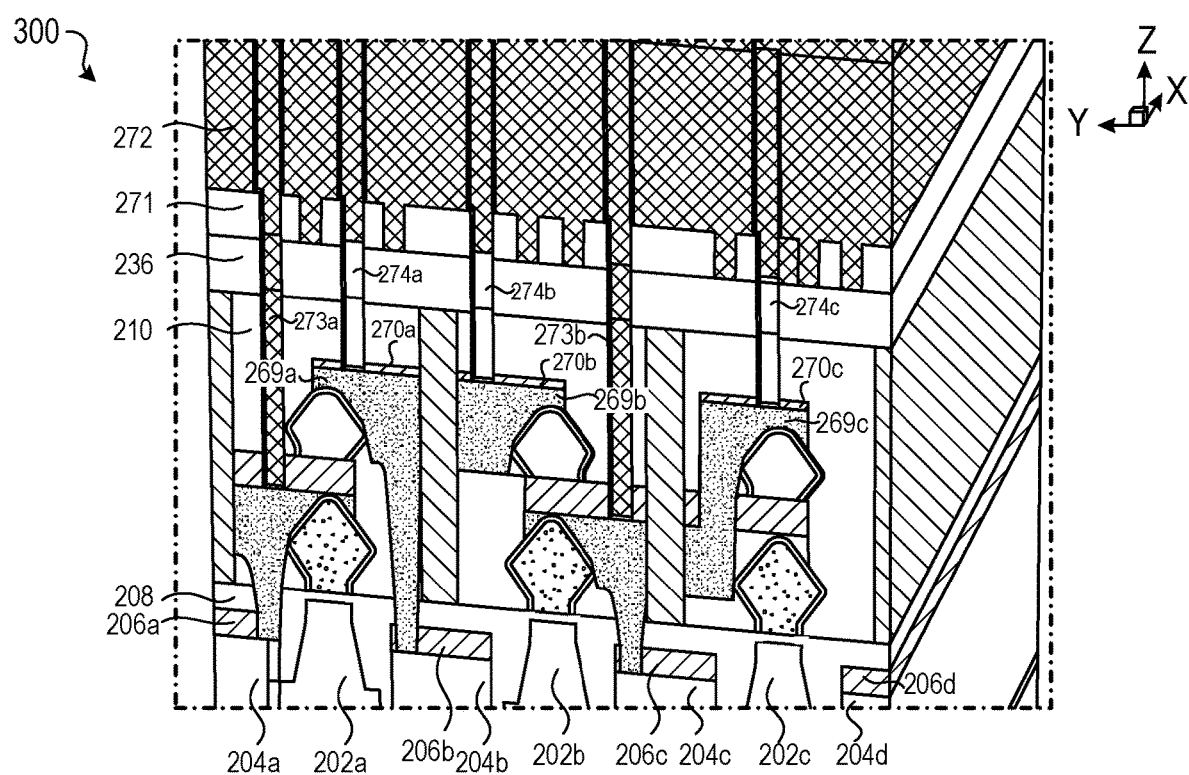

In FIG. 31, given that the number of via-to-drain structures is not extensive, and given the need to initially open every one of the replacement interconnects and replacement silicide materials, in some flows the via patterning can be executed in a litho-etch-litho-etch scheme (LELE). As shown in FIG. 31, the LELE can include filling the first via-to-drain structures 273a-273b with resist layer, and forming another pattern in the film 272 to form the second via-to-drain structures (or via-to-drain openings) 274a-274b. The second via-to-drain structures 274a-274b can be formed by transfer the other pattern in the film 272 into the pre-metallization dielectric 210 by an etching process. The etching process can further open the third dielectric caps 270 to expose the second substitute interconnect structures 269.

Figure 32:
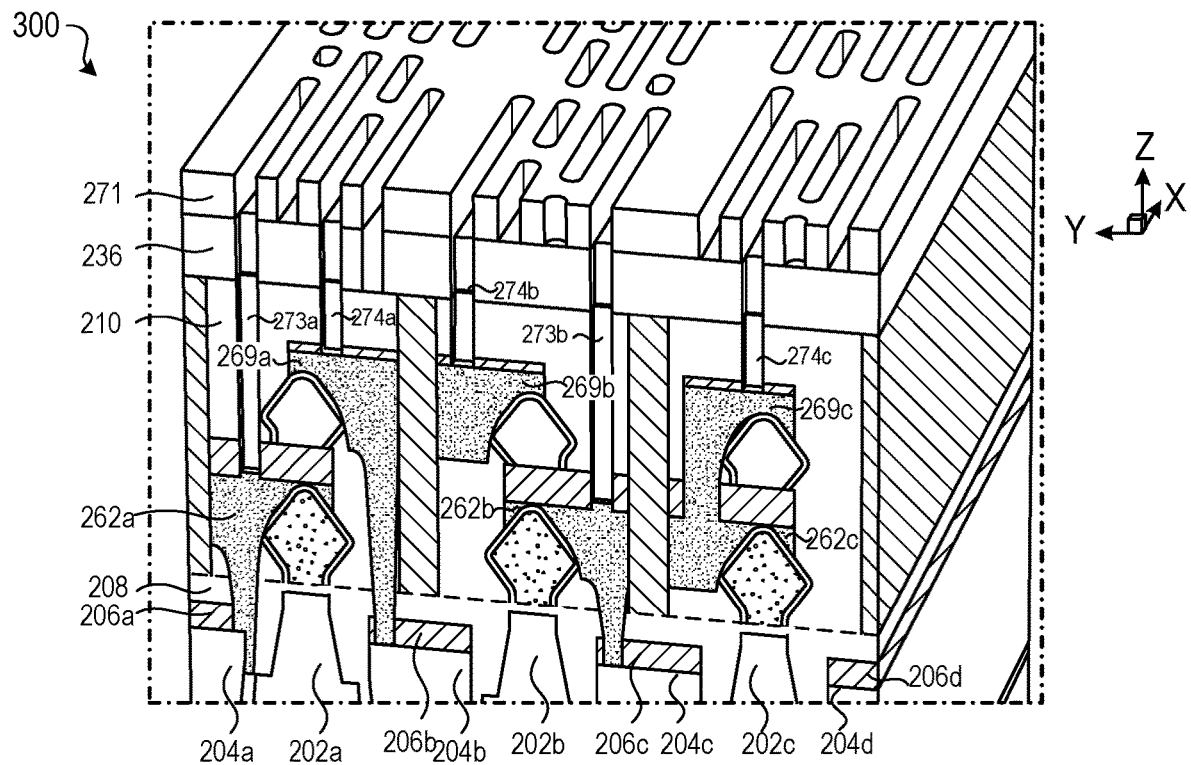

In FIG. 32, the filling pattern material (e.g., the film 272) can be isotropically removed by a simple ash step to reveal the opened replacement interconnect (e.g., the first and second substitute interconnect structures) and replacement silicide materials (e.g., the first and second substitute silicide layers). As shown in FIG. 32, the first via-to-drain structures 273 can open the first substitute interconnect structures and the first substitute silicide layers. The second via-to-drain structures 274 can open the second substitute interconnect structures and the second substitute silicide layers.

Figure 33:
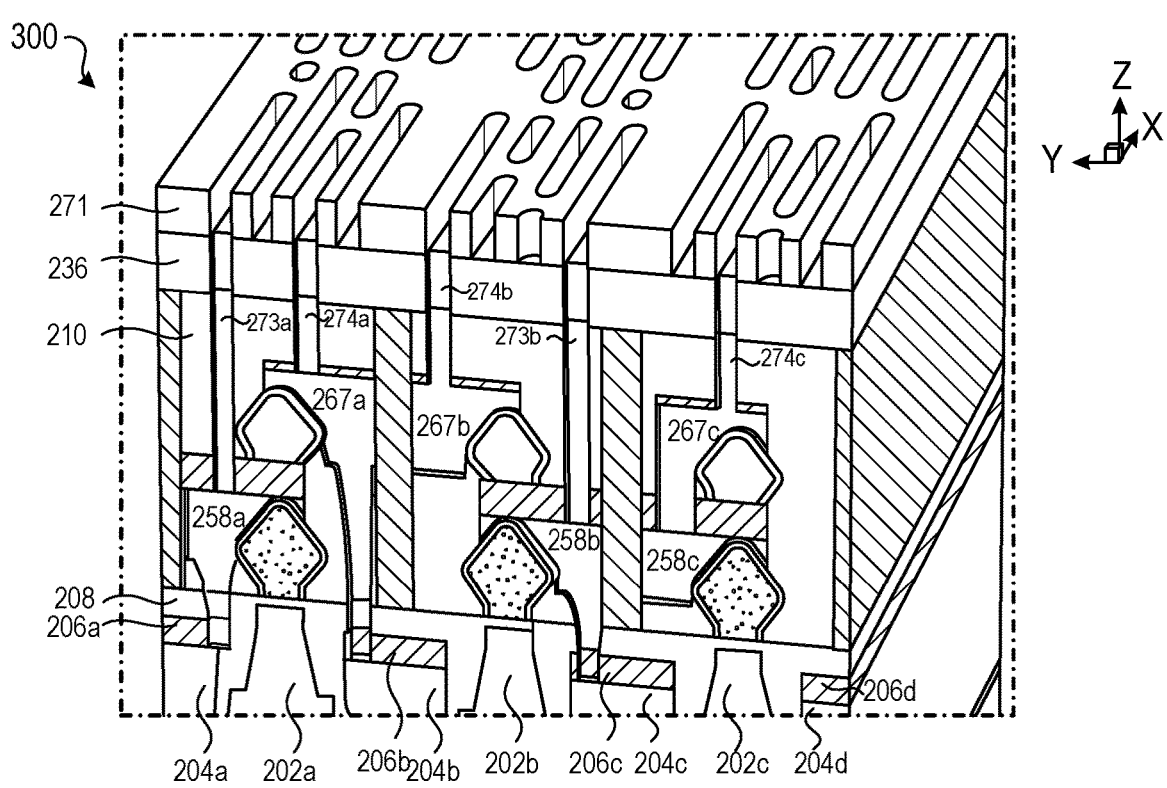

In FIG. 33, the replacement interconnect materials (e.g., the first and second substitute interconnect structures) which would be polysilicon or amorphous silicon in an exemplary embodiment can be isotropically etched with either a vapor-phase etch such as Tokyo Electron CERTAS, or by a wet etch, or a direct or a remote plasma isotropic etch. The presence of the replacement silicide material (e.g., the first and second substitute silicide layers) prevents the etching or any damage to the source and drain contacts during the removal of the replacement interconnect materials. The benefit of incorporating a CERTAS-type etch in current disclosure is that very good etch selectivity can be achieved between the poly/amorphous silicon and the ruthenium (Ru) that is the metal used for the buried power rails 204. Typically both materials (e.g., the poly/amorphous silicon and the Ru) are etched using similar etch chemistries, but the incorporation of CERTAS etch can provide good selectivity between metals and silicon. When the etch is completed, the first and the second interconnect structures are removed. As shown in FIG. 33, when the replacement interconnect materials are removed, the first interconnect trenches 258 and the second interconnect trenches 267 are uncovered.

Figure 34:
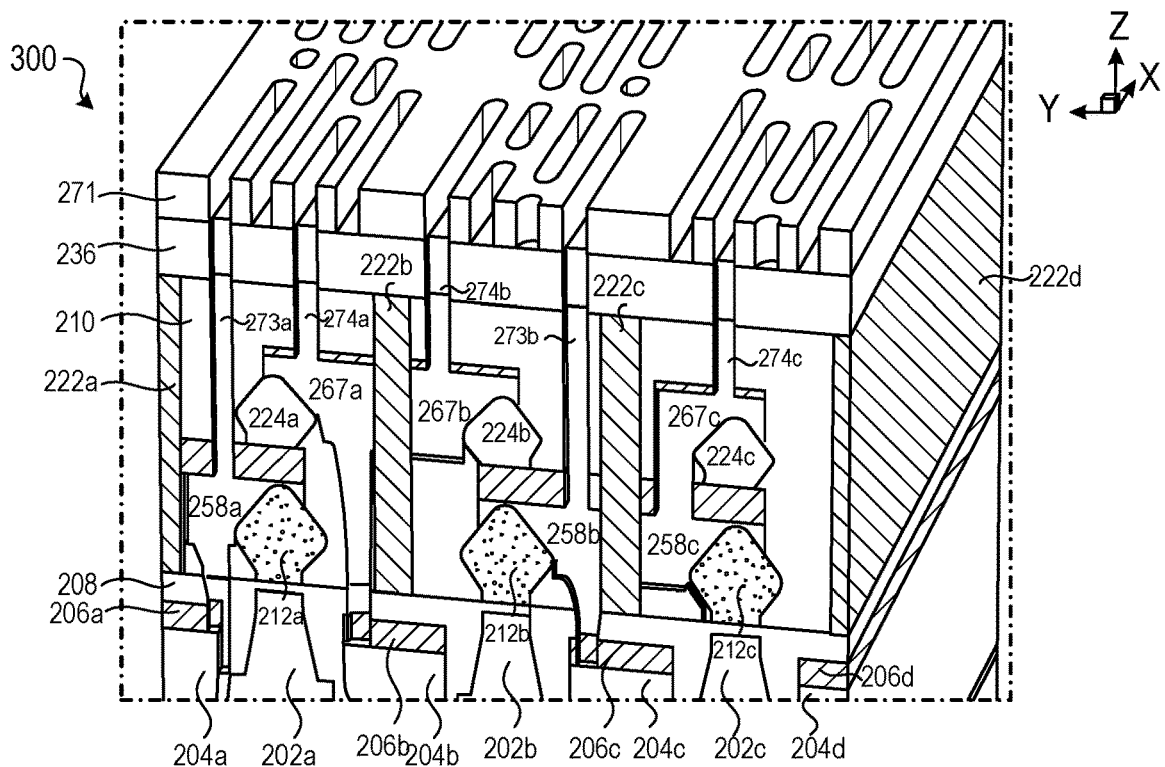

In FIG. 34, once the replacement interconnect material is removed from the actual interconnect structures, the etch chemistry can then be changed to selectively and isotropically remove the replacement silicide material (e.g., the first and second substitute silicide layers) selective to the other dielectric materials present within the semiconductor structure 300. These materials can include pre-metallization dielectric 210 such as silicon oxide, capping materials (e.g., the second and third dielectric caps) such as aluminum oxide which can exist as the ceiling of the interconnect structures, and the low-k gate spacer 240 such as SiOC. Once the selective etch is completed, the first and second substitute silicide layers are removed from the first S/D structures 212 and the second S/D structures 224 respectively.

Figure 35:
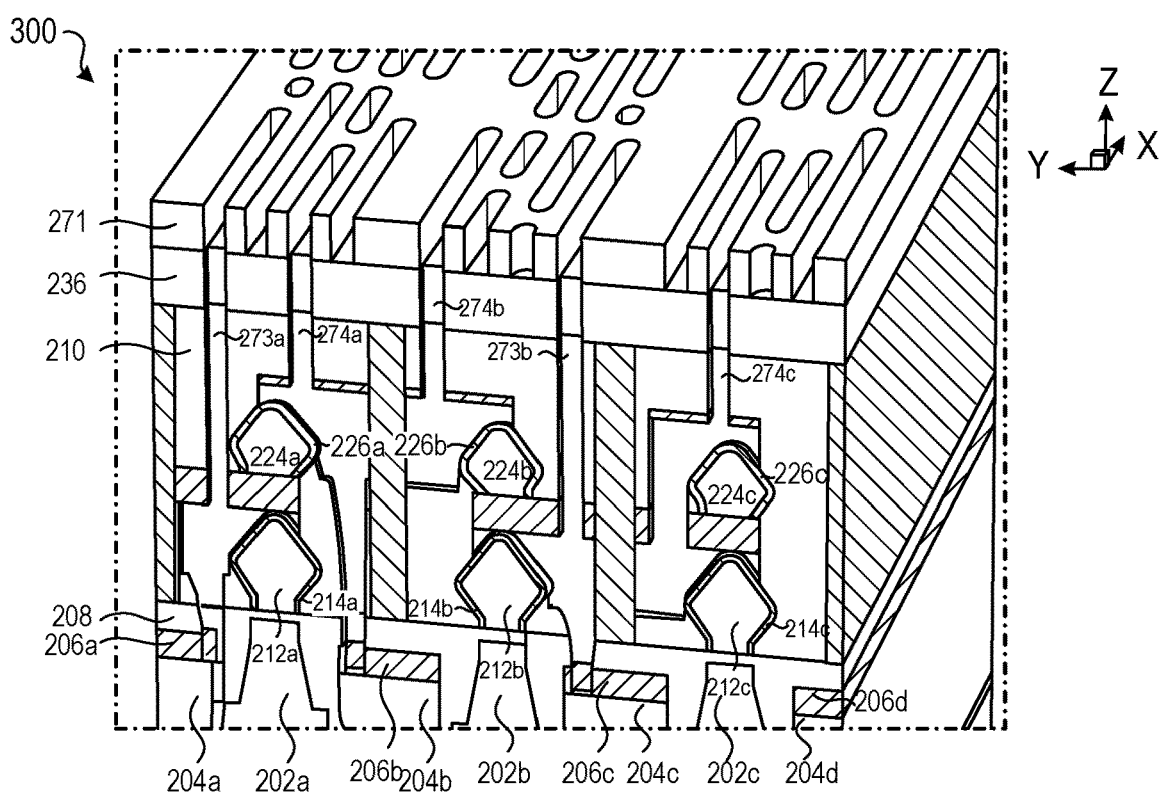

In FIG. 35, a silicon pre-clean be done on the surface of the source and drain epitaxy (e.g., the first S/D structures 212 and the second S/D structures 224) by using a low-temperature COR (chemical oxide removal) etch process produced by Tokyo Electron. Optionally, the etching of the replacement silicide can be done in-situ with the deposition and formation of the actual silicide material. It is understood that in an exemplary embodiment of FIG. 35, a common silicide material is used for both upper and lower devices. For cases where different silicide material is desired in the upper (or NMOS) and lower (or PMOS) devices, the deposition process can be executed sequentially where the first via-to-drain patterning (e.g., the via-to-drain structures) 273 can be used to open the first substitute interconnect structures, the replacement interconnect material and the replacement silicide material can be removed only from the first S/D structures, a first silicide material is deposited on the first S/D structures, and then the trenches and the via-to drain structures can be filled with a material such as spin-on-carbon. The process can be repeated for the complementary devices (e.g., the upper devices) to deposit a second silicide material on the second S/D structures. In an exemplary embodiment of FIG. 35, the silicide material can be completed via a self-aligned silicide process in which a metal such as Ti for NMOS devices (or the upper devices) and Ru for PMOS devices (or lower devices) can be deposited through ALD or CVD method, and the unreacted silicide can be removed in a wet etch process.

Figure 36:
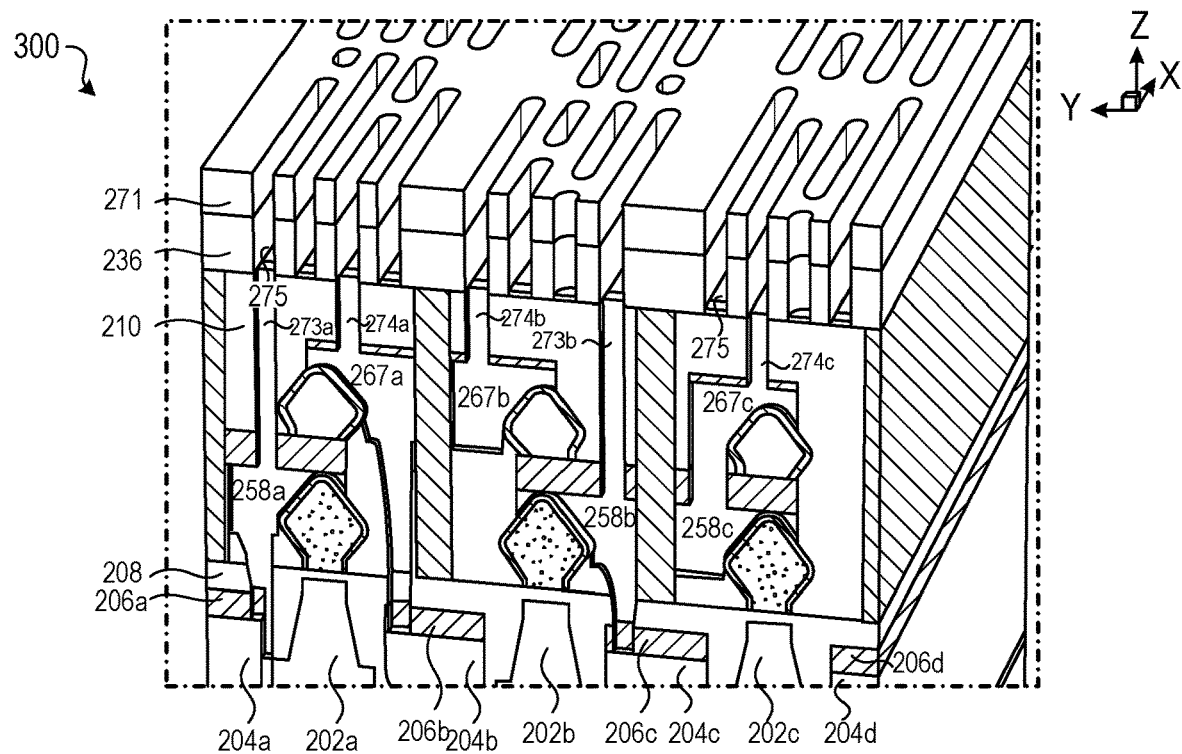

In FIG. 36, an etch process can be performed to transfer the M0 track structures and the M0 extensions in the hardmask 271 into the low-k dielectric film (e.g., the second ILD) 236 to form a plurality of M0 trenches 275.

Figure 37:
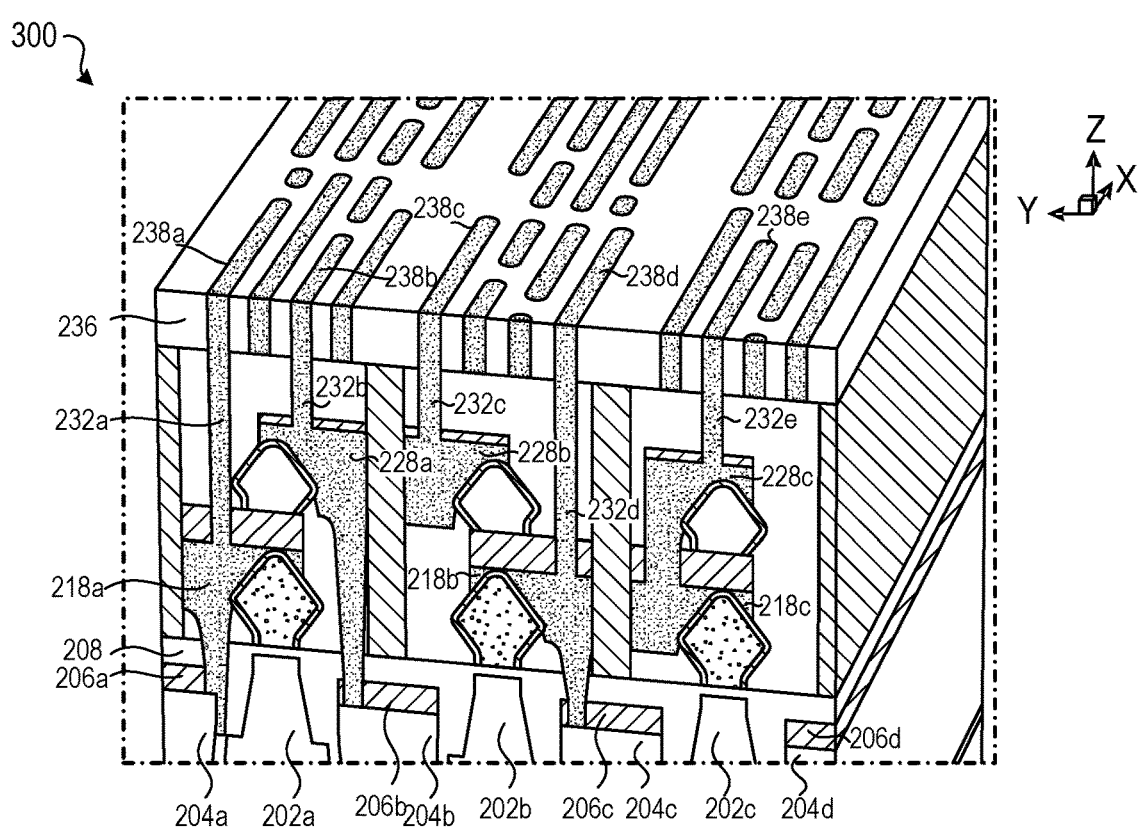

In FIG. 37, the first interconnect trenches 258, the second interconnect trenches 267, the M0 trenches 275, the first via-to-drain structures 273 and the second via-to-drain structures 274 that are shown in FIG. 36 can be metallized at the same time. In some embodiments, the via-to-gate structures (not shown) that are positioned over the channel structures can also be metallized together. The metallization process can include filling the first interconnect trenches 258, the second interconnect trenches 267, the M0 trenches 275, and the first via-to-drain structures 273 and the second via-to-drain structures 274 with a high conductive metal, such as Ru. The metallization process can provide some cost benefit to the CFET devices in that interconnect structures of both devices (e.g., the upper and lower devices) can be metallized at the end as opposed to forming the interconnect structures separately for the upper and lower devices. As shown in FIG. 37, once the metallization process is completed, first local interconnect structures (or first interconnect structures) 218 can be formed in the first interconnect trenches 258, second local interconnect structures (or second interconnect structures) 228 can be formed in the second interconnect trenches 267, Vias 232 can be formed in the first via-to-drain structures 273 and the second via-to-drain structures 274, and the metal lines 238 can be formed in the M0 trenches 275 in the second ILD 236. Further, an ash process or an etch process can be applied to remove the hardmask 271.

Figure 38:
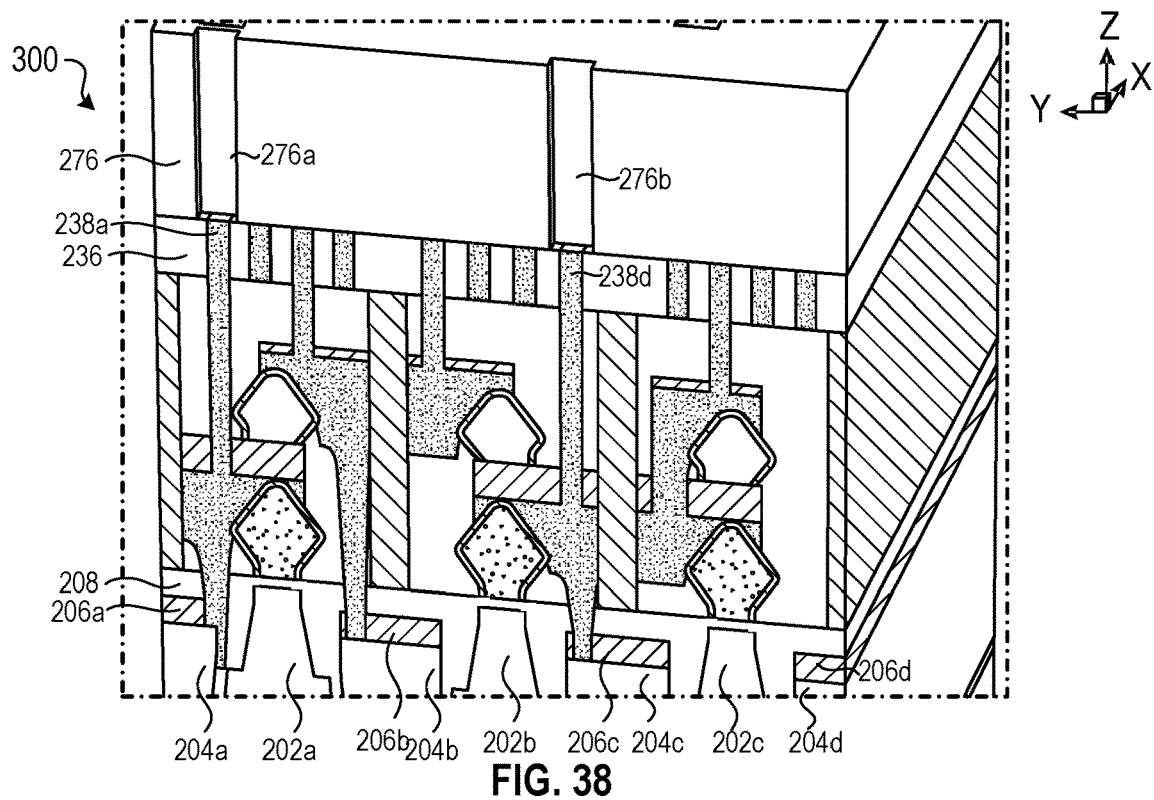

In FIG. 38, an amount of dielectric separations (or insulating layers) can be formed between the M0 tracks (or metal lines) and one or more first interconnect structures so that the one or more first interconnect structures are not electrically connected to M0 tracks. In order to form the dielectric separations, an etching process can be applied to remove portions of the metal lines, and the etching process can further extend into the Vias to remove portions of the Vias. A hardmask, such as a hardmask 276, can be deposited on the second ILD 236 to function as a mask layer for the etching process. As shown in FIG. 38, the hardmask 276 can have patterns 276a-276b to uncover the metal lines 238a and 238d respectively.

Figure 39:
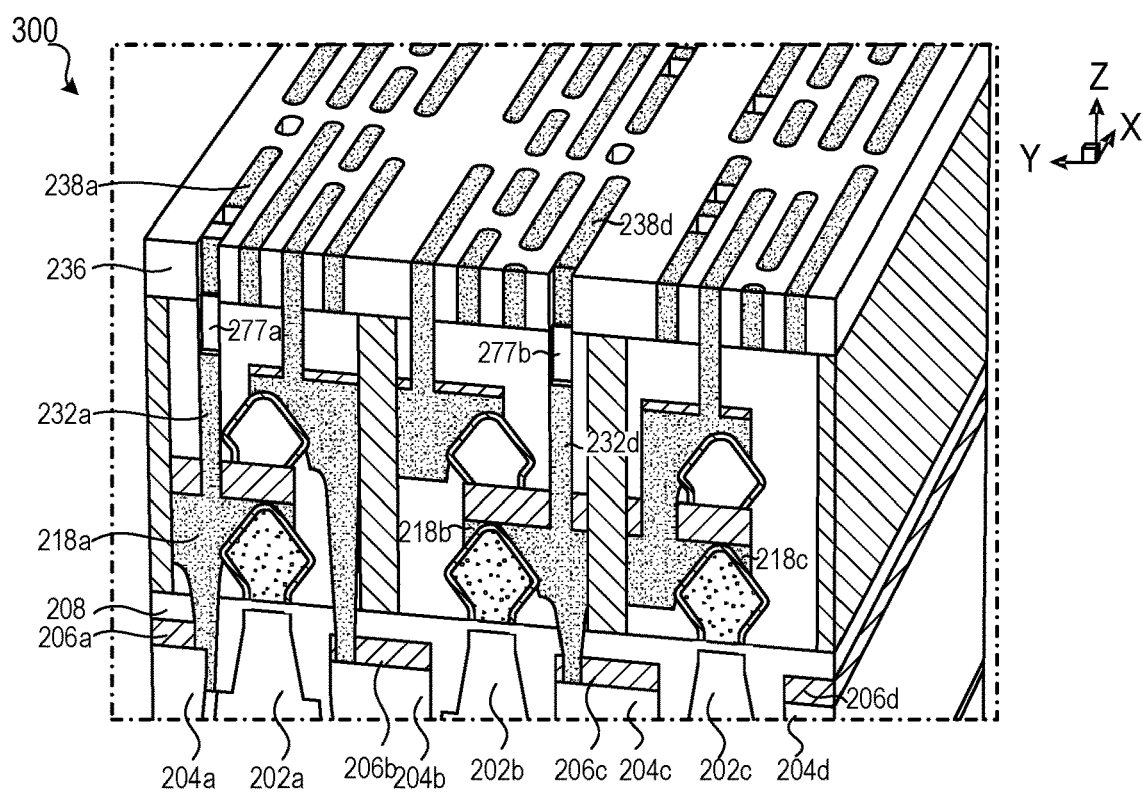

FIG. 39 shows that portions of the metal line 238a and portions of the metal line 238d are removed by the etching process. The etching process further remove a portion of the Via 232a and a portion of the Via 232d. Accordingly, a gap 277a can be positioned over the Via 232a to separate the first local interconnect structure 218a and the metal line 238a. A gap 277b can be positioned over the Via 232d to separate the first interconnect structure 218b and the metal line 238d.

Figure 40:
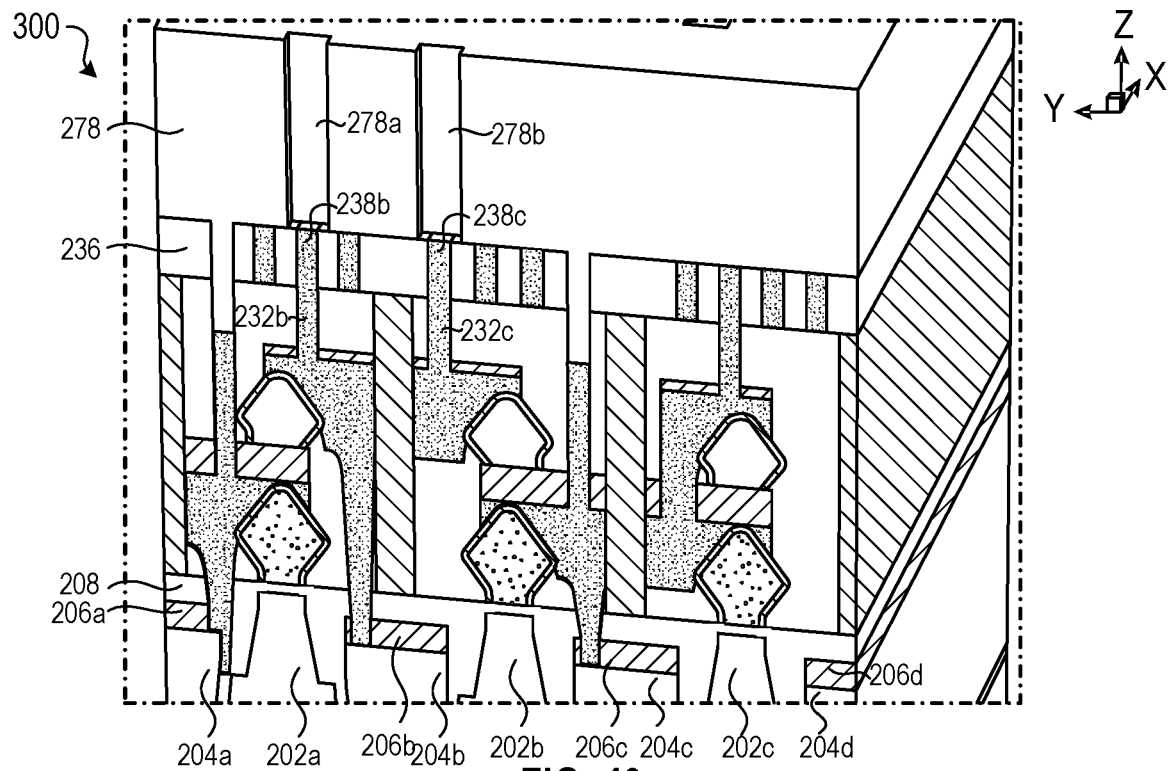
Figure 41:
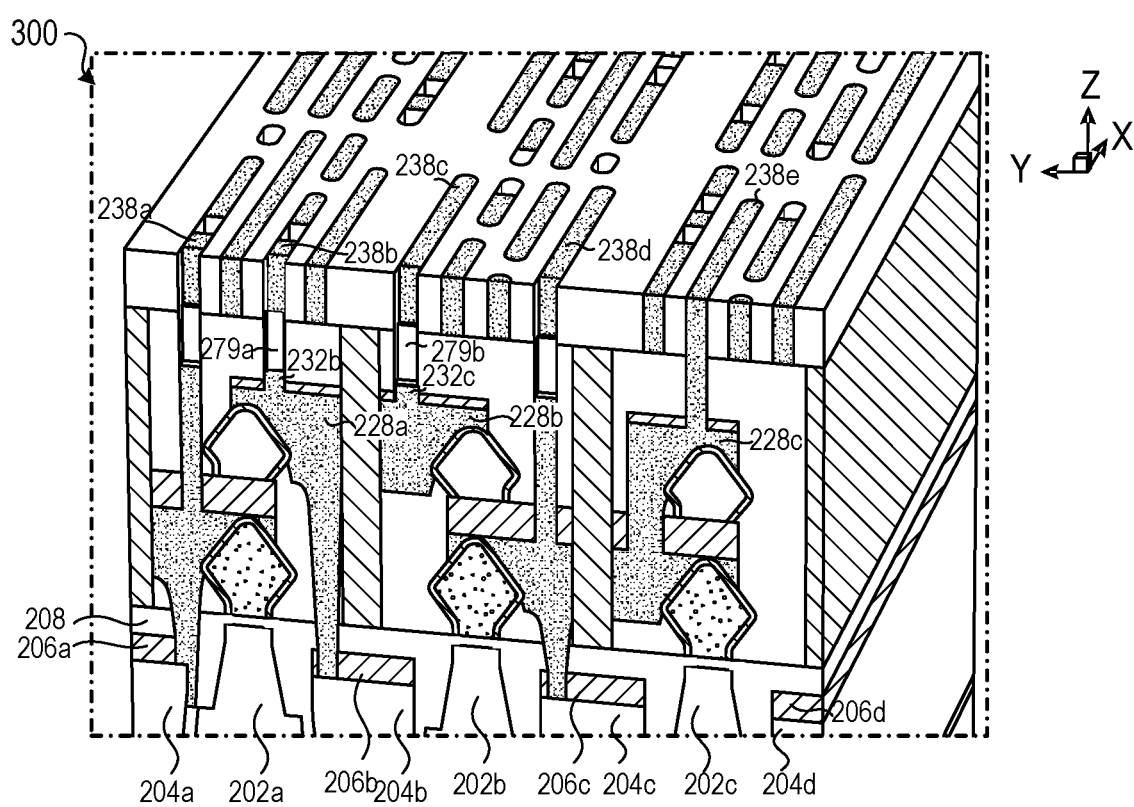

In FIG. 40, patterns 278a-278b can be formed in a hardmask 278 to repeat the process to form an amount of dielectric separations (or insulating layers) that separate one or more second interconnect structures from the metal lines. As shown in FIG. 41, the hardmask 278 can have patterns 278a-278b to uncover the metal lines 238b and 238c respectively. It should be noted that the hardmask 278 can further fill the gaps 277.

In FIG. 41, portions of the metal line 238b and portions of the metal line 238c are removed by the etching process. The etching process further remove a portion of the Via 232b and a portion of the Via 232c. Accordingly, a gap 279a can be positioned over the Via 232b to separate the second local interconnect structure 228a and the metal line 238b. A gap 279b can be positioned over the Via 232c to separate the second interconnect structure 228b and the metal line 238c. Further, the hardmask 278 that are made of spin-on-carbon can be removed by an ash process or an etching process.

Figure 42:
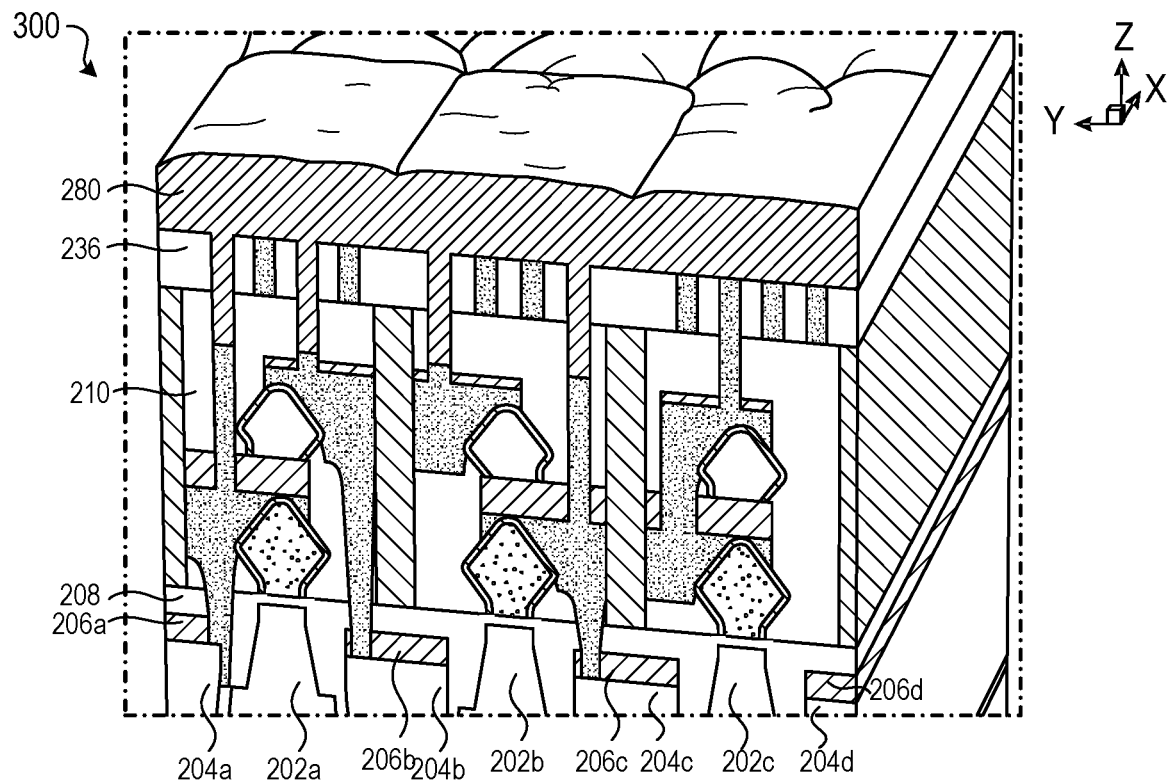

In FIG. 42, a selective deposition or a CVD filling can be applied to deposit a dielectric material 280 into the semiconductor structure 300. The dielectric material 280 can fill in the gaps (e.g, the gaps 277a-277b and 279a-279b) that are positioned in the second ILD 236 and further extend into the first ILD 210. In an exemplary embodiment of FIG. 42, the dielectric material 280 can be aluminum oxide.

Figure 43:
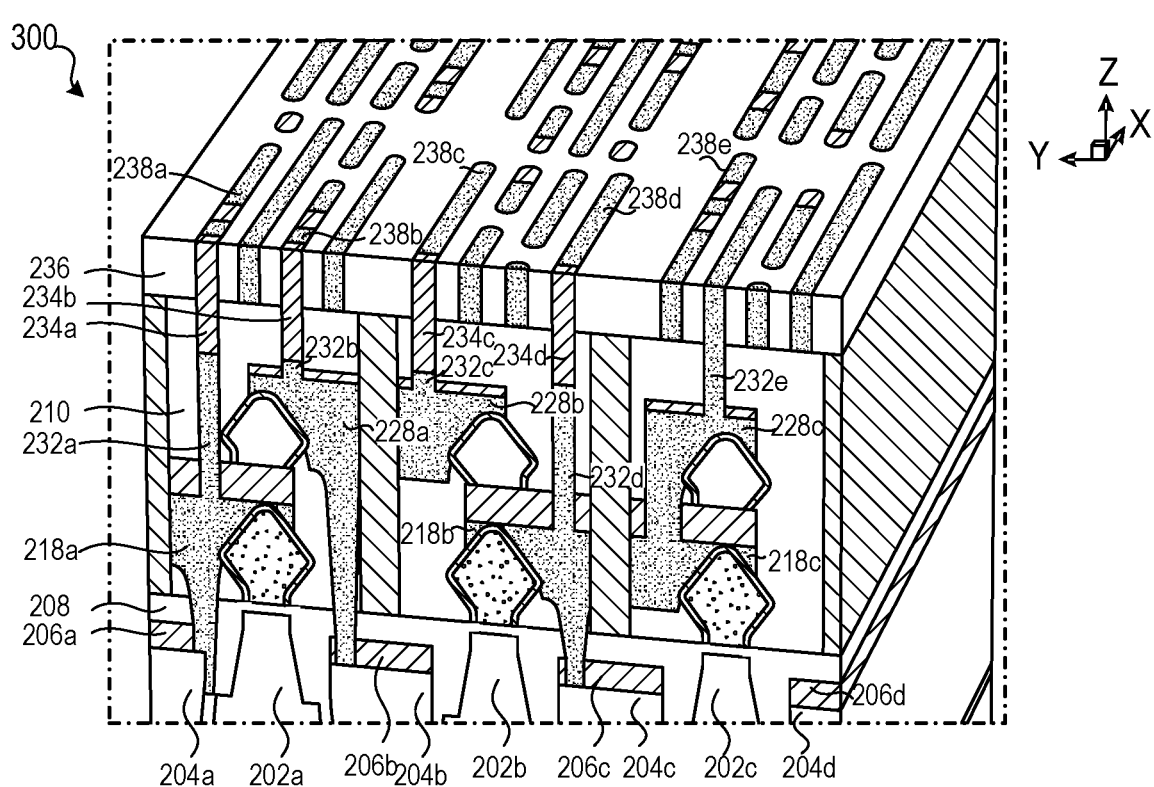

In FIG. 43, a CMP or recess etching of the dielectric material 280 can be performed. The dielectric material 280 that remains in the gaps (e.g., the gaps 277a-277b and 279a-279b) can effectively become dielectric separations (also referred to as isolation structures or insulating layers) 234a-234d to disconnect the overlying metal lines and underlying interconnect structures. For example, the dielectric separation 234a can disconnect the metal line 238a and the first local interconnect structure 218a. The dielectric separation (or isolation structure or insulating layer) 234b can disconnect the metal line 238b and the second local interconnect structure 228a.

Figure 44:
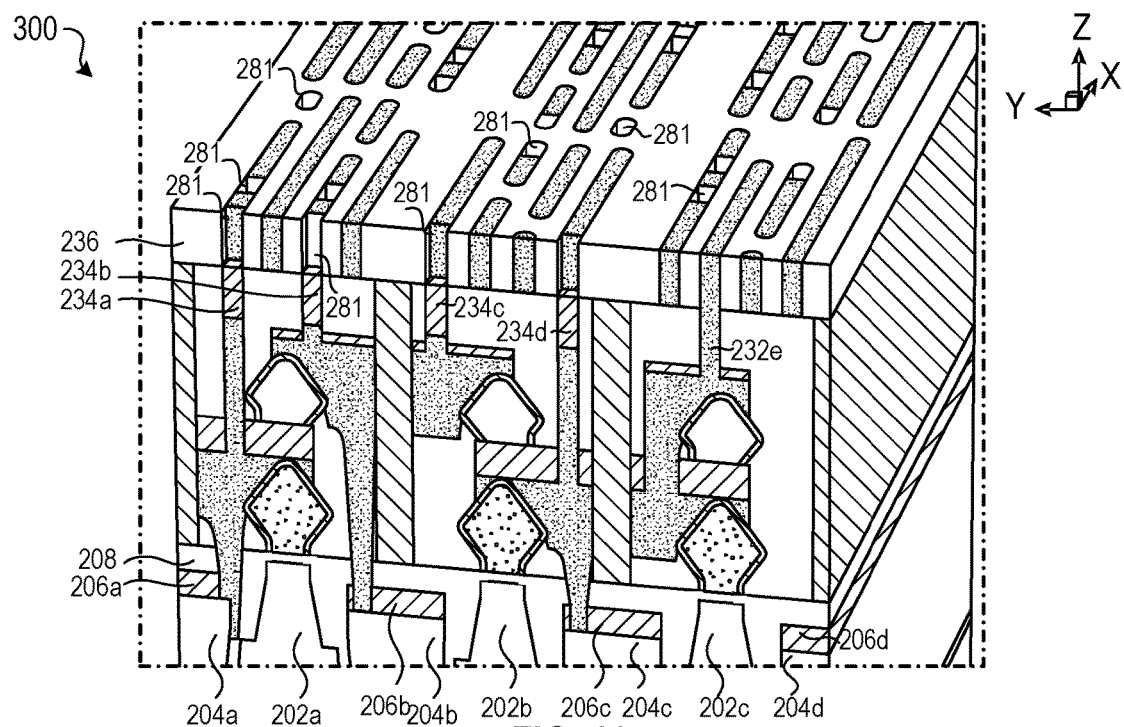

In FIG. 44, the dielectric separations (also referred to as isolation structures or insulating layers) 234 can be further recessed by an etching process to remove portions of the dielectric separations that are positioned in the second ILD 236. In some embodiments, the etching process can further remove portions of the dielectric separations 234 in the first ILD 210. Accordingly, a plurality recessed spaces can be formed over the dielectric separations and positioned in the first ILD 210. The recessed spaces can be subsequently filled with the high conductive metal that is applied in FIG. 37. The remaining dielectric separations can prevent a need for an additional "blocking" or "cutting" of the M0 pattern.

Figure 45:
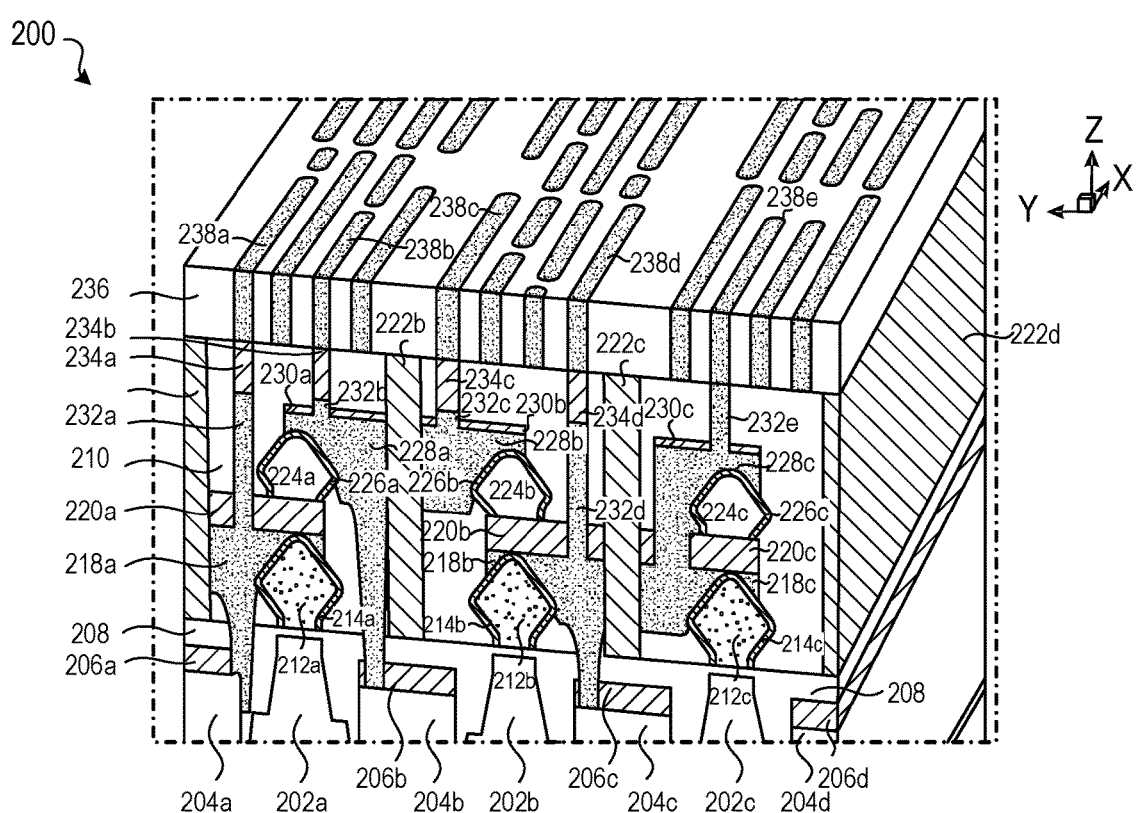

In FIG. 45, the recessed spaces can be re-filled with the high conductive metal and then CMP planarized or recess-etched back to produce a clean M0 track pattern. When the CMP or recess-etch is completed, a CFET device 200 can be formed. The CFET device 200 illustrated in FIG. 45 can have similar configurations to the CFET device 200 illustrated in FIG. 2. As shown in FIG. 45, the first silicide layers 214 and the second silicide layers 226 can be formed through a replacement process. The replacement process includes forming the first substitute silicide layers 250 and the second substitute silicide layers 264, performing a thermal processing of the substrate, replacing the first substitute silicide layers 250 with the first silicide layers 214 and replacing the second substitute silicide layers 264 with the second silicide layers 226. The replacement process thus allows performing a high temperature thermal process while the properties of the silicide layers can still be preserved.

The CFET device 200 can also have dielectric separations (or insulating layers) that positioned between the metal lines and the interconnect structures to disconnect one or more metal lines with one or more interconnect structures. Thus additional "blocking" or "cutting" of the metal line pattern are not required accordingly.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming a semiconductor device, the method comprising:
    forming a first source/drain (S/D) structure of a first field-effect transistor on a substrate, the first S/D structure being positioned at a first end of a first channel structure of the first field-effect transistor, the first channel structure being positioned over the substrate and extending along a top surface of the substrate;
    depositing a first substitute silicide layer on a surface of the first S/D structure, the first substitute silicide layer being made of a first dielectric;
    depositing a second dielectric that covers the first substitute silicide layer and the first S/D structure of the first field-effect transistor;
    forming a first interconnect opening in the second dielectric, the first interconnect opening uncovering the first substitute silicide layer;
    filling the first interconnect opening with a first substitute interconnect layer, the first substitute interconnect layer being made of a third dielectric;
    executing a thermal processing of the substrate;
    removing the first substitute interconnect layer and the first substitute silicide layer; and
    depositing a first silicide layer on the surfaces of the first S/D structure of the first field-effect transistor.

2. The method of claim 1, before the executing the thermal processing of the substrate, further comprising:
    recessing the first substitute interconnect layer in the first interconnect opening;
    forming a first dielectric cap on the first substitute interconnect layer;
    refilling the first interconnect opening with the second dielectric;
    recessing the second dielectric so as to uncover a second channel structure of a second field-effect transistor, the second channel structure being positioned over the first channel structure and separated from the first channel structure;

forming a second S/D structure of the second field-effect transistor that is positioned over the first S/D structure and separated from the first S/D structure, the second S/D structure being positioned at a first end of the second channel structure;

depositing a second substitute silicide layer on a surface of the second S/D structure, the second substitute silicide layer being made of the first dielectric;

depositing the second dielectric that covers the second substitute silicide layer and the second S/D structure;

forming a second interconnect opening in the second dielectric, the second interconnect opening uncovering the second substitute silicide layer; and forming a second substitute interconnect layer in the second interconnect opening, the second substitute interconnect layer being made of the third dielectric.

3. The method of claim 2, after the forming the second substitute interconnect layer in the second interconnect opening, further comprising:

removing a portion of the second substitute interconnect layer so that a space is formed over the second substitute interconnect layer, the space being further positioned in the second dielectric;

forming a second dielectric cap on the second substitute interconnect layer; and refilling the second dielectric in the space.

4. The method of claim 3, after the executing the thermal processing of the substrate, further comprising:

removing the second substitute interconnect layer in the second interconnect opening and the second substitute silicide layer; and depositing a second silicide layer on the surface of the second S/D structure.

5. The method of claim 4, wherein the removing the second substitute interconnect layer and the second substitute silicide layer further comprises:

forming an interlayer dielectric (ILD) over the second dielectric;

forming a patterned mask over the ILD;

performing an etching process to form a first Via opening and a second Via opening based on the patterned mask, the first Via opening and the second Via opening extending into the second dielectric and the ILD to uncover the first substitute interconnect layer and the second substitute interconnect layer respectively; and performing an etching process to remove the first substitute interconnect layer in the first interconnect opening, the first substitute silicide layer, the second substitute interconnect layer in the second interconnect opening and the second substitute silicide layer further.

6. The method of claim 5, after the depositing the first silicide layer and the second silicide layer, further comprising:

forming a first trench opening and a second trench opening in the ILD based on the patterned mask, the first trench opening being connected to the first Via opening and the second trench opening being connected to the second Via opening;

depositing a conductive material in the first trench opening, the second trench opening, the first Via opening, the second Via opening, the first interconnect opening and the second interconnect opening to form a first metal line in the first trench opening, a second metal line in the second trench opening, a first Via in the first Via opening, a second Via in the second Via opening, a first interconnect structure in the first interconnect opening and a second interconnect structure in the second interconnect opening, wherein:

the first metal line, the first Via and the first interconnect structure are connected together; and the second metal line, the second Via and the second interconnect structure are connected together.

7. The method of claim 6, further comprising:

removing a portion of the first metal line and a portion of the first Via so that a first gap is formed over the first Via to separate the first interconnect structure from the first metal line, the first gap being disposed in the ILD and further extending in the second dielectric;

removing a portion of the second metal line and a portion of the second Via so that a second gap is formed over the second Via to separate the second interconnect structure from the second metal line, the second gap being disposed in the ILD and further extending in the second dielectric;

depositing a first insulating layer in the first gap and a second insulating layer in the second gap;

removing a portion of the first insulating layer and a portion of the second insulating layer in the ILD so that a first recessed space is formed over the first insulating layer and positioned in the ILD, and a second recessed space is formed over the second insulating layer and positioned in the ILD; and depositing the conductive material in the first recessed space and the second recessed space to re-fill the first metal line and the second metal line respectively, wherein:

the first insulating layer is positioned between the first metal line and the first interconnect structure; and the second insulating layer is positioned between the second metal line and the second interconnect structure.

8. The method of claim 7, before the executing the thermal processing of the substrate, further comprising:

forming a first gate structure surrounding top surfaces of the first channel structure, and a second gate structure surrounding top surfaces of the second channel structure, wherein:

the first gate structure includes an first interface layer surrounding the top surfaces of the first channel structure, a first high-k dielectric film surrounding the first interface layer, and a first conductive barrier layer surrounding the first high-k dielectric film; and the second gate structure includes an second interface layer surrounding the top surfaces of the second channel structure, a second high-k dielectric film surrounding the second interface layer, and a second conductive barrier layer surrounding the second high-k dielectric film.

9. The method of claim 8, after the executing the thermal processing of the substrate, further comprising:

forming a first work function metal over the first conductive barrier layer; and forming a second work function metal over the second conductive barrier layer.

10. The method of claim 9, wherein the executing the thermal processing of the substrate comprises heating the substrate above 500 degrees Celsius.

11. The method of claim 10, wherein the thermal processing comprises an annealing treatment configured to anneal at least one of the first S/D structure, the second S/D structure, the first gate structure, or the second gate structure.

12. The method of claim 11, wherein the first dielectric, the second dielectric, and the third dielectric have different etch resistivity relative to each other in that an etching process removes one of the first dielectric, the second dielectric, and the third dielectric without removing other two dielectrics of the first dielectric, the second dielectric, and the third dielectric.

13. The method of claim 12, wherein the first channel structure comprises one or more first nanosheets or first nanowires that are stacked over the substrate and extend along the top surface of the substrate, and the second channel structure comprises one or more second nanosheets or second nanowires that are stacked over the substrate and extend along the top surface of the substrate.

14. A method of forming a semiconductor device, the method comprising:
  forming a pair of channel structures over a substrate, the pair of channel structures including a first channel structure of a first field-effect transistor over the substrate and a second channel structure of a second field-effect transistor stacked over the first channel structure,
the first channel structure and the second channel structure extending along a top surface of the substrate;
  forming a first source/drain (S/D) structure at a first end of the first channel structure, a first substitute silicide layer on a surface of the first S/D structure and a first substitute interconnect structure over the first substitute silicide layer;
  forming a second S/D structure at a first end of the second channel structure, a second substitute silicide layer on a surface of the second S/D structure and a second substitute interconnect structure over the second substitute silicide layer;
  executing a thermal processing of the substrate;
  removing the first substitute silicide layer, the first substitute interconnect structure, the second substitute silicide layer, and the second substitute interconnect structure; and
  forming a first silicide layer on the first S/D structure and a second silicide layer on the second S/D structure.

15. The method of claim 14, wherein the forming the first substitute silicide layer on the surface of the first S/D structure and the first substitute interconnect structure over the first substitute silicide layer comprises:
  depositing a first dielectric on the surface of the first S/D structure to form the first substitute silicide layer;
  depositing a second dielectric that covers the first substitute silicide layer and the first S/D structure;
  forming a first interconnect opening in the second dielectric, the first interconnect opening uncovering the first substitute silicide layer; and
  filling the first interconnect opening with the first substitute interconnect structure, the first substitute interconnect structure being made of a third dielectric.

16. The method of claim 15, before the forming the second S/D structure at the first end of the second channel structure, further comprising:
  recessing the first substitute interconnect structure in the first interconnect opening;
  forming a first dielectric cap on the first substitute interconnect structure;
  refilling the first interconnect opening with the second dielectric; and
  recessing the second dielectric to uncover the second channel structure of the second field-effect transistor so that the second S/D structure is formed at the first end of the second channel structure.

17. The method of claim 16, wherein the forming the second substitute silicide layer on the surface of the second S/D structure and the second substitute interconnect structure over the second substitute silicide layer further comprises:
  depositing the first dielectric on the surface of the second S/D structure to form the second substitute silicide layer;
  depositing the second dielectric that covers the second substitute silicide layer and the second S/D structure of the second field-effect transistor;
  forming a second interconnect opening in the second dielectric, the second interconnect opening uncovering the second substitute silicide layer; and
  filling the second interconnect opening with the second substitute interconnect structure, the second substitute interconnect structure being made of the third dielectric.

18. The method of claim 17, after the forming the second substitute interconnect structure over the second substitute silicide layer, further comprising:
  removing a portion of the second substitute interconnect structure so that a space is formed over the second substitute interconnect structure, the space further being positioned in the second dielectric;
  forming a second dielectric cap on the second substitute interconnect structure; and
  refilling the second dielectric in the space.

19. The method of claim 18, wherein the removing the first substitute silicide layer, the first substitute interconnect structure, the second substitute silicide layer, and the second substitute interconnect structure further comprising:
  forming an interlayer dielectric (ILD) over the second dielectric;
  forming a patterned mask over the ILD;
  performing an etching process to form a first Via opening and a second Via opening based on the patterned mask, the first Via opening and the second Via opening extending into the second dielectric and ILD to uncover the first substitute interconnect structure and the second substitute interconnect structure respectively; and
  performing an etching process to remove the first substitute interconnect structure in the first interconnect opening, the first substitute silicide layer, the second substitute interconnect structure in the second interconnect opening and the second substitute silicide layer.

20. The method of claim 19, after the forming the first silicide layer on the first S/D structure and the second silicide layer on the second S/D structure, further comprising:
  forming a first trench opening and a second trench opening in the ILD based on the patterned mask, the first trench opening being connected to the first Via opening and the second trench opening being connected to the second Via opening;
  depositing a conductive material in the first trench opening, the second trench opening, the first Via opening, the second Via opening, the first interconnect opening and the second interconnect opening to form a first metal line in the first trench opening, a second metal line in the second trench opening, a first Via in the first Via opening, a second Via in the second Via opening, a first interconnect structure in the first interconnect opening and a second interconnect structure in the second interconnect opening respectively, wherein:

the first metal line, the first Via and the first interconnect structure are connected together; and the second metal line, the second Via and the second interconnect structure are connected together.

* * * * *